(12) United States Patent
Hampel et al.

(10) Patent No.: US 11,652,448 B2
(45) Date of Patent: May 16, 2023

(54) TRANSMITTING AND RECEIVING DEVICE HAVING A WIDE-BAND HF POWER AMPLIFIER, IN PARTICULAR AN N-WAY DOHERTY AMPLIFIER HAVING ACTIVE LOAD MODULATION

(71) Applicant: iAd Gesellschaft für Informatik, Automatisierung und Datenverarbeitung MbH, Großhabersdorf (DE)

(72) Inventors: Hermann Hampel, Großhabersdorf (DE); Johannes Hampel, Großhabersdorf (DE); Maxym Yakymchuk, Fürth (DE); Georg Fischer, Nuremberg (DE); Daniel Popp, Weisendorf (DE)

(73) Assignee: iAd Gesellschaft für Informatik, Automatisierung und Datenverarbeitung mbH, Großhabersdorf (DE)

( * ) Notice: Subject to any disclaimer, the term of this patent is extended or adjusted under 35 U.S.C. 154(b) by 99 days.

(21) Appl. No.: 17/423,363

(22) PCT Filed: Jan. 17, 2020

(86) PCT No.: PCT/EP2020/025020
§ 371 (c)(1),
(2) Date: Feb. 24, 2022

(87) PCT Pub. No.: WO2020/148094
PCT Pub. Date: Jul. 23, 2020

(65) Prior Publication Data
US 2022/0247360 A1    Aug. 4, 2022

(30) Foreign Application Priority Data

Jan. 20, 2019    (DE) .................... 10 2019 000 324.1

(51) Int. Cl.
*H03F 1/02*    (2006.01)
*H03F 1/52*    (2006.01)
(Continued)

(52) U.S. Cl.
CPC ............. *H03F 1/0288* (2013.01); *H03F 1/52* (2013.01); *H03F 3/245* (2013.01); *H04B 1/40* (2013.01);
(Continued)

(58) Field of Classification Search
CPC ..... H03F 1/02; H03F 1/52; H03F 1/56; H03F 1/0288; H03F 3/19; H03F 3/21;
(Continued)

(56) References Cited

U.S. PATENT DOCUMENTS 8,193,857 B1    6/2012    Wilson
9,628,032 B1    4/2017    Marbell et al.
(Continued)

FOREIGN PATENT DOCUMENTS

DE        60124728 T2    3/2007
DE    102010018274 A1    5/2012
(Continued)

OTHER PUBLICATIONS

Jing Li et al., "A 600W Broadband Three-Way Doherty Power Amplifier for Multi-Standard Wireless Communications", IEEE MTT-S International Microwave Symposium, May 17, 2015, p. 1-3, IEEE; cited in International Search Report.
(Continued)

*Primary Examiner* — Shawkat M Ali
(74) *Attorney, Agent, or Firm* — Rankin, Hill & Clark LLP

(57)    ABSTRACT

A transmitting and receiving device having a module (GSZ) with a configurable HF high-power amplifier (HPA) that includes a main power amplifier (DM) with a main amplifier
(Continued)

core and at least one peak power amplifier (DP1) having an auxiliary amplifier core. A switching element connected to inputs of the main power amplifier and the at least one peak power amplifier is connected to a digital input signal divider (ET) having a plurality of outputs and an output combiner (C) is connected to outputs of the amplifier cores for the main power amplifier and the at least one peak power amplifier. A multi-harmonic transformation line (LAH) is connected at the amplifier core output of the main power amplifier and at the amplifier core output of the at least one peak power amplifier, and a circulator (Z1) is connected to the output of the output combiner or an impedance converter (AN1).

15 Claims, 22 Drawing Sheets

(51) Int. Cl.
$H03F\ 3/24$ (2006.01)
$H04B\ 1/40$ (2015.01)
$H05K\ 1/02$ (2006.01)
$H05K\ 7/20$ (2006.01)
$H04B\ 1/04$ (2006.01)

(52) U.S. Cl.
CPC ........ *H05K 1/0243* (2013.01); *H05K 7/209* (2013.01); *H03F 2200/426* (2013.01); *H03F 2200/451* (2013.01); *H04B 2001/045* (2013.01)

(58) Field of Classification Search
CPC . H03F 3/68; H03F 3/189; H03F 3/193; H03F 3/245; H04B 1/04; H04B 1/38; H04B 1/40; H04B 14/06; H05K 1/02; H05K 7/20; H05K 7/209; H05K 1/0243
USPC ....... 330/127, 149, 277, 295, 300, 302, 306; 375/219, 295–297
See application file for complete search history.

(56) References Cited

U.S. PATENT DOCUMENTS

| | | | |
|---|---|---|---|
| 10,033,335 | B1 | 7/2018 | Chan et al. |
| 2003/0137346 | A1 | 7/2003 | Hellberg |
| 2008/0007331 | A1 | 1/2008 | Suzuki et al. |
| 2012/0231753 | A1* | 9/2012 | Maslennikov ........ H03F 1/0288 455/249.1 |
| 2012/0319780 | A1 | 12/2012 | Wilson et al. |
| 2013/0099874 | A1 | 4/2013 | Bromberger |
| 2014/0055195 | A1* | 2/2014 | Engala ................. H03F 1/0222 330/124 R |
| 2015/0123208 | A1 | 5/2015 | Marbell et al. |
| 2015/0229276 | A1 | 8/2015 | Shikuma |
| 2016/0020733 | A1 | 1/2016 | Kaehs |
| 2016/0294340 | A1 | 10/2016 | Goel et al. |
| 2016/0308495 | A1 | 10/2016 | Canning et al. |

FOREIGN PATENT DOCUMENTS

| | | |
|---|---|---|
| DE | 102012202870 A1 | 9/2012 |
| DE | 102012105260 A1 | 12/2012 |
| DE | 102014115315 A1 | 5/2015 |
| DE | 102014213684 A1 | 1/2016 |
| DE | 102016105742 A1 | 10/2016 |
| DE | 102016106278 A1 | 10/2016 |
| DE | 102016123932 A1 | 6/2017 |
| EP | 2879291 A1 | 6/2015 |
| WO | 2011112129 A1 | 9/2011 |
| WO | 2013006941 A1 | 1/2013 |

OTHER PUBLICATIONS

Jingchu He et al., "A 500-W High Efficiency LDMOS Classical Three-Way Doherty Amplifier for Base-Station Applications", IEEE MTT-S International Microwave Symposium, May 22, 2016, p. 1-4, IEEE; Cited in International Search Report.
International Search Report dated Apr. 9, 2020 filed in PCT/EP2020/025020.

\* cited by examiner

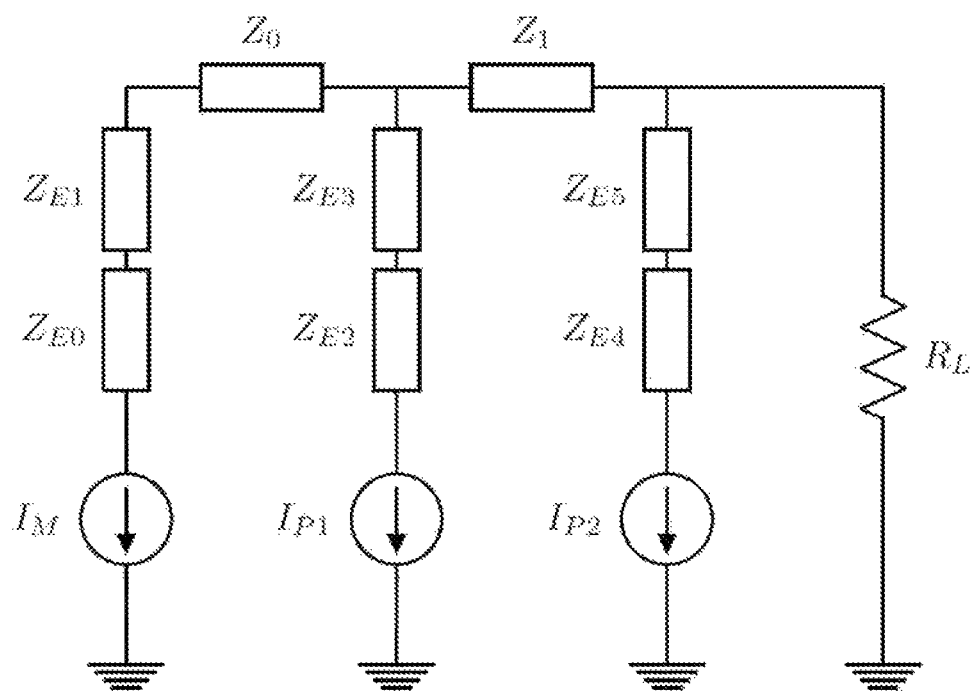
Fig. 9
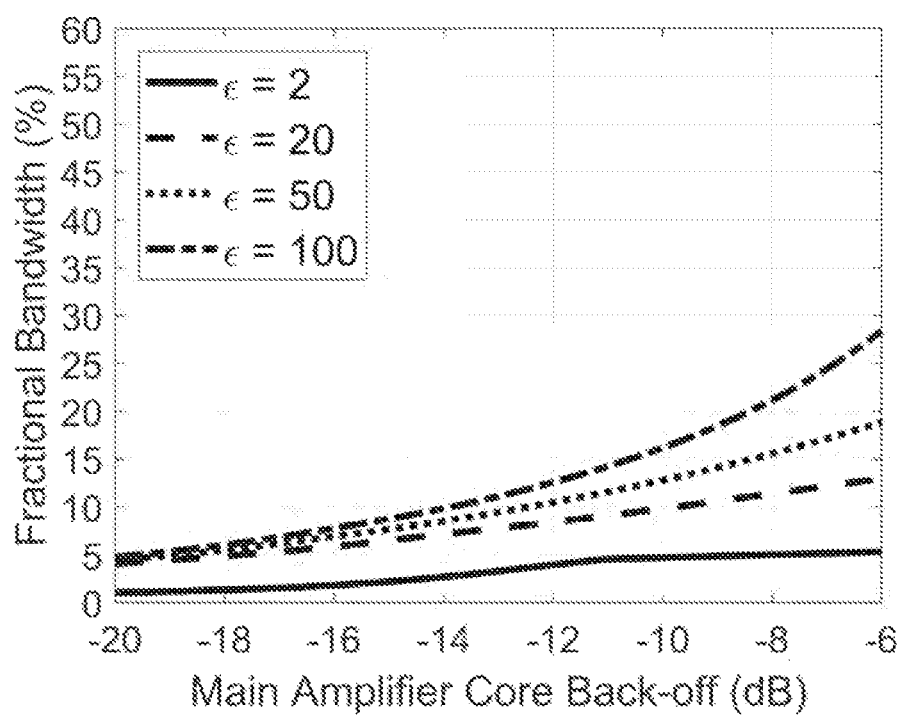
Fig. 10 (State of the Art)

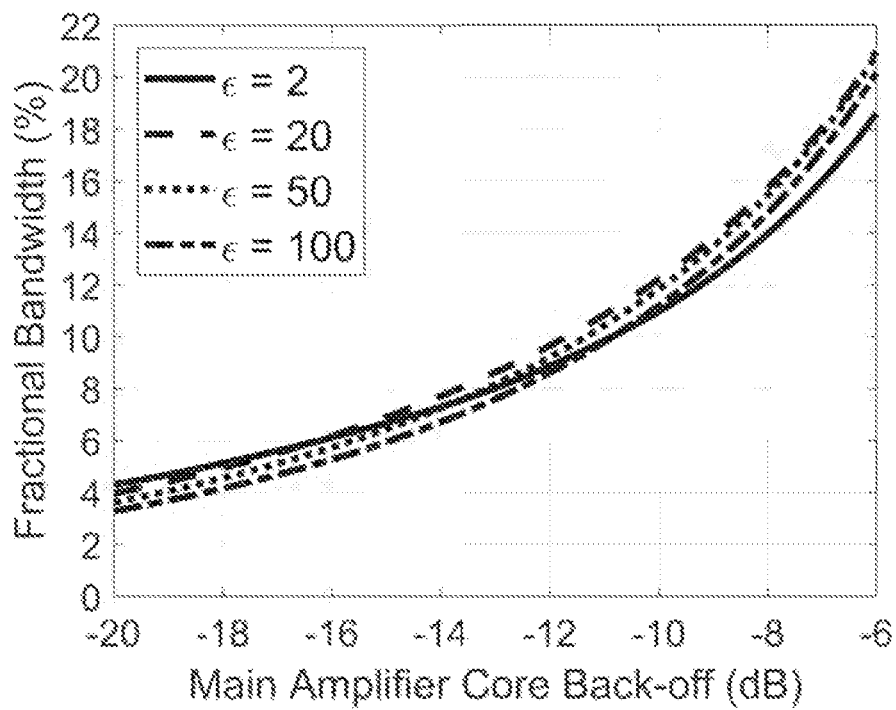
Fig. 11
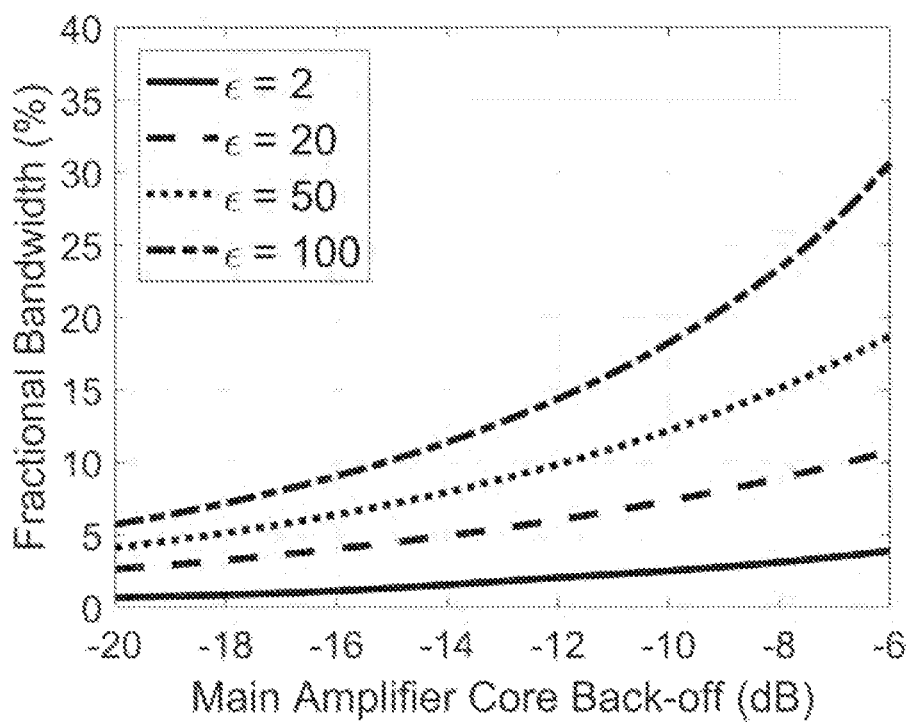
Fig. 12 (State of the Art)

US 11,652,448 B2

TRANSMITTING AND RECEIVING DEVICE HAVING A WIDE-BAND HF POWER AMPLIFIER, IN PARTICULAR AN N-WAY DOHERTY AMPLIFIER HAVING ACTIVE LOAD MODULATION

CROSS-REFERENCE TO RELATED APPLICATIONS

This application is a U.S. National Stage of International Application PCT/EP2020/025020, filed Jan. 17, 2020, and claims priority to DE 10 2019 000 324.1, filed Jan. 20, 2019.

BACKGROUND OF INVENTION

Field of Invention

The invention relates to a transmitting and receiving device having a module having a configurable RF high-power amplifier which is operated both between and below two power back-off points, which has a main power amplifier with amplifier core and at least one peak power amplifier with amplifier core, wherein a digital input signal divider connected to the input of the main power amplifier and the input of the at least one peak power amplifier is provided with a plurality of outputs and an output combiner connected to an output of the amplifier cores is provided for the main power amplifier and an output of the at least one peak power amplifier.

Brief Description of Related Art

In the technical field of radio technology, in particular in mobile radio or cellular base stations, satellite communication and other communication and radio systems, many radio-frequency carriers distributed over a large bandwidth are simultaneously amplified with the same high-power amplifier. For the RF- or HF-power amplifier (RF: Radio Frequency, HF: High Frequency), this has the effect that the instantaneous transmission power varies very strongly and very quickly. In addition, the air space has become a scarce resource which must be shared between the pluralities of subscribers. Nowadays, flight traffic management plays an important role. It controls the air space, provides path guidance to the aircraft, and most importantly, all air space users guarantee a high degree of safety. Nevertheless, the air space is often clogged due to the high number of users and use of folded air space electronics systems. Therefore, modernization of air space electronics systems plays an essential role in increasing the air space capacities and reducing the "En-Route"-late. Modern aviation increasingly relies on data link communications. Digital communication systems replace their analog precursors in order to realize a more secure and reliable travel experience. The design of a multi-purpose power amplifier, satisfying the requirements of all standards, particularly transmission standards near and in the range of the L-band frequency range, represents a significant challenge since high power, efficient amplification, linearity, and broadband operation must be serviced in one amplifier. The transmission standards of interest in this context are L-DACS1, UAT, DME, Mode-S, ADS-B and SSR.

One way to increase the efficiency of an RF power amplifier, in particular an HF power amplifier, is to use the Doherty principle. In its basic form, the Doherty amplifier uses two amplifier stages (also called amplifier cores), a main amplifier and an auxiliary amplifier (also called a carrier and maximum amplifier). The load is connected to the auxiliary amplifier and the main amplifier is connected to the load via an impedance converter, normally a quarter wavelength transmission line or an equivalent composite network (with gyrator behavior/impedance inverter as a result of $\lambda/4$-line).

Doherty power amplifiers (DPA-Doherty Power Amplifier) offer a high average efficiency for modulated waveforms, but offer only a narrow bandwidth efficiency of 5% to 10% [see, for example, J. H. Qureshi: A Wide-Band 20 W LMOS Doherty Power Amplifier" IMS 2010]. Mainly responsible for bandwidth limitation are the impedance inverters which enable load adjustment. However, the impedance inverters do not represent the only element responsible for the low bandwidth, and the output capacitances of the active devices also contribute to this. In order to achieve a maximum bandwidth, the parasitic properties of the drain terminal must be overcome with the aid of suitable broadband techniques. A comprehensive analytical investigation of the transfer function must be taken into account [see, for example, K. Bathich, A. Z. Markos, G. Boeck: "Frequency Response Analysis and Bandwidth Extension of the Doherty Amplifier" IEEE Transactions on Microwave Theory and Techniques, Volume: 59, No 4, April 2011]. Offset lines are regularly used to compensate for the parasitic properties of the drain [see, for example: R Quaglia, M Pirola, C Ramella: "Offset Lines in Doherty Power Amplifiers: Analytical Demonstration and Design" IEEE Microwave and Wireless Components Letters, Volume: 23, Issue: 2, February 2013 or B Kim, J. Kim, I. Kim, J. Cha: "The Doherty power amplifier" IEEE Microwave Magazine, Volume: 7, Issue: 5, October 2006]. In the article by R. Giofrè, L. Piazzon, P. Colantonio, F. Giannini: "A closed-form design technique for ultra-wideband Doherty power amplifiers" IEEE Transactions on Microwave Theory and Techniques, Volume: 62, Issue: 12, December 2014, it has been shown that offset lines do not necessarily represent bandwidths-limiting structures. By using two $\lambda/4$ microstrip lines at the peak power amplifier, the bandwidth potential of the DPA and load adjustment is improved. A closed approach for calculating the necessary characteristic impedances of the offset lines is presented. The approach has been generalized and further refined by A. Barakat, M. Thian, V. Fusco in accordance with the article: "Toward generalized Doherty power amplifier design for wideband multi-mode operation" SBMO/IEEE MTTS International Microwave and Optoelectronics Conference (IMOC), 2015 generalized and further refined [see A. Barakat, M. Thian, V. Fusco, S. Bulja, L. Guan: "Toward a More Generalized Doherty Power Amplifier Design for Broadcast Operation" IEEE Transactions on Microwave Theory and Techniques, Volume: 65, Issue: 3, March 2017]. Additional constraints are introduced in connection with the power divider and the phase balancing circuit on the Doherty power amplifier DPA. With the removal of the analog power divider and the phase compensation circuit and the replacement thereof by a digital version, each amplifier core can now be individually controlled with regard to its amplitude and phase position, which results in an increase in bandwidth and linearity, as reported by R. Darraji, P. Mousavi, F. M. Ghannouchi in "Doherty Goes Digital: Digitally Enhanced Doherty Power Amplifiers" IEEE Microwave Magazine, Volume: 17, Issue: 8, August 2016 or by J. C. Cahuana, P. Landin, D. Gustafsson, C. Fager, T. Eriksson in "Linearization of dual-input Doherty power amplifiers" International Workshop on Integrated Nonlinear Microwave and Millimetre-wave Circuits, April 2014. Removal of the analog power divider has been reported for the first time by W. C. E. Neo, J. Qureshi, M. J. Pelk, J. R. Gajadharsing, L. C. N. de Vreede in "A Mixed-Signal Approach Towards Linear and Efficient N-Way Doherty Amplifiers" IEEE Transactions on Microwave Theory and Techniques, Volume: 55, Issue: 5, May 2007.

The classic Doherty power amplifier consists of two amplifier cores, one of which represents the main power amplifier and one of the peak power amplifiers, hereinafter referred to as an "active load modulator". The main power amplifier is typically used in the AB-mode and the peak amplifier is used in C-mode. The main power amplifier is connected to the peak power amplifier via an impedance inverting electrical element.

The impedance inverter is typically realized by a $\lambda/4$ microstrip line. First, the power of the main power amplifier is ramped up until its drain current is in saturation. This point is called back-off point. For higher output power, the active load modulator now catches power. The impedance at the main amplifier changes as a result of the fed-in current. If the phase difference between the current of the main power amplifier and the active load modulator is set correctly, the impedance at the main amplifier decreases. As a result of this effect, the current fed by the main amplifier must increase so that it remains in saturation. This means that the main power amplifier has a high efficiency over the entire load modulation range and its output power increases. The described arrangement can in principle be expanded to any desired number of active load modulators and enables high efficiency over a wide power range.

While the original publication of W. H. Doherty relates to tube amplifiers, power transistors are used using current technology. In order to increase the relative bandwidth, digital control is used. Such a type of control was first published by W. C. E. Neo, J. Qureshi, M. J. Pelk, J. R. Gajadharsing, L. C. N. de Vreede in "A Mixed-Signal Approach Towards Linear and Efficient Nway Doherty Amplifiers" IEEE Transactions on Microwave Theory and Techniques, Volume: 55, Issue: 5, May 2007. Instead of using a static power divider, main amplifiers and active load modulators are individually controlled with a specially adapted power and phase profile. The control of all the inputs is combined as a unit and referred to below as a control function.

For the control function, this results in a [2*N−1]-dimensional space in which at least one static function has to be found which meets the optimization criteria with regard to efficiency, linearity and bandwidth. The variable N is the number of amplifier inputs. Since the properties of the output network change significantly towards the band edges, the control function should be tracked with the center frequency of the signal or signal ensemble which is currently to be amplified.

A broadband Doherty-amplifier with a broadband transformer is known, for example, from WO 2013006941 A1. The broadband Doherty-amplifier comprises a main amplifier which can be operated to amplify a first part of an input signal and an auxiliary amplifier, wherein the auxiliary amplifier can be operated for switching on and amplifying a second part of the input signal, the amplitude of the second part of the input signal exceeds a threshold amplitude, and a broadband impedance converter, which is connected between the main amplifier and an output of the auxiliary amplifier. The broadband impedance converter generates a transformed output signal of the main amplifier on the basis of an output of the main amplifier. The broadband impedance converter generates the transformed output of the main amplifier based on an output of the main amplifier, wherein the broadband impedance converter comprises a quarter wavelength matching line coupled to a directional coupler, wherein the directional coupler has the same electrical length as the quarter wavelength adjustment line. In one embodiment, a high-frequency power amplifier with Doherty amplifier architecture is disclosed. The high-frequency power amplifier comprises a signal divider which splits an input high-frequency signal into a first signal and a second signal, a first amplifier which amplifies the first signal in order to form a third signal, a second amplifier which amplifies the second signal in order to form a signal, a fourth signal and a broadband impedance converter which converts the third signal into a fifth signal. The broadband impedance converter comprises a quarter wavelength matching line coupled to a directional coupler, the directional coupler having the same electrical length as the quarter wavelength matching line. In particular, the directional coupler is a broad-side coupled line coupler. In summary, WO 2013006941 A1 describes a Doherty-amplifier whose bandwidth is increased by a special design of the impedance inverter. In the Doherty-architecture, the impedance inverter is required to convert a current source as provided by the power transistors into a voltage source. One speaks of gyratory behavior. For this purpose, $\lambda/4$ lines have hitherto been used. However, the gyratory behavior cannot be made available in broadband with previous $\lambda/4$ lines, since the wavelength changes when the frequency changes and the mechanical length would therefore also have to be changed. The use of a directional coupler increases the bandwidth over which an acceptable gyratory behavior can be achieved.

In order to improve the linearity of a composite amplifier provided with a Doherty-output-network over a wide frequency band, a composite amplifier known from DE 601 24 728 T2 comprises a main power amplifier and a power auxiliary amplifier which are connected to a load via a Doherty-output-network and further means for emulating and compensating for the non-linear behavior of the output current of the power auxiliary amplifier in the input signal for the main amplifier. Means are also provided for equalizing or compensating the frequency response of the composite amplifier and means for cross-coupling and subtracting a filtered version of the input signal for the auxiliary amplifier from the input signal of the main amplifier. A cross-coupling filter emulates the impedance of the auxiliary amplifier and compensates for the through-impedance or transimpedance between the main amplifier and the auxiliary amplifier. Furthermore, a cross-coupling filter can be provided which emulates the transimpedance from the auxiliary amplifier to the output node and compensates the transimpedance from the main amplifier to the output node. Finally, an input-side filter for equalizing the frequency response of the main amplifier and the auxiliary amplifier is provided. Thus, in the composite amplifier known from DE 601 24 728 T2, a non-linear function of the input signal, which emulates the non-linear output current of the auxiliary amplifier, is subtracted from the driver signal of the main amplifier. This has the advantage that the non-linear components in the output are cancelled or compensated without having to scan the amplifier efficiency. The non-linear function can be obtained from a model of the power function of the auxiliary amplifier (if the auxiliary amplifier provides the non-linear current by operating in class C), or, in amplified form, can be pre-fabricated and used both as the drive signal for the auxiliary amplifier (which can then be biased for operation in the linear classes B or AB) and for cross-coupling by the filter. In summary, DE 601 24 728 T2 describes an N-way Doherty amplifier, in which the amplitudes and phases of the input signals into the amplifier cores involved are influenced in a targeted manner by cross-coupling filters in a non-linear manner, so that phases and amplitudes which are favorable as a function of output power result at the output of the non-linear amplifier cores, which then lead to a maximization of the efficiency and the bandwidth in conjunction with the N-way combiner. The network at the input of the non-linear amplifier cores with cross-coupling filters which, in part, can also be active, i.e. amplifying, can be regarded as a non-linear analog pre-distortion or an analog control function.

Another broadband Doherty amplifier circuit is known from US 2008/0 007 331 A1. The amplifier circuit comprises a signal summing node, a main amplifier, a transmission line coupling an output of the main amplifier to the signal summing node, a peaking amplifier having an output coupled to the signal summing node, and a broadband impedance converter having a wider end coupled to the signal summing node and a narrower end forming a terminal node. In summary, US 2008/0 007 331 A1 shows a Doherty amplifier which has a multiband impedance inverter by means of which a gyratory behavior can be achieved in a plurality of bands. Accordingly, a large contiguous frequency range is not shown. In addition, the impedance inverter is constructed from line pieces having lengths in the order of magnitude of the wavelength and having a constant width.

A further similar broadband Doherty amplifier circuit is known from DE 10 2012 202 870 A1. More specifically, the amplifier circuit includes a signal summing node, a first amplifier configured to operate in a first mode, an impedance inverter configured to provide an impedance transformation and load modulation to the first amplifier, a second amplifier configured to operate in a second mode, the second amplifier having an output coupled to the signal summing node, and a broadband impedance converter. The broadband impedance converter has a first end coupled to the signal summing node and a second end forming a connection node, wherein the broadband impedance converter is designed to represent real impedance over at least 25% of a high-frequency bandwidth of the amplifier circuit for the first amplifier. The broadband impedance converter is tapered and the first end coupled to the signal summing node is wider than the second end, wherein the taper runs successively over a length of the broadband impedance converter. Furthermore, an impedance converter is provided, which couples the output of the second amplifier to the signal summing node. The output of the second amplifier is directly connected to the first end of the broadband impedance converter at the summing junction. In particular, the broadband impedance converter is designed to ensure the real impedance over at least 30% of the high-frequency bandwidth of the amplifier circuit. The impedance inverter is a $\lambda/4$ wavelength transmission line which has a first end connected to the first end of the broadband impedance converter at the signal summing node and a second end connected to the output of the main amplifier. Furthermore, DE 10 2012 202 870 A1 discloses a method for operating an amplifier circuit, comprising a signal summing node, a first amplifier and a second amplifier, which in a first mode comprises the following method steps: coupling an output of the first amplifier to the signal summing node via an impedance inverter, operating the first amplifier in a first mode, providing an impedance transformation and a load transformation for the first amplifier via the impedance inverter, coupling an output of the second amplifier to the signal summing node, operating the second amplifier. In a second mode, the method comprises the following steps: coupling a first end of a broadband impedance converter to the signal summing node, coupling a second end of the broadband impedance converter to a termination impedance, and representing a real impedance for the first amplifier via the broadband impedance converter over at least 25% of a radio frequency bandwidth of the amplifier circuit. Specifically, coupling the output of the second amplifier to the signal summing node is via an impedance converter and directly connecting the output of the second amplifier to the first end of the broadband impedance converter at the signal summing node. In summary, DE 10 2012 202 870 A1 discloses an output transformer at the output of the impedance converter/combiner which makes it possible to select the impedance at the star point of the combiner deviating from the otherwise customary 50 ohms at the output of the amplifier. However, this does not intervene in the exchange of power at harmonics between the amplifier cores.

A further similar broadband Doherty-amplifier circuit, in particular a broadband power amplifier with active load modulation, is known from EP 2 879 291 A1. The active load modulation increases the back-off efficiency of the power amplifier, which is relevant for the overall efficiency, for example a mobile base station. In particular, the broadband power amplifier has a main amplifier core and at least one auxiliary amplifier core, an input signal divider connected to the input of the main amplifier and the input of the at least one auxiliary amplifier core, and an output combiner connected to an output of the amplifier core for the main amplifier core and an output of the at least one auxiliary amplifier core. The input signal divider is designed to divide an input signal into a first signal for the main amplifier core and at least a second signal for the at least one auxiliary amplifier core according to frequency-dependent non-linear input control functions. An output combiner is configured to combine output signals of the main amplifier core and the at least one auxiliary amplifier core and to provide a continuum of optimal terminating impedances of the main amplifier core for the fundamental frequency and for at least one harmonic frequency over a predetermined operating bandwidth in a low power range, wherein the low power region is defined in which the at least one auxiliary amplifier core is inactive. The output combiner is configured to enable mutual load modulation between the amplifiers cores in a high power range defined by both active amplifier cores such that efficient waveform shaping can be maintained under load modulation. Consequently, a deviation of the virtual termination impedances at the active components of the amplifier cores from the continuum of the optimal terminating impedances for the fundamental frequency component and at least one harmonic frequency component is minimized. Furthermore, the output combiner is configured to minimize the deviation of the virtual termination impedances in the active components of the amplifier cores from the continuum of the optimal termination impedances for the fundamental frequency component and at least one harmonic frequency component by maintaining the deviation below a predetermined threshold. The output combiner comprises an impedance converter provided for the main amplifier core and/or the auxiliary amplifier core, and is configured to implement the required continuous multi-harmonic termination conditions and capabilities and to maintain it under load modulation by using elements of a low-pass structure in the impedance inverter. The output combiner has an output transformer circuit provided at the output of the output combiner and configured to implement continuous multi-harmonic termination conditions and the ability to maintain it under load modulation by using elements of a low-pass structure in the output transformer circuit. The low-pass structure is implemented by impedance steps in microstrip transmission lines of a circuit structure of the device. Based on this technique, the impedance inverter may provide the desired impedance level in the fundamental frequency band while absorbing the parasitic elements of the main amplifier transistor device and at the same time minimizing transmission/exchange of harmonic frequency components between the connected amplifier cores. Thus, unwanted load modulation effects at the harmonic frequencies are minimized and a suitable reflection phase (according to the multiharmonic termination continuum used) is provided for at least one harmonic frequency component at the main amplifier core. In particular, the input divider is configured to provide the input control function for the respective amplifier cores as functions of frequency and instantaneous power such that:

a) the power level at the beginning of the operation of the auxiliary amplifier core is dependent on the residual fluctuation of the real part of the load impedance of the main amplifier core load and frequency-dependent in the low-power range and/or b) a complex relationship between output currents of the main and auxiliary amplifier cores in the high-power range is controlled in such a way that the deviation of the virtual terminating impedances at the active components of the amplifier cores from the continuum of the optimum terminating impedances for the fundamental frequency component and at least one harmonic frequency component is minimized. In order to minimize the deviation of the virtual termination impedances from the optimal termination continuum for the fundamental frequency component and at least one harmonic frequency component, the deviation is kept below a predetermined threshold value. The input control function for the respective amplifier cores can be implemented by means of an analog (cross-coupling filter) or digital signal processing circuit, unequal drain biases being used for the main and auxiliary amplifier cores. The continuum of the optimal terminating impedances designates a continuous space of combinations of termination impedances at a plurality of harmonic frequencies that maps to a continuous space of output voltage waveforms at the intrinsic reference plane of the active device (transistor) so that a constant output power and optimal efficiency results from these waveforms. Based on an ideal model, which is limited to two harmonic frequency components, such an optimum continuum is given, for example, by the theory of Class-J., as described in the literature (e.g., in "On the Continuity of High Efficiency Modes in Linear RF Power Amplifiers"), see IEEE Microwave and Wireless Components Letters, Vol. 19, Issue 10, pages 665-667, 2009, and Wright, P., Lees, J., Benedikt, J., Tasker, P J, Cripps, S C, "A Methodology for Realizing High Efficiency Class-J in a Linear and Broadcast PA", IEEE Transactions on Microwave Theory and Techniques, Vol. 57, Issue 12, Part 2, 2009). This termination continuum forms a waveform continuum at the intrinsic drain (or collector) of the active device (e.g., transistor) having a constant output power and a constant high efficiency over the entire range of the continuum. In one embodiment, unequal drain bias voltages are used for the main and auxiliary amplifier cores in such a way that the transformation ratio (i.e. the wave resistance) of the impedance inverter (s) can be changed in such a way that continuous multiharmonic termination conditions can be fulfilled more easily or over a greater bandwidth. The use of the above-described method for realizing a high-efficiency broadband RF power amplification of class-J in a linear and broadband power amplifier with the concept of active load modulation improves the back-off efficiency of the power amplifier, and it is possible to realize a highly efficient power amplification over a large relative bandwidth>30%. In summary, EP 2 879 291 A1 shows a solution with an impedance inverter and a combiner, which already contains short line elements in relation to the wavelength as a substitute for discrete capacitances and inductances.

Furthermore, a broadband Doherty-amplifier circuit with constant impedance combiner is known from DE102012105260 A1. The embodiments described therein use a constant impedance combiner having a characteristic impedance equal to the required load modulated high impedance state of the main amplifier in a three-way wideband Doherty amplifier circuit when a first and a second peak amplifier are turned off. In this narrowband case, a minimum band limitation is presented to the main amplifier. A significant portion of band limitation is removed from the main amplifier path when operated in the back-off power region, resulting in a more constant power above the frequency and a more constant efficiency above the frequency at a fixed back-off power level. The amplifier embodiments described there are well suited for wide-band applications, so that an amplifier circuit can simultaneously cover two or more adjacent operating bands or can be more consistent over an entire operating band than architectures existing for registering the DE102012105260 A1. In one embodiment of an amplifier circuit, the amplifier circuit comprises a main amplifier biased in a Class-B or -AB mode, a first peaking amplifier biased in a Class-C mode, a second peak amplifier biased in a Class-C mode, and a constant impedance combiner. The constant impedance combiner has a first node connected to an output of the main amplifier, a second node connected to an output of the first peak amplifier, a third node connected to an output of the second peak amplifier, and a fourth node connected to a load. The constant impedance combiner is operable to transform, e.g., to change, load impedance at the fourth node into transformed impedance at the third node, and provide the same transformed impedance at the first, second, and third nodes. According to an embodiment of a method for operating an amplifier circuit, the method described in DE102012105260 A1 comprises:
pre-tensioning a main amplifier in a Class B or AB mode,
biasing a second peak amplifier in a class-C mode,
biasing a second peak amplifier in a class-C mode,
connecting a first node of a constant impedance combiner to an output of the main amplifier, a second node of the constant impedance combiner to an output of the first peak amplifier, a third node of the constant impedance combiner to an output of the second peak amplifier and a fourth node of the constant impedance combiner to a load, and
transforming a load impedance at the fourth node into a transformed impedance at the third node such that the same transformed impedance is provided at the first, second and third nodes.

According to another embodiment of an amplifier circuit, the amplifier circuit comprises a first amplifier operable to turn on at a first power level, a second amplifier operable to turn on at a second power level below the first power level, and a third amplifier operable to remain on at all power levels. A first power combiner is operable to combine an output of the third amplifier with an output of the second amplifier at a first power combining node to form a first combined amplifier output. A second power combiner is operable to combine the first combined amplifier output with an output of the first amplifier at a second power combining node to form a second combined amplifier output. An impedance converter is operable to transform a load impedance of the amplifier circuit into transformed impedance at the second power combining node, wherein the transformed impedance is adapted to, for example, the same impedance of the first and second power combiner. According to another exemplary embodiment of a method for operating an amplifier circuit, the method described in DE 102012105260 A1 comprises:

switching on a first amplifier at a first power level, switching on a second amplifier at a second power level below the first power level, switching on a third amplifier at all power levels, combining an output of the third amplifier with an output of the second amplifier at a first power combining node to form a first combined amplifier output, combining the first combined amplifier output with an output of the first amplifier at a second power combining node to form a second combined amplifier output; and transforming a load impedance of the amplifier circuit into a transformed impedance at the second power combining node, wherein no impedance transformation occurs from the second power combining node to the first power combining node.

Finally, according to an embodiment of a three-way wideband Doherty-amplifier circuit described in DE 102012105260 A1, the circuit comprises a first peak amplifier operable to turn on at a first power level, a second peak amplifier operable to turn on at a second power level below the first power level, and a main power amplifier operable to turn on at all power levels. The main power amplifier has a high impedance load modulated state when the first and second peak amplifiers are off. The Doherty-amplifier circuit further comprises a constant impedance combiner connected to an output of each amplifier. The constant impedance combiner has characteristic impedance which is adapted to the impedance of the main amplifier in the load-modulated state with high impedance, with or without an output adaptation device which connects the output of the main amplifier to the constant impedance combiner, as seen from the output of the main amplifier.

Furthermore, DE 10 2010 018 274 A1 describes a method for designing an electronic circuit with a matching network, in particular for use in a Doherty-power amplifier, which aims at optimizing the active load modulation. The invention relates to a method for designing a characteristic variable of the electronic circuit, for example, an S parameter or a small signal noise figure or an effective input reflection factor or an effective output reflection factor or an effective output resistance or a rollover stability factor or a power amplification or an intermodulation product of the order n or a harmonic distortion of nth order or a distortion factor or an efficiency of the power amplification or a noise figure or a compression point or a compression power or a compression of the power amplification or an average of the small-signal characteristic or an integral of the small-signal characteristic, can be carried out in a fully automatic manner, in particular in a computer-controlled manner. For this purpose, measurement data of elements of the circuit, such as transistors, impedances or the like, are determined by measurements.

The measurement data are input in a program sequence for calculating the elements of the matching network of the electronic circuit. This makes it possible to calculate the, for example, capacitive or inductive elements of the matching network. The method for designing the circuit has several steps. In a first step, a first value of the first transformed source reflection factor and a second value of the first transformed load reflection factor are determined. Several sub-steps are provided for determining the first value and the second value. A number of first distances are determined. The first distances are not Euclidean distances, but so-called Poincare distances. In the method described in DE 10 2010 018 274 A1, an arbitrary or pre-determinable number of first pairs of points is determined with a first pair point on the first circle and a second pair point on the second circle. The first pair point on the first circle is determined as the first transformed source reflection factor and the second pair point on the second circle is determined as the first transformed load reflection factor. A value of the first characteristic variable is assigned to each of the first point pairs. The assignment can be carried out, for example, by calculation on the basis of models and/or measurement of the characteristic variable of the circuit. In a subsequent step of the method described in DE 10 2010 018 274 A1, the matching network is determined on the basis of the first value of the transformed source reflection factor, the second value of the transformed load reflection factor, the source reflection factor and the load reflection factor. The step of determining the matching network can also be carried out in an automated manner. For example, a topology, i.e. the arrangement of the capacitances and inductances of the first matching network, is selected. Subsequently, the capacitance values and the inductance values of the matching network are calculated from the first value of the transformed source reflection factor, from the second value of the transformed load reflection factor, from the source reflection factor and from the load reflection factor. In summary, however, it can be determined that the method is limited to the adaptation conditions in the fundamental and the influence of the harmonics is not described.

Furthermore, DE 10 2014 115 315 A1 shows an input adaptation for RF-power transistors, i.e. a solution for handling with the typically low-impedance input behavior of RF-power transistors. This problem is solved in the claimed amplifier architecture by classical line transformation by designing the transformer, which electrically decouples and inductively couples the input of the RF-power transistor from the input lead, to disable signals having a frequency below the RF-frequency range of the RF-power transistor such that low frequency signals are not amplified by the buckled in the forward voltage gain at low frequencies. In another embodiment, the transformer is configured to disable signals below the RF-frequency range of the RF-power transistor and forward signals within the RF-frequency range of the RF-power transistor by electrically decoupling and inductively coupling the gate of the RF-power transistor from the input lead.

Furthermore, DE 10 2014 213 684 A1 shows a broadband Doherty amplifier architecture which is implemented differentially both with respect to the amplifier cores and of an impedance inverter and of a combiner. The differential design implicitly leads to a termination of the second harmonics at the amplifier cores. No special network is necessary for the termination of the second harmonics. This avoids the problem that a dispersive network must be designed which correctly terminates both the topmost fundamental frequency and the lowest 2nd harmonic. If these two frequencies come very close, it would be necessary that a network would have to change its behavior abruptly along the frequency axis. This is not possible for reasons of quality and therefore limits the bandwidth of the system. Even if it appears advantageous at the first glance that the differential line guidance implicitly brings about a termination of the 2nd harmonic, it is clear that it cannot be influenced specifically in its dispersive behavior, so that no extended amplifier classes (Class-J, Class-F continuous) are possible.

Furthermore, DE 10 2016 106 278 A1 describes a broadband Doherty-amplifier circuit with integrated transformation-line balun. In the Doherty architecture shown, all components are housed in a casing. A folded line acts simultaneously as a balun for the transition from symmetrical to unsymmetrical signals and as an impedance transformer. The impedance inverter is furthermore designed as a simple $\lambda/4$ line. The combiner in the form of a transmission line transformer-balun automatically presents high impedance at the second harmonic, thereby achieving a greater bandwidth. No additional network is required for the termination of the second harmonic, and the termination is implicitly given.

Furthermore, DE 10 2016 123 932 A1 shows a Doherty amplifier circuit integrated into a component package, in which the impedance inverter is replaced by a T-network instead of a $\lambda/4$ line. The second harmonic is respectively terminated by a series resonant circuit (suction circuit/ harmonic trap). As a result, the exchange of power at the second harmonic between the amplifier cores is avoided, which increases the efficiency. The bandwidth of the termination thus defines the bandwidth over which a high efficiency can be achieved.

Furthermore, DE 10 2016 105 742 A1 shows a Doherty-architecture which has an impedance inverter in the form of a classic $\lambda/4$ line and an output line transformer. Due to high primitive values and high frequencies, the line lengths fall short enough so that they are placed in a package. A special network for providing a certain termination profile at the second harmonic is not disclosed.

As is apparent from the prior art above, numerous broadband Doherty amplifier circuits, particularly with active load modulation, have long been known for various applications. For example, RF-power amplifiers are used for the transmission signals in the aeronautical L-band (960 MHz-1,215 MHz), in particular output stage amplifiers for transmission, localization and secondary radar standards of the flight radio SSR, Mode-S, UAT, L-DACS, ADS-B and DME. Furthermore, digital transmitting and receiving devices are used in the area of radio-based flight traffic control, which is a platform for services such as ADS-B (angle estimation, time difference) within SSR and UAT standards or communication and navigation within L-DACS standard. The reception and transmission data can be exchanged with one or more central servers by means of communication interfaces. Accordingly, in practice, there is a requirement for a multipurpose power amplifier which satisfies the requirements of all standards, in particular according to a digital transmitting and receiving module in conjunction with integrated electronics, which withstands the rough external/outdoor use as well as interior operation and, as a result, is intended to enable long-life operation. Examples of external or environmental influences are:

Weather influences (e.g. ambient temperature),
Electrical influences (e.g. lightning strikes, overvoltage, overcurrent),
Installation location influences (e.g. antenna cable length, soiling, industrial dust) and the like.
In the region of the amplifier design, the targets:
High efficiency for modulated waveforms
High peak power
High relative band width
High linearity
are in conflict with one another. By means of suitable structural measures in conjunction with the electronics, the architecture for high-performance and broad-band applications is intended to be suitable for suppressing parasitic effects, in particular the compensation of drain parasites, and a simple construction is to be achieved, which ensures an economically efficient and robust product.

BRIEF SUMMARY OF THE INVENTION

The aim of the invention is to provide a high-power transmitting and receiving device, which is suitable for high-power and broadband applications and which has a transmission power of more than 10 watts to approximately 2,000 watts, by means of suitable structural measures in conjunction with the electronics.

This object is achieved and is thereby released, in that in each case an additional multiharmonic transformation line is provided at the amplifier core output of the main power amplifier and at the amplifier core output of the at least one peak power amplifier and a circulator connected to the output of the output combiner or an impedance converter are provided, wherein by means of the circulator the upstream main power amplifier and the at least one peak power amplifier are protected from overvoltages and overcurrent on the output side, in that the circulator derives the energy to a sump resistor connected to the circulator in such a way that the circulator has a 50 Ohm terminating impedance for the output combiner, the module has both a high relative bandwidth and a high efficiency at a pulse transmission power of approximately 2,000 watts, a fan-free operation of the module is made possible and the module is protected against lightning strikes.

By means of this embodiment of the invention, a digital, energy-efficient, fan-free, configurable high-power transmitting and receiving device protected against lightning strikes is provided for more than 1,000 watts of transmission power.

BRIEF DESCRIPTION OF THE DRAWINGS

Further advantages and details can be gathered from the following description of preferred embodiments of the invention with reference to the drawings. In the drawing:

FIG. 9 shows the architecture of a 3-way Doherty with additional microstrip lines in accordance with the invention, FIG. 10 shows the relative bandwidth of a rudimentary two-way Doherty without transformers (prior art), FIG. 11 illustrates the relative bandwidth of a two-way rudimentary dopant with offset lines at the main power amplifier and active load modulators/peak power amplifiers according to the invention, FIG. 12 shows the relative bandwidth of a rudimentary three-way dopant without transformers (prior art)

DETAILED DESCRIPTION OF THE INVENTION

Figure 2:
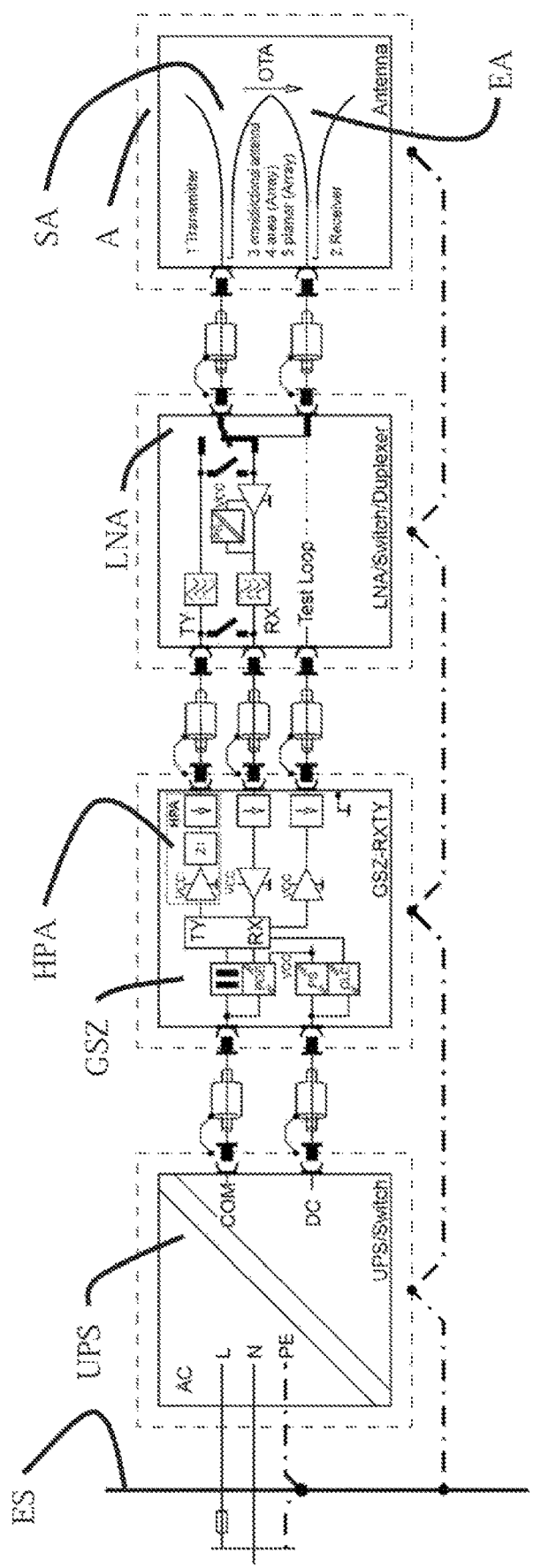
FIG. 2 shows the block diagram of the transceiver for the application case airport.

FIG. 2 shows the block diagram of an embodiment of the transceiver for the application case airport (ground station), which consists of four components, namely on the input side an uninterrupted power supply unit UPS and subsequently a module GSZ, a switchable low-noise amplifier circuit LNA and an antenna A. The housings of all the components of the system (of the transceiver system) are constructed without potential. The housing can either assume the potential of protective earth (PE protective earth, protective conductor) or can be designed as a Faraday cage (i.e. as a casing closed on all sides, which acts as an electrical shield) which is field-free in the inner region. The electronics of the components are electrically insulated from the housing potential.

The UPS module is an uninterruptible power supply unit and is supplied from the AC power supply. On the output side, the power supply unit UPS supplies a 48V DC-telecommunications voltage (DC direct current, i.e. DC voltage). The power supply unit UPS can exchange useful data with the module GSZ either via PLC (power line communication) or via a COM interface (communication equipment). According to the invention, the output enables a potential-separated installation. In this way, the electronics supplied by the telecommunications voltage are free of the PE (protection earth) potential. This power supply concept ensures protection against overcurrent and overvoltage that can occur on the PE line. A further advantage is that the DC supply lines (VDC and GND) are physically and electrically decoupled from the interference properties of the protective conductor (PE), so that an improvement of the SNR (signal-to-noise ration) is made possible. As a result, low-interference transmission of PLC- and COM-signals is ensured, since no coupling occurs from the interference signals of the protective conductor (PE).

The transmitting/receiving system also has the energy-efficient HF-high-power amplifier HPA according to the invention, which is suitable for the transmission signals in the aeronautical L-band (960 MHz-1,215 MHz) with a maximum transmission power of approximately 63 dBm (approximately 2,000 watts), i.e. a pulse transmission power of approximately 2,000 watts. The latter is used as an output stage amplifier for transmission standards of the flight radio SSR, Mode-S, UAT, L-DACS and DME. The HF high-power amplifier HPA is a component of a module GSZ, which is designed as ground station indoor/outdoor with three receivers and a high-power transmitter as an inexpensive, digital transmitting and receiving device for use in the area of radio-based flight traffic control. The transmitting and receiving device is a platform for services such as ADS-B (angle estimation, time difference) within SSR and UAT standards or communication and navigation within L-DACS standard. The reception and transmission data can be exchanged with one or more central servers by means of communication interfaces. According to the invention, the GSZ module is a digital, energy-efficient, fan-free transmitting and/or receiving device with a transmitting power of up to 63 dBm for the aeronautical L-band. The modular construction principle of the module GSZ allows for different configurations, of 1-fold transmitting or receiving device via 7-fold receivers up to 3-fold receivers with one high-power transmitter.

The module GSZ connected to the output of the module UPS can be configured in two embodiments, namely both for indoor operation via compact 19" rack, as well as for outdoor/outdoor use in a robust, compact IP67 outdoor housing (IP 67: dust- and water-tight). By increasing the efficiency of the HF high-power amplifier HPA and as a result of a reduction of the power loss, the cooling of the module GSZ is purely passive, i.e. both housing types can be designed without a fan according to the invention. This reduces the maintenance effort and, on the other hand, extends the service life.

Connected to the output of the module GSZ is the switchable low noise amplifier circuit LNA (see FIG. 2) which has a low noise amplifier (LNA) for amplifying the receive signal, two filters/duplexers (one in the transmit train and one in the receive train) and one switch circuit. All receiver channels and a test loop circuit have a controlled voltage supply for switching on, off and switching the low noise amplifier (LNA), the switch circuit and the two filters/duplexers. The switch circuit can short-circuit the transmission train and the reception train either at the module input or downstream of the filter/duplexer together with the LNA. Furthermore, the test loop circuit can also be short-circuited with the receiving train. Together with an OTA-test (over the air), individual elements (cable, filter/duplexer, LNA, plug, antenna) are tested for their correct functionality. The structure of the transmitting/receiving system according to the invention makes it possible to selectively determine an error between the module GSZ and an antenna A. The time required for maintenance and fault analysis is thereby greatly reduced because only elements are exchanged or repaired, which have a fault.

In summary, the functionality of LNA/switch/duplexer in module LNA is as follows. The LNA (switchable low noise amplifier circuit) module includes the LNA (Low Noise Amplifier) integrated in the receive path. In the receiving mode, LNA can be switched on or off. When the LNA is turned on, the received signal is additionally amplified. This can be done either in the case of a weak received signal power or for compensating the losses on the cables (e.g. RX-cables RXK or TX-cables TXK, see FIG. 4) between the module GSZ and the antenna module A.

Furthermore, the module LNA comprises either a duplexer or a filter, in each case in the transmitting and receiving train. Duplexers or filters are purely passive components.

Pluralities of switches are installed in the LNA module for testing and maintenance purposes. The switches allow the transmission train to be short-circuited with the reception train. If the switch is short-circuited at the input of LNA module, analysis of the cable between module GSZ and LAN modules may be performed. The switch matrix permits a short circuit from and to the LNA. As a result, the quality and the amplification of LNA can be carried out online or at specific time intervals. In addition, the switch matrix enables an antenna test. In this case, the transmission signal is sent out via the test loop into the transmitting antenna SA and is received via the free-space coupling at the receiving antenna EA. The transmission power from the test loop can be set to the permitted small level, so that no communication disturbances are generated during the antenna test.

Figure 8:
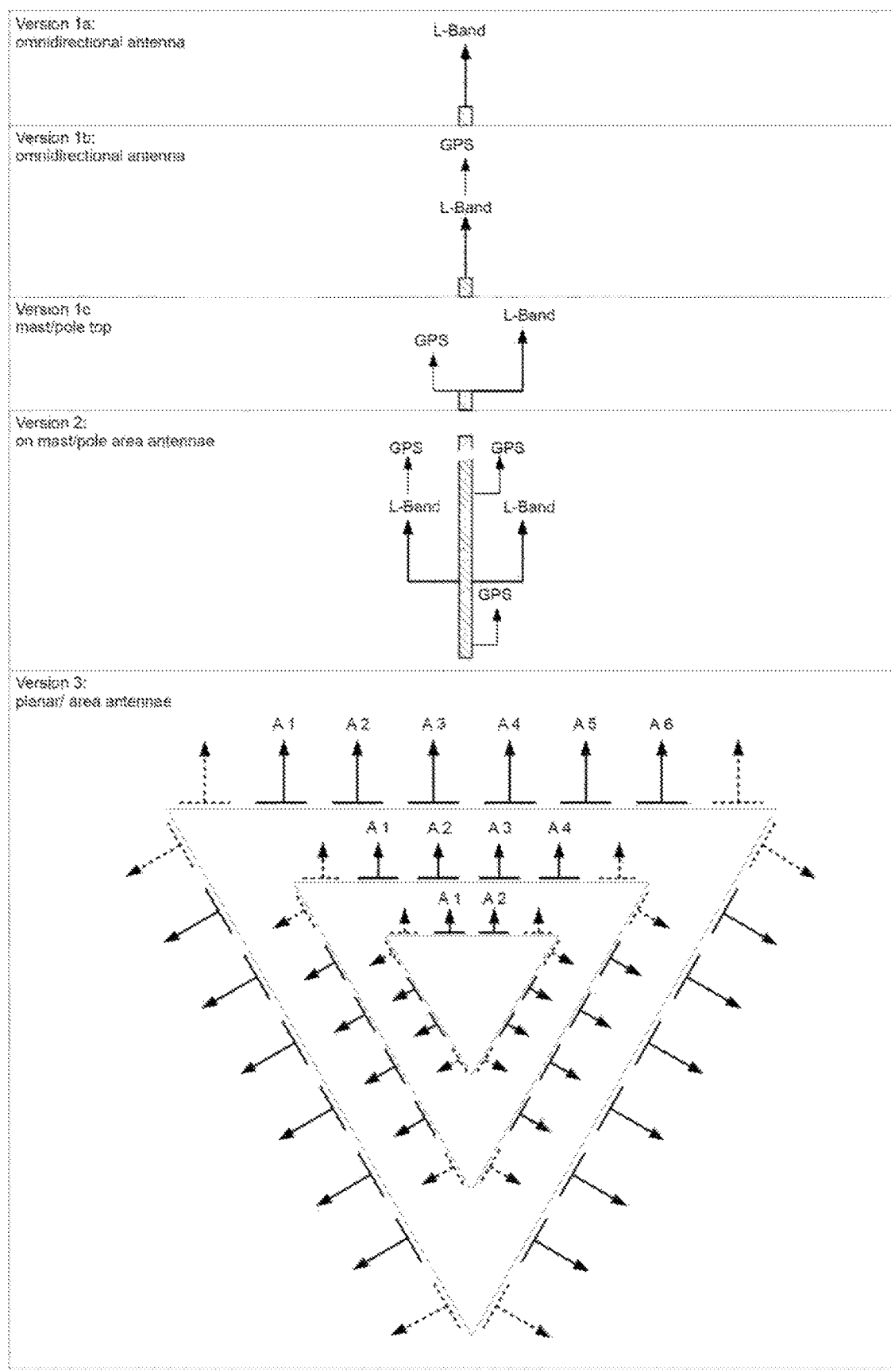
FIG. 8 shows different antenna configurations of the transmitting and receiving device according to the invention.

The structure of the antenna A is dependent on the configuration of the module GSZ, which can be connected in parallel, so that the number of possible antenna configurations increases as a result. The operation of antennas in the planar structure is thus made possible. Various antenna configurations are illustrated in FIG. 8.

The RF high-power amplifier HPA as part of the module GSZ is described and explained in more detail below with reference to FIG. 1 for the application case airport, in particular for the current aeronautical L-band (currently 1 GHz to 2.6 GHz) in a locating method with transit-time measurement (secondary radar principle). The transmitters of the secondary radar devices are usually designed in flight protection for a pulse power of 2,000 watts, but can be reduced in 3-dB steps in the transmission power. Within the scope of the invention, use is possible in the current mobile radio standard of the third generation LTE (called Long Term Evolution, also called 3.9G) or the future extension LTE-Advanced or 4G, in the Project Next Generation Mobile Networks (NGMN) or in the VHF flight radio band, currently 117.975 MHz to 137 MHz for the navigation radio service with rotary radio beacon (Very High Frequency Omnidirectional Radio Rank VOR), or the instrument landing system (ILS), currently 108 MHz to 117.975 MHz.

The efficiency of the module GSZ is dependent on the PAE (Power Added Efficiency) of the high-power RF amplifier HPA. High-power classical high-power amplifiers with high power efficiency PAE have poor linearity. Low linearity results in the transmission signals experiencing power-dependent amplitude and phase modulations. Modulations generate transmission signal distortions as well as in-band and out-of-band interference. In the case of a modulation scheme such as OFDM (Orthogonal Frequency Division Multiplex), the transmission signal distortion can lead to the reception-side signal not being able to be demodulated, which means an interruption of the communication.

Figure 3:
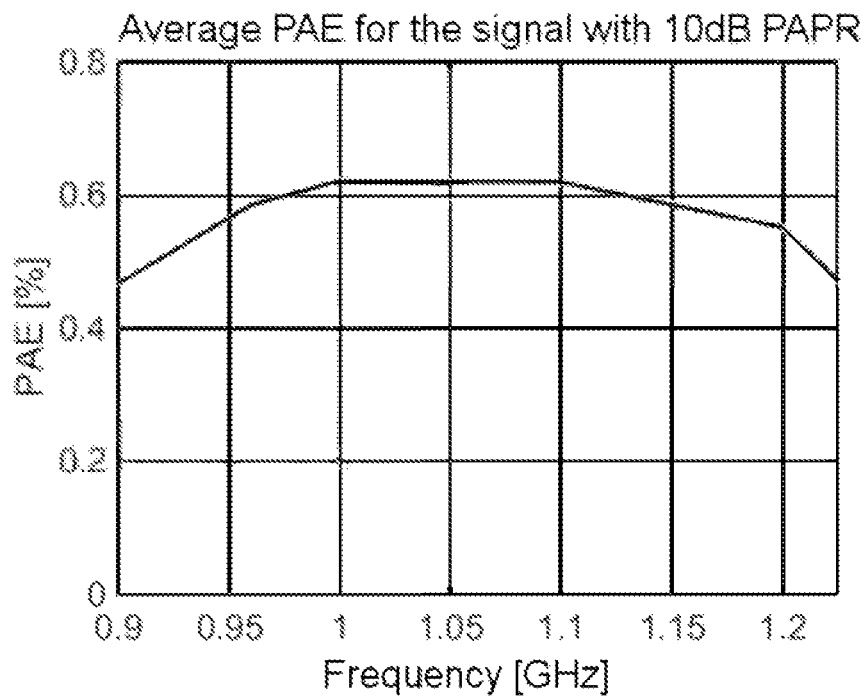
FIG. 3 shows the diagram of PAE (Power Added Efficiency) over the transmission frequency of the RF-power amplifier according to the invention.

In order to achieve high PAE values and a linear output characteristic of the RF high-power amplifier HPA, the RF output stage amplifier was designed as a three-way Doherty-amplifier with the maximum output power of 63 dBm. The high power RF-amplifier HPA has an average power efficiency PAE of 56% (see FIG. 3: average PAE for 10 db PAPR signal) and a linear output characteristic with two power backoff points and is implemented in class-JFont operation. Impedance for RF bandwidth of the RF high-power amplifier HPA is represented by an output combiner C connected to the three amplifier outputs. The impedance at the output connection node of the output combiner C is 50Ω.

According to the Doherty principle, three amplifiers, namely the main power amplifier DM, the first peak power amplifier DP1 and the second peak power amplifier DP2 are in operation when the transmission signal reaches the peak value and are each provided with a load modulation which allows highest output powers. If the power of the transmit signal decreases, the second peak power amplifier DP2 turns off and only two amplifiers (namely main power amplifier DM, first peak power amplifier DP1) operate, referred to as first power backoff. As the power of the transmit signal continues to decrease, the first peak power amplifier DP1*ab* turns off and only the main power amplifier DM is operating, referred to as second power backoff. The peak power amplifiers DP1, DP2 switch off at reduced transmission power in order to achieve optimum load modulation. This ensures a high degree of efficiency and a high amplification. The RF high-power amplifier HPA amplifies only the fundamental wave of the modulated transmission signal and the higher harmonics are short-circuited as broadband as possible (opposite behavior, i.e., fundamental wave capacitive and harmonic inductive). In this way, both a high bandwidth and a high efficiency are achieved. The high linearity is thus a further feature of the RF high-power amplifier HPA according to the invention (see FIGS. 18 and 21). It is thus possible to use all the modulation methods in the generation of transmission signals, for example AM, GPSK, OFDM (other methods are also conceivable) and that via the complete aeronautical L-band. The definition of methods for the specific frequency within the L-band is limited only by the standards.

The aeronautical L-band is between 960 MHz and 1,215 MHz. The high-power amplifier HPA according to the invention (high-power amplifier) achieves high efficiency and linearity in the complete L-band, which is not so trivial. The parasitic inductances and capacitances of GaN transistors and the conductor track structures (absorption network ABN, impedance converter AN1, λ/2 and λ/4 microstrip lines, output combiner C) have a frequency-dependent impedance. In addition, the impedance in the high-frequency signals is a function of the location. This is a further challenge because the harmonics (at least 2nd) The HF high-power amplifier HPA according to the invention can be short-circuited. The implementation of the RF high-power amplifier HPA according to the invention is now designed in such a way that it has an impedance-matched conductor track structure in the L-band. In particular, the RF high-power amplifier HPA according to the invention is not only adapted for a design frequency, but also for complete L-band including band limits (in order to achieve this, a suitable control function is necessary).

Thus, the HF high-power amplifier HPA according to the invention is broadband, which is a feature in comparison with the prior art.

The relative bandwidth efficiency is a size to compare different amplifiers or filters with each other, see particularly page 39 or page 29 of the description.

Furthermore, in the present description, on the side 41/42, a relative bandwidth efficiency BE of the RF high-power amplifier HPA according to the invention is specified, which is significantly higher than, for example, known from the publications described on the input side (see page 2 of the description). The bandwidth efficiency BE is a loss of 10% points to the maximum efficiency and can be calculated as:

$$BE = 2*(fo-fu)/(fo+fu).$$

The classical "barely bone" three-way Doherty Power Amplifier DPA is extended by applying additional λ/4 impedance inverters to the peak power amplifier cores DP1, DP2 as well as to the main amplifier core DM. The architecture of a 3-way Doherty with additional microstrip lines is illustrated in FIG. 9. All microstrip lines have the length $L = \lambda_d/4$.

The equations are derived by using ABCD parameters (also called chain matrices). In order to resolve the given network for the frequency of the design, it is broken down into three different subnetworks. The first sub-network A connects the main amplifier DM to the first peak power amplifier DP1. The second sub-network B connects the main amplifier DM to the second peak power amplifier DP2, whereas C connects two peak power amplifiers DP1, DP2 to each other. The ABCD matrices of the subnetworks are given as follows:

$$A = \begin{bmatrix} \frac{R_L Z_0 Z_{E0} Z_{E3} i}{Z_1^2 Z_{E1} Z_{E2}} & \frac{Z_0 Z_{E0} Z_{E2} i}{Z_{E1} Z_{E3}} \\ \frac{Z_{E1} Z_{E3} i}{Z_0 Z_{E0} Z_{E2}} & 0 \end{bmatrix} \quad (1)$$

$$B = \begin{bmatrix} -\frac{Z_0 Z_{E0} Z_{E5}}{Z_1 Z_{E1} Z_{E4}} & 0 \\ -\frac{Z_1 Z_{E1} Z_{E5}}{R_L Z_0 Z_{E0} Z_{E4}} & -\frac{Z_1 Z_{E1} Z_{E4}}{Z_0 Z_{E0} Z_{E5}} \end{bmatrix} \quad (2)$$

$$C = \begin{bmatrix} \infty & j\frac{Z_1 Z_{E4}^2}{Z_{E5}^2} \\ \infty & j\frac{Z_1}{R_L} \end{bmatrix} \quad (3)$$

The next step is to calculate the impedances at the terminals of the current sources:

$$Z_m = \frac{A_{1,1}}{A_{2,1}} + \frac{1}{A_{2,1}} \frac{I_{p1}}{I_m} + \frac{1}{B_{2,1}} \frac{I_{p2}}{I_m} \quad (4)$$

$$= \frac{R_L Z_0^2 Z_{E0}^2}{Z_1^2 Z_{E1}^2} - \frac{I_{p2} R_L Z_0 Z_{E0} Z_{E4}}{I_m Z_1 Z_{E1} Z_{E5}} \quad (5)$$

$$- j\frac{I_{p1} Z_0 Z_{E0} Z_{E2}}{I_m Z_{E1} Z_{E3}} \quad (6)$$

$$Z_{p1} = \frac{A_{2,2}}{A_{2,1}} + \frac{1}{A_{2,1}} \frac{I_m}{I_{p1}} + \frac{1}{C_{2,1}} \frac{I_{p2}}{I_{p1}} \quad (7)$$

$$= -j\frac{I_m Z_0 Z_{E0} Z_{E2}}{I_{p1} Z_{E1} Z_{E3}} \quad (8)$$

$$Z_{p2} = \frac{B_{2,2}}{B_{2,1}} + \frac{1}{B_{2,1}} \frac{I_m}{I_{p2}} + \frac{1}{C_{2,1}} \frac{I_{p1}}{I_{p2}} \quad (9)$$

$$= \frac{R_L Z_{E4}^2}{Z_{E5}^2} - \frac{I_m R_L Z_0 Z_{E0} Z_{E4}}{I_{p2} Z_1 Z_{E1} Z_{E5}} \quad (10)$$

The characteristic impedances $Z_0$, $Z_1$ and the load resistance $R_L$ must be determined. $Z_0$ is obtained by definition of the second back-off point. In this state, only the main amplifier DM operates, accordingly $I_{p1}=0$ und $I_{p2}=0$. Without losing the general validity, the phase of $I_m$ is set to zero. The following equation must be satisfied:

$$|Z_m I_{m2.Back-off}| = U_{DSm} \quad (11)$$

with $I_{m2.Back-off}$ as the current of the main amplifier DM at the second back-off. The equation is to be solved according to $Z_0$ and it is obtained:

$$Z_0 = \frac{\sqrt{U_{DSm}} Z_1 Z_{E1}}{\sqrt{I_{mState0} R_L} Z_{E0}} \quad (12)$$

Next, the first back-off is considered, with the main and first peak power amplifiers DM, DP1, DP2 being turned on, and $I_{p2}=0$. Since the impedance $Z_m$ is to always have a positive non-complex value, the phase of $I_{p2}-\pi/2$ must be. The following relationship must be satisfied:

$$|Z_{p1} I_{p11.Back-off}| U_{DSp1} \quad (13)$$

Resolved according to $Z_1$:

$$Z_1 = \frac{\sqrt{I_{m2.Back-off}} \sqrt{R_L} \sqrt{U_{DSp1}} Z_{E3}}{I_{m1.Back-off} Z_{E2}} \quad (14)$$

In general, the current $I_{p2}$ is a complex non-zero value. Phase π is the frequency of the design. Finally, $R_L$ can be derived. The equations are to be presented with the use of an individual peak power of the amplifier cores DM, DP1, DP2 (or $P_m$, $P_{p1}$ and $P_{p2}$ in equations (15), (16) and (17)):

$$Z_0 = \frac{U_{DSm} U_{DSp1}}{2P_m} \frac{Z_{E1} Z_{E3}}{Z_{E0} Z_{E2}} \quad (15)$$

$$Z_1 = \frac{U_{DSp1} U_{DSp2}}{2(P_m + P_{p1})} \frac{Z_{E3} Z_{E5}}{Z_{E2} Z_{E4}} \quad (16)$$

$$R_L = \frac{U_{DSp2}^2}{2(P_m + P_{p1} + P_{p2})} \frac{Z_{E5}^2}{Z_{E4}^2} \quad (17)$$

In the event that $Z_{E0}=Z_{E1}$, $Z_{E2}=Z_{E3}$ and $Z_{E4}=Z_{E5}$, or for the case of complete neglecting the impedance transforming offset lines LAH, the equations reduce to the classic "barebone" three-way DPA.

The RF high-power amplifier HPA according to the invention differs from the basic Doherty amplifier by offset lines LAH with the characteristic impedances $Z_{E0}$ to $Z_{E5}$, which is explained in more detail below. The individual offset lines LAH each have the length $\lambda/4$, where A is the guided wavelength (not free-space wavelength).

Equations (15), (16) and (17) enable calculation of three impedances using the power of the main power amplifier DM and the two peak power amplifiers DP1 and DP2, in equations above, called active load modulators $P_{p1}$ and $P_{p2}$. The characteristic impedances $Z_{E0}$ to $Z_{E5}$ form degrees of freedom which can be used to optimize the relative bandwidth of the RF high-power amplifier HPA.

The term degree of freedom is defined in more detail below. The microstrip lines used for the offset lines LAH can be varied in their characteristic impedance and transforming property. High characteristic line impedances are generated by narrow microstrip lines, while wide microstrip lines generate low characteristic line impedances.

In addition, each microstrip line has an impedance transforming characteristic due to the length $\lambda/4$.

The use of offset lines (also called offset line) is known in the literature and has already been used in the following publications (see above), for example R. Giofrè, L. Piazzon, P. Colantonio, F. Giannini: "A closed-form design technique for ultra-wideband Doherty power amplifiers" IEEE Transactions on Microwave Theory and Techniques, Volume: 62, Issue: 12, December 2014 or A. Barakat, M. Thian, V. Fusco: "Towards generalized Doherty power amplifier design for wideband multimode operation" SBMO/IEEE MTTS International Microwave and Optoelectronics Conference (IMOC), 2015 or A. Barakat, M. Thian, V. Fusco, S. Bulja, L. Guan: "Toward a More Generalized Doherty Power Amplifier Design for Broadcast Operation" IEEE Transactions on Microwave Theory and Techniques, Volume: 65, Issue: 3, March 2017. In the publications mentioned, offset lines on the active load modulators (hereinafter also referred to as peak power amplifiers DP1, DP2) were used to increase the relative bandwidth of the amplifiers at a particular frequency. These offset lines are a microstrip line ($\lambda/4$ line) with the property of setting the signal at the design frequency (i.e. at a certain frequency) to a certain phase offset.

In addition, each microstrip line has an impedance transforming characteristic due to the length $\lambda/4$.

The decisive difference of HF power high power amplifier HPA of the present invention over the prior art lies in the mounting of an additional offset line/microstrip line LAH (which is not a transparent line, as will be described in greater detail below) at the main power amplifier DM and at the peak power amplifiers DP1, DP2. This extension offers great advantages in terms of amplifier efficiency, using modulated waveforms, and advantages for relative bandwidth at high peak powers. By means of the additional degrees of freedom (meaning the characteristic impedances $Z_{E0}$ and $Z_{E1}$, namely two degrees of freedom), according to the invention an optimum can be found in the design of offset line structures, in which the bandwidth is expanded or increased and a corresponding flexibility is provided. Two limit cases can be found for this purpose.

In the first limiting case, the HF high-power amplifier HPA has a very high bandwidth in the back-off. This is achieved by setting Z0_Z1_RL. Of course, the offset lines LAH of the active load modulators have parasitic influences, whereby their characteristic impedances must be suitably chosen in order to maximize the overall bandwidth of the high-power HF-amplifier HPA. In order to adapt the HF high-power amplifier HPA to a 50Ω termination, in particular an additional impedance transformer is used. Depending on the power range, this transformer can be more or less expensive and accordingly require more or less space on the printed circuit board.

The second limiting case does not require an additional impedance transformer at the output. The transforming characteristics of the offset lines LAH can be used to adjust the output of the high power RF amplifier HPA directly for RL=50Ω (or any other desired termination impedance). In particular, identical, preferably HEMT transistors for driver stage and identical transistors are used as main and peak power amplifiers (DM, DP1, DP2, . . . ) is used. As a result, the temperature, aging and similar dependencies (not only of transistors but also of the voltage supply) should drift away in the same direction. In this case, degrees of freedom remain, which can be used for optimizing the total bandwidth of the RF high-power amplifier HPA.

With respect to the maximum relative bandwidth, the optimal choice between the two limiting cases is present. Depending on the application and the boundary conditions, the RF high-power amplifier HPA can be positioned between the two limiting cases. As a result, only a simple and space-saving output transformer is required instead of a large-area output transformer. The advantage is a higher relative total bandwidth of the high-power HF amplifier HPA.

Figure 30:
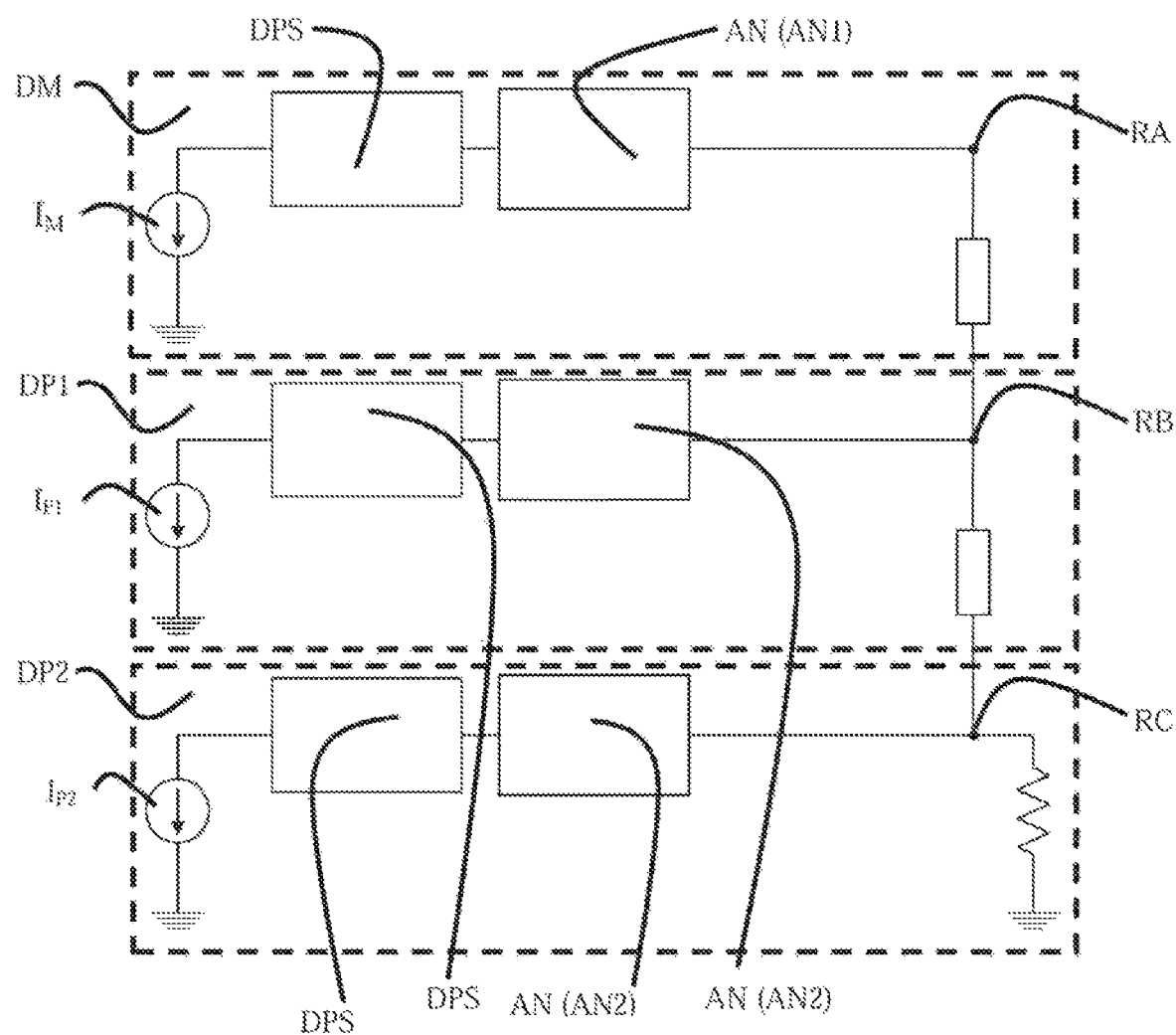
FIG. 30 shows a three-way Doherty-power amplifier with three reference levels (prior art) and FIG. 31 shows a partial network for each individual amplifier (model).
Figure 31:
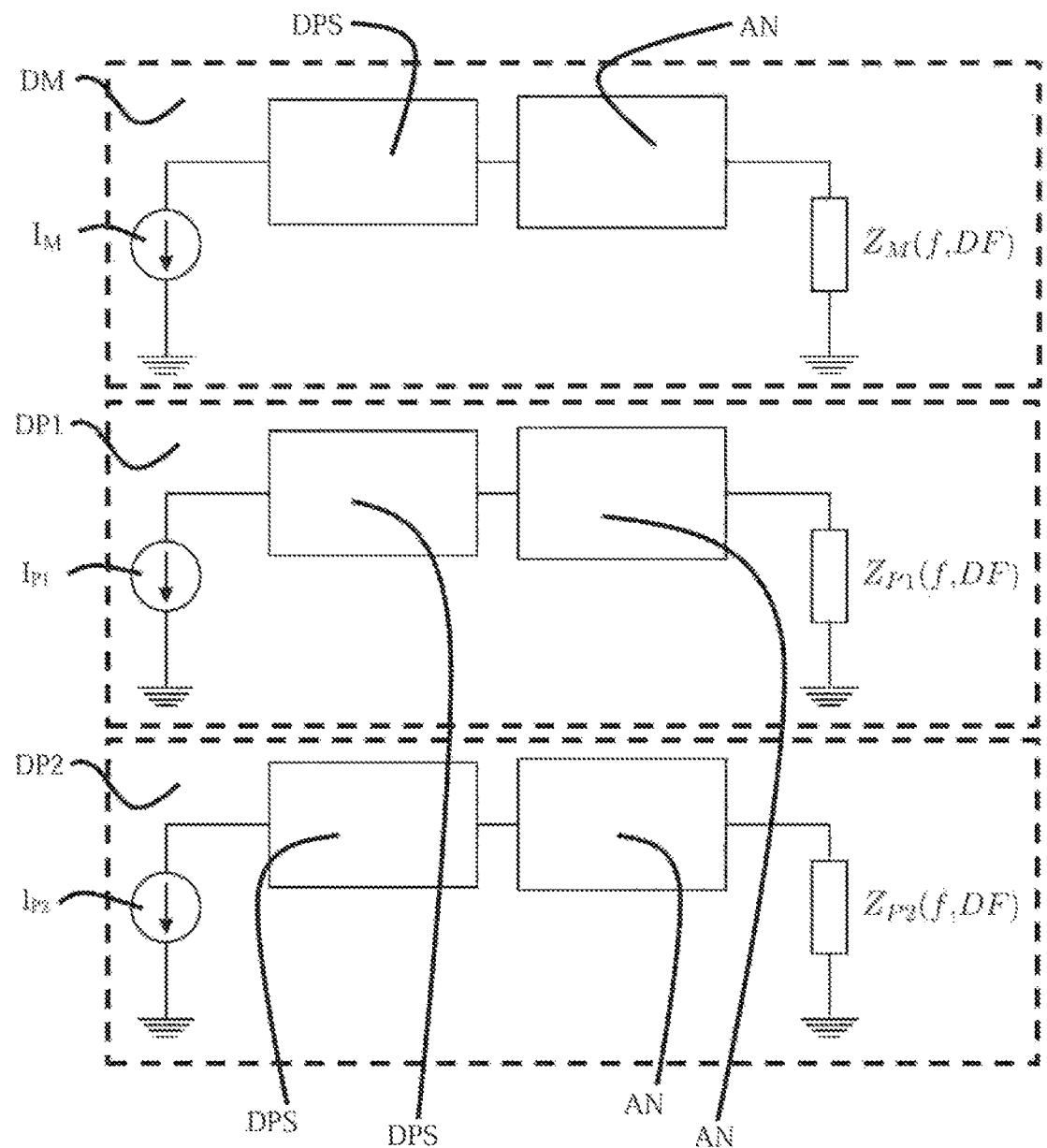

A further advantage of the HF high-power amplifier HPA according to the invention is the absorption of the transistor parasites (see FIG. 30, FIG. 31). Transistors have parasitic capacitances and inductances at their terminals. Transistor parasites reduce the relative bandwidth of an amplifier. These must be suitably absorbed in order to guarantee the desired functionality and high relative bandwidth of an amplifier.

The offset line LAH at the main power amplifier DM and the active peak power amplifiers DP1 and DP2/active load modulators Pp1 and Pp2 enable the absorption of large parasites and additionally allow multi-harmonic termination (also referred to in the literature as offset line, in the present application this is also referred to as "multiharmonic transformation line"), which permits a high relative bandwidth. These characteristics makes multi-harmonic transformation lines (offset lines) LAH to an important tool. Within the scope of the invention, the multiharmonic transformation line/offset line LAH has three tasks at the same time:

a) Provide Open. If the peak transistors are "off", they have a residual capacitance. This is transformed into an open at the input of the offset line LAH (fundamental wave). As a result, the offset line LAH is also shorter than a lambda/2 line.

b) Multiharmonic matching. In the harmonics, certain complex frequency-dependent terminating impedances must be presented to the transistors in order to increase the efficiency and bandwidth. Here, the term "$\lambda/2$ line" does not meet the core of thing because the term refers only to the fundamental wave.

c) Transformation. The offset line LAH also transforms the impedances in the fundamental wave in order to be able to design them optimally at the actual output combiner C.

In a purely theoretical view of the amplifier, it is customary to operate the main amplifier (DM) and the active load modulators (DP1, DP2) in a broadband class-B operation (for example as shown in this publication: J. H. Qureshi: A Wide-Band 20 W LMOS Doherty Power Amplifier" IMS 2010). This procedure makes it possible to characterize the amplifiers and to compare them with one another. This analysis is subsequently performed for a two-way (prior art) and a three-way Doherty power amplifier with multi-harmonic transformation lines/offset lines LAH (invention).

FIG. 10 shows the relative bandwidth of a prior art rudimentary two-way dopant without transformers (family of curves as a function of E according to equation (18)).

$$\epsilon = \frac{U_{DS}^2}{P_{tot}} \tag{18}$$

In equation (18), the drain voltage of the amplifier cores DM, DP1, DP2 is designated UDS, while $P_{tot}$ represents the peak output power of the amplifier. If UDS is set to a value, the family of curves represents the relative bandwidth for different peak powers. The lower ε the higher the peak power is.

For example, curve ε=2 for UDS=50V represents an RF high power amplifier HPA having a peak power of 1,250 W. It can be seen from the graph that decreasing E (meaning increasing peak power) results in decreasing relative bandwidth.

FIG. 11 shows the performance of a two-way Doherty according to the invention, i.e. the relative bandwidth of a rudimentary two-way Doherty with offset lines at the main power amplifier DM and the active peak power amplifiers DP1 and DP2/active load modulators Pp1 and Pp2. The high power RF amplifier HPA was optimized using the existing degrees of freedom to maximize the relative bandwidth. It will be appreciated that the family of curves is closely together and generally has an increased relative bandwidth.

FIG. 12 illustrates the relative bandwidth for the prior art rudimentary three-way Doherty.

Figure 13:
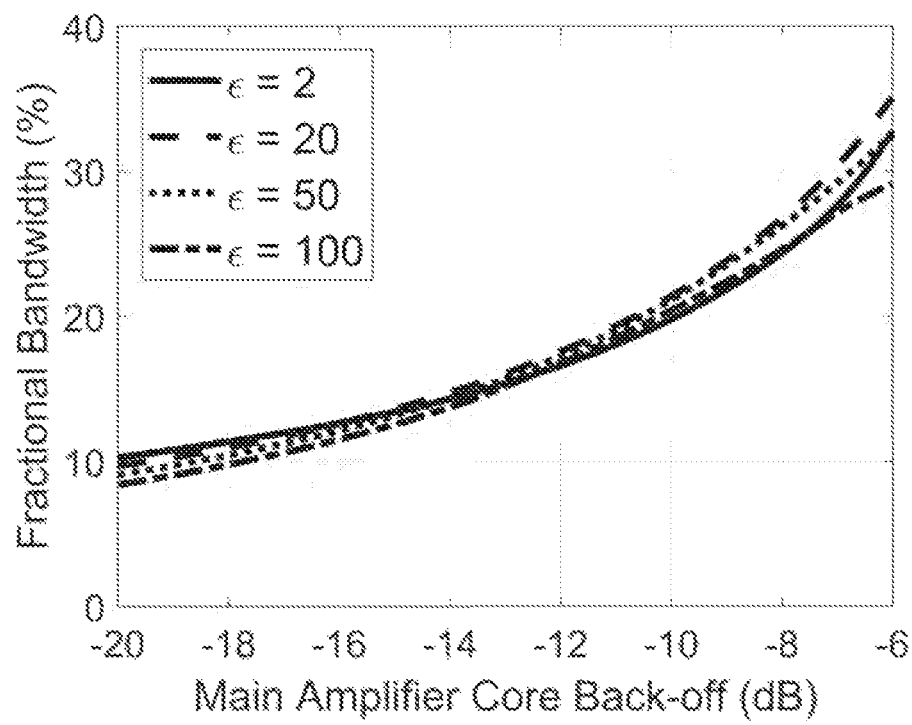
FIG. 13 shows the relative bandwidth of a rudimentary three-way dopant with offset lines at the main power amplifier and active load modulators/peak power amplifiers according to the invention.

FIG. 13 shows the performance for a three-way Doherty according to the invention, ie the relative bandwidth of a rudimentary three-way Doherty with multiharmonic transformation lines/offset lines LAH at the main power amplifier DM and the active peak power amplifiers DP1 and DP2/active load modulators Pp1 and Pp2. The high power RF amplifier HPA was optimized using the existing degrees of freedom to maximize the relative bandwidth. It will be appreciated that the family of curves is closely together and generally has an increased relative bandwidth.

For high peak powers or, more generally, for low E values, the relative bandwidth for two-way and three-way Doherty according to the invention is increased, which generally applies to N-paths Doherty.

High peak power causes a physical load due to sudden thermal heating. Microstrip lines with 70 µm copper jacket and a dielectric constant of εr=6.3 for the high thermal resistance were used in test structures. Furthermore, GaN HEMT transistors have been used for all three amplifier cores DM, DP1 and DP2 of the high-power HF amplifier HPA with, for example, 500 W, whereas high-precision models for ADS (Advanced Design System, special simulation software) are also available. These models were used throughout the design process. The gate bias of the main power amplifier DM was set to UGM=−2.7 V, whereas the peak power amplifier DP1 and DP2 were set to UgP=−4.5 V The drain voltage for all amplifiers DM, DP1 and DP2 is UDS=50V.

Contrary to a prior art Doherty Power Amplifier DPA having a single input and a single output, which consists of a static power divider and divides the input signal according to the main and peak power amplifier cores DM, DP1 and DP2, according to the invention a digital input signal divider ET having a plurality of outputs has been used in the HF high-power amplifier HPA. This type of divider is obtained by shifting the static power divider from the analog range into the digital range. The digital input signal divider ET enables an optimum of the power division ratio and the control of the individual amplifier cores for each frequency and each input driver level. Thus, each amplifier core can be driven individually in its power and phase position; this leads to a higher bandwidth and better efficiency. In the following, the digital input signal divider ET is referred to as a control function.

Figure 14:
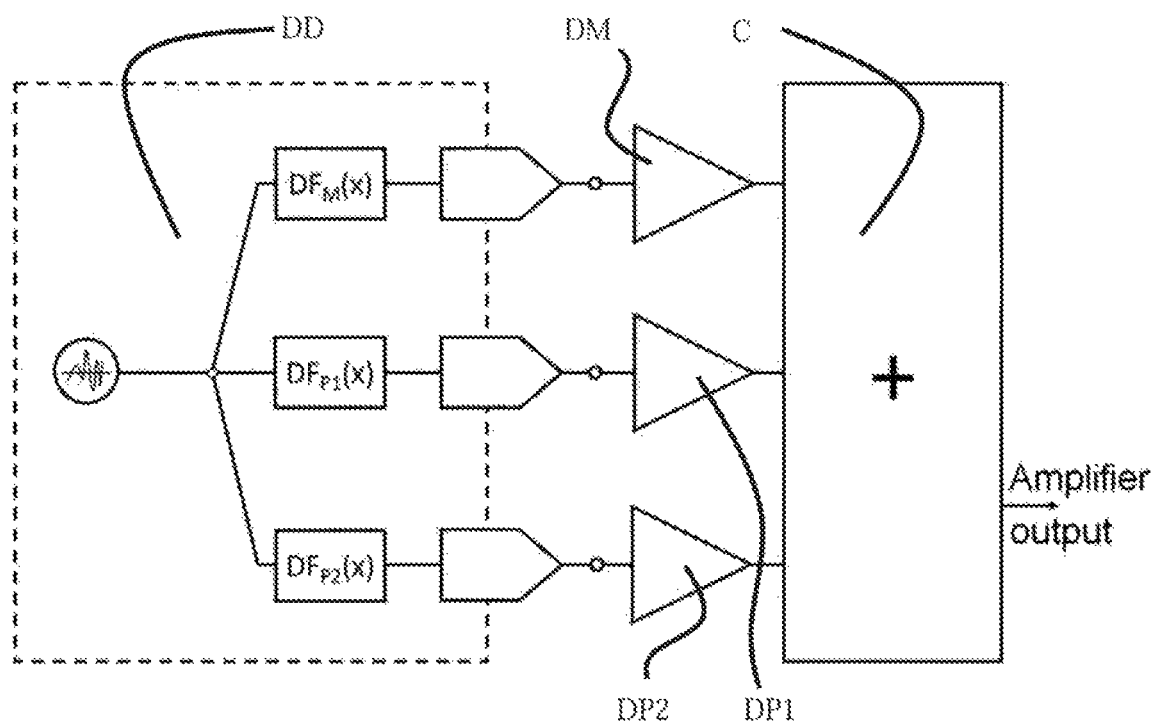
FIG. 14 shows a structure of a triple input with driver function.

The control function ET is implemented as a look-up table in the FPGA (see FIG. Further components of the FPGA (Field Programmable Gate Array), namely DSP (Digital Signal Processor Block) and DPD (Digital Pre-Distortion, Digital Pre-Distortion of the transmitted signal) are described in detail below. The control function ET is connected upstream of a multiplexer (a plurality of inputs and an output, not shown in the drawing); this receives differently modulated signals, such as AM (amplitude-modulated), GPSK (Gaussian phase shift keying), OFDM, at the multiple input, i.e. that the control function/digital input signal divider ET at the input can convert a plurality of modulation methods into the control of Doherty Power Amplifier. Control algorithms for other modulation methods can also be expanded by software. Furthermore, the control function ET enables efficient and broadband operation of the high-power RF amplifier HPA at different design frequencies. The control function ET is a function of frequency and input power, and the construction of a triple input digital signal divider ET with driver function/control function is illustrated in FIG. 14.

Certain types of sources generate an arbitrary signal in the digital domain DD (digital domain), which is fed into the control function/input signal divider ET, which belongs to the respective amplifier cores DM, DP1 and DP2. The control function ET generates a corresponding output and passes it in the direction of the digital-to-analog converter DAC (digital-to-analog converter as an integrated circuit) which drive the amplifier cores DM, DP1 and DP2. Whereas the control function ET represents a non-linear function, the superordinate transfer function consisting of the control function ET, the amplifier cores DM, DP1 and DP2 and an output combiner C, with regard to continuous waves, is a linear function. In the context of the invention, a DPD module (digital pre-distortion) can be provided for modulated waves (see FIG. 1) in order to control memory effects. The non-linearity of the control function ET can represent a challenge for the digital-to-analog converters DAC since they must cover the requirements of the increased bandwidth.

Harmonic compensation simulations were carried out in order to identify the control function ET. Each input of the high-power RF amplifier HPA has two degrees of freedom consisting of amplitude and phase. Overall, this results in a six-dimensional space in which the optimization takes place. A suitable solution for simulating the hardware consists in carrying out a stepped identification process, wherein the output power is increased to a maximum by means of small changes at the input from zero, and in particular the output power, phase, efficiency and the gain are observed. Due to the small changes, this represents a virtual risk-free process, as a result of which the destruction of the amplifier cores is avoided.

There is not only one but an infinite fullness of possible control functions/digital input signal dividers ET Their behavior depends on the set of measurements taken into account during the identification process and also the weight in which they are given. For example, it is possible to generate a control function ET which is focused to a maximum of efficiency. This control function ET differs from one associated with the goal of an extension of the small bandwidth generated to the digital-to-analog converter DAC or one that is focused at low compression levels at the amplifier cores. The setting of the targets and their weighting for the identification process therefore produce various control functions which lead to a different operating behavior.

The following control function/digital input signal divider ET was identified in ADS (Advanced Design System, special simulation software) for a plurality of target output powers in the range of zero to 61 dBm. For each target output power, an input control profile with maximum efficiency was identified. The following points represent two important secondary targets:

Compression level: The compression level of each amplifier core DM, DP1 and DP2 was monitored indirectly by observing the gate current. According to the data sheet of the GaN HEMT transistor (high-electron-mobility transistor, transistor with high electron mobility, which is a special design of a field-effect transistor for very high frequencies), the maximum gate current is 80 mA. The maximum allowed current for the identification process was set to 40 mA.

Inherent Drain Voltage: In accordance with the data sheet, the inherent drain voltage is 125V. To ensure long failure safety, the maximum voltage was set to 120V in the ADS design environment during the identification process.

Continuous compression control of main power amplifiers DM and active peak power amplifiers/load modulators DP1, DP2 is difficult in N-way Doherty power amplifiers. However, compression control is important as life loss and potential destruction of the transistor are imminent. Due to the load modulation, it is not possible, as in the case of a single-core amplifier according to the prior art, to vary the input power in order to determine the compression level of the amplifier cores therefrom. Complete identification of the overall amplifier is also not possible or possible only to a limited extent by the multi-dimensional space of the control function/digital input signal divider ET Added to this are aging processes, which would make necessary regular re-identification. In an amplifier with two amplifier cores, it may still be possible to avoid strong compression via careful selection of the control. However, this becomes increasingly difficult to impossible as the number of amplifier cores increases, since it is no longer guaranteed that no amplifier core is in excessive compression.

Figure 35:
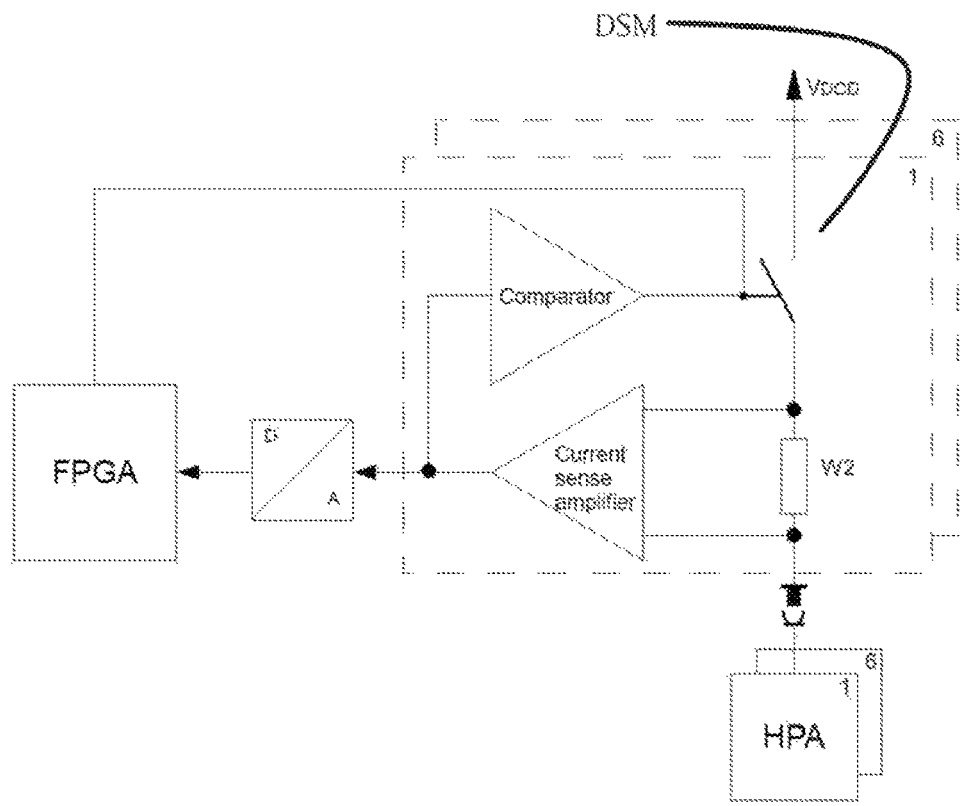
FIG. 35 is a block diagram of an embodiment for drain current measurement and FIG. 36 is a block diagram of an embodiment for gate current measurement.
Figure 36:
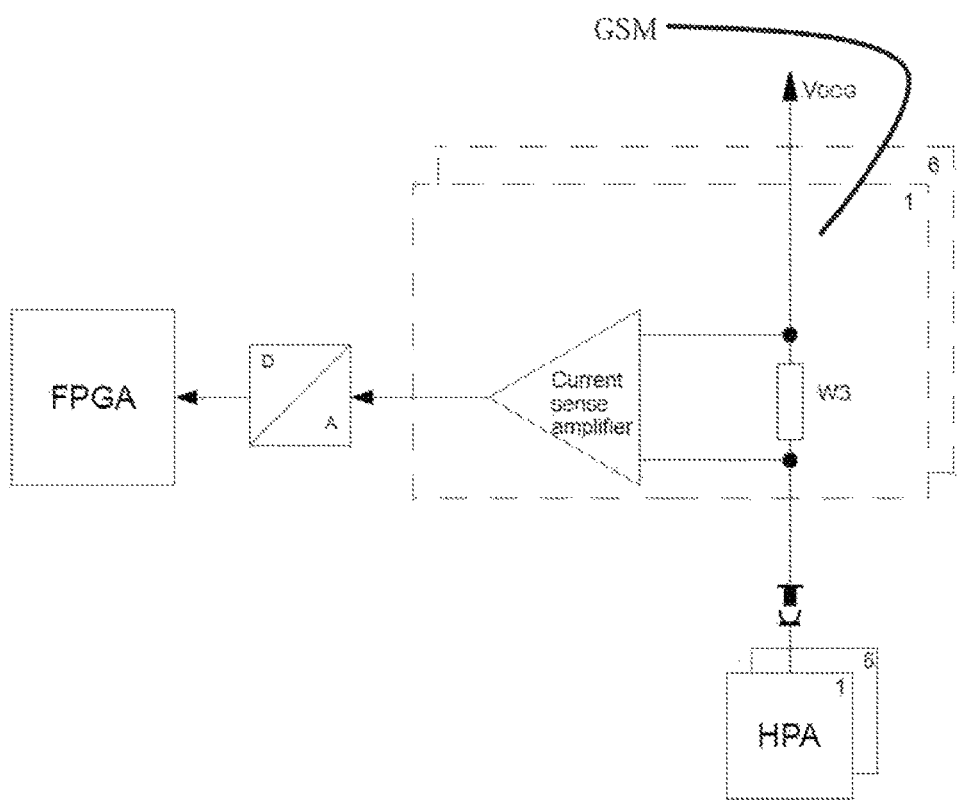

As already explained, in the HF high-power amplifier HPA according to the invention, the gate currents are used as a measure of the compression level of the main power amplifier DM and of the active load modulators DP1, DP2. All gate currents are measured individually with the aid of an electrical component. This component can be realized by shunt resistors or other methods. FIG. 35 shows the block diagram of an embodiment for the drain current measurement DSM and FIG. 35 shows an embodiment for the gate current measurement GSM. The DC power supply for the DSM module is designated VDCD. Each module drain current measurement DSM has a comparator, a measurement amplifier, a switch and a resistor 2 W2. Each module gate current measurement GSM has a sense amplifier and a resistor 3 W3, and the DC power supply for the GSM module is designated VDCG.

Within the scope of the invention, the architecture has been chosen in such a way that the video bandwidth of the component approximately corresponds to the instantaneous bandwidth of the transmission signal, so that an in-situ measurement is possible. If the video bandwidth is below this, the measure of the compression level is averaged.

The invention is described in the example of GaN-HEMTs, but can be transferred to all power transistors which have high gate currents. GaN-HEMT gate terminals are based on a Schottky diode having higher gate currents than LDMOS or GaAs based power transistors. Depending on the peak power of the GaN-HEMT, gate currents of 5 mA to 80 mA may arise when the power transistor is in compression.

In order to prevent the electromigration of the Schottky diode, the current density at the gate periphery must not become too large and therefore not exceed the maximum currents. The higher currents of GaN-HEMTs compared to other technologies may be used to draw conclusions as to the current compression level of the amplifier core.

FIG. 35 illustrates the gate current for a 500 W GaN HEMT transistor along with the gain. As the input power increases, the compression level of the GaN HEMT increases steadily. At an input level of approximately 44 dBm, the compression level is 3 dB. At this point, the gate current is approximately 13 mA and increases continuously (significantly) as the compression level increases. Due to the Schottky diode, the current has the course of a diode characteristic. The maximum forward gate current is indicated at 84 mA in the selected example.

With this method, it is possible for each amplifier core to achieve an individual compression control which is not disturbed by ageing processes. In addition, it is possible to detect defective amplifier cores. For example, gate currents rising above the operating duration of the amplifier can be characters for a defect and thus indicate a ballasting failure of the amplifier core in good time. By repairs initiated in a timely manner, greater damage to the device or operation could be avoided and the availability of the systems is increased.

Figure 24:
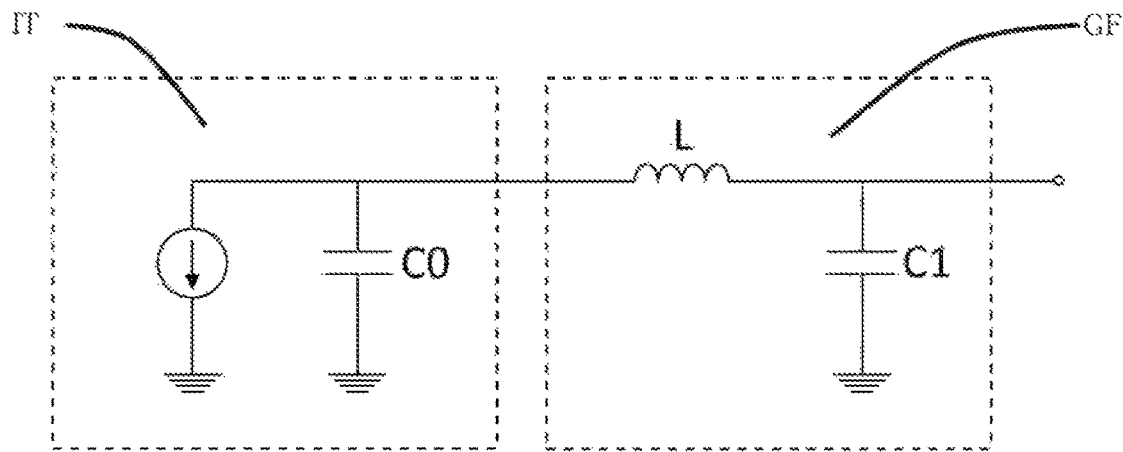

The compensation of drain parasites DPS is typically considered a secondary problem, which is not sufficient for power amplifiers with high peak powers. Offset lines with or without transforming property for Doherty-power amplifiers are sufficiently described and analyzed in the literature, see, for example, R. Giofrè et al: "A closed-form design technique for ultra-wideband Doherty power amplifiers" or A. Barakat et al: "Towards generalized Doherty power amplifier design for wideband multimode operation" or Y Yang et al: "Optimum design for linearity and efficiency of microwave Doherty amplifier using a new load matching technique" or R. Quaglia et al: "Offset Lines in Doherty Power Amplifiers: Analytical Demonstration and Design". The HF high-power amplifier HPA according to the invention is based on a transistor model which is illustrated in FIG. 24 and is based, for example, on publications "A new method for determining the FET small-signal equivalent circuit" IEEE Transactions on Microwave Theory and Techniques, Volume: 36, Issue: 7, July 1988 and R. A. Minasian: "Simplified GaAs m.e.s.f.e.t model to 10 GHz" Electronics Letters, Volume: 13, Issue: 18, September 1977.

The intrinsic transistor IT consists of an ideal current source Im and a parallel drain capacitance C0. The transistor housing ITG has further parasitic elements which can be imaged with sufficient accuracy through a serial inductance L and a parallel capacitance C1. The values of these components are determined by de-embedding techniques. The transistor model illustrated in FIG. 24 forms the basis for an offset line based absorption network ABN shown in FIG. 25.

Figure 25:
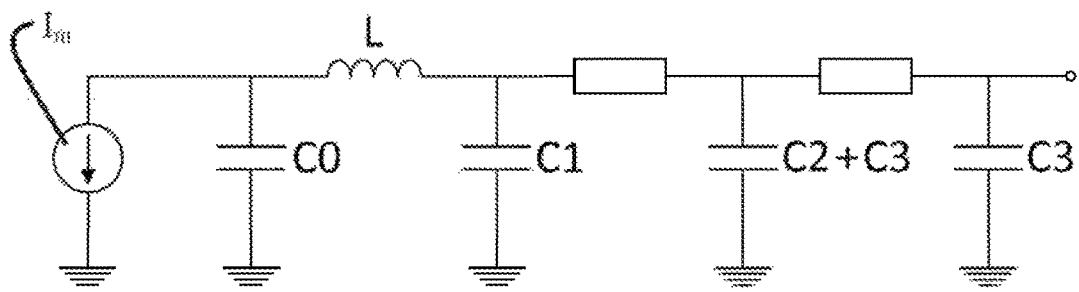

FIG. 25 shows the transistor model as well as additional microstrip lines and capacitances. The drain parasites have a finite group delay time greater than zero and thus ensure a delay of the passing shaft. This delay can be regarded as a phase shift in CW operation and has a disadvantageous effect on the load modulation. Compensation is achieved by the additional elements in the absorption network ABN.

These have the task of raising the phase shift to half the wavelength, as a result of which the absorption network ABN becomes transparent for the design frequency. Only the transforming property remains. Under these conditions, the network was released and the values of the elements are determined via the following formulas:

$$Z_0 = \frac{\cos(\varphi_0)(C_0 L w^2 - 1)}{w \sin(\varphi_0)(C_0 C_1 L w^2 - C_0 - C_1)} \quad (19)$$

$$Z_1 = \frac{\cos(\varphi_0)}{c w \sin(\varphi_1)(C_0 + C_1 - C_0 C_1 L w^2)} \quad (20)$$

$$C_2 = \frac{C_1 L Z_0 \cos(\varphi_0) | w^2 + L \sin(\varphi_0) w - Z_0 \cos(\varphi_0)}{C_1 L \sin(\varphi_0) Z_0^2 w^3 - \sin(\varphi_0) Z_0^2 w - L \cos(\varphi_0) Z_0 w^2} \quad (21)$$

$$C_3 = \frac{c \cos(\varphi_1)(C_0 + C_1 - C_0 C_1 L w^2)}{\cos(\varphi_0)} \quad (22)$$

The variable $\varphi n$ denotes the electrical length of the microstrip line n. The inductance is designated by L and the capacitances are expressed by C. The circuit frequency is expressed by $\omega$.

Figure 26:
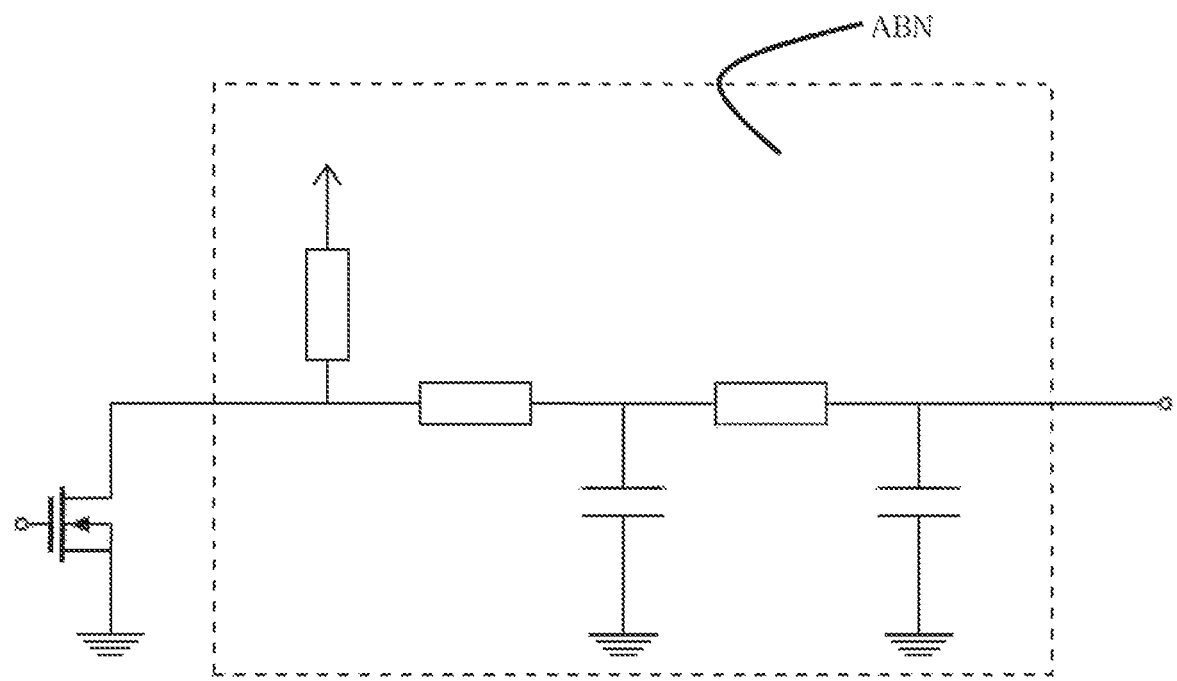
FIG. 26 shows the equivalent circuit diagram of a non-linear transistor with absorption network and voltage supply.

The degrees of freedom in the absorption network ABN form phi 0 and phi 1. These are to be selected in the region] 0; $\pi/2$]. As a result, sufficient degrees of freedom are still present in order to maximize the bandwidth of the RF high-power amplifier HPA according to the invention. A realistic absorption network ABN also requires a connection for the voltage supply. This can be realized by means of a $\lambda/4$ microstrip line and the offset line-based absorption network ABN with a transistor and the voltage supply is shown in FIG. 26.

Figure 27:
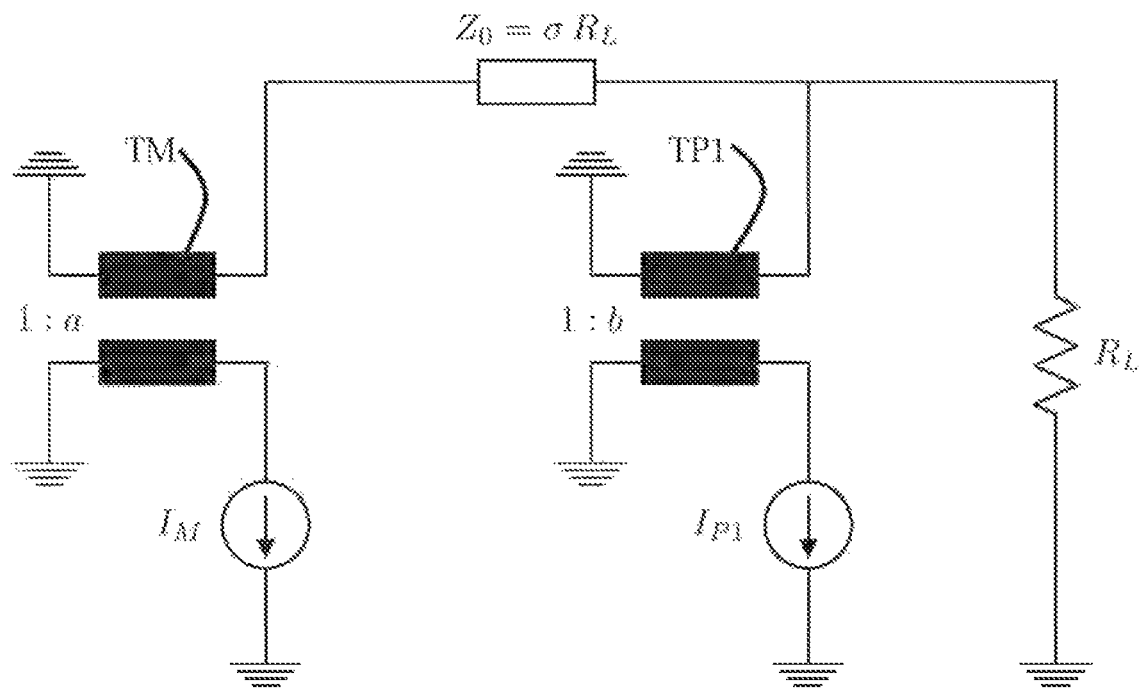
FIG. 27 shows the equivalent circuit diagram of a transformer-based two-way Doherty-power amplifier.

According to the invention, an extremely broadband on-chip based Doherty HF high-power amplifier HPA is implemented. A transformer-based two-way Doherty power amplifier is illustrated in FIG. 27. The microstrip line with the characteristic impedance Z0 shown in FIG. 27 has the length L=$\lambda d/4$ and the power transistors DM and DP1 are substituted by current sources IM, IP1.

The main power amplifier DM has an ideal transformer TM with a transformation ratio of 1:a and the active load modulator DP1 has an ideal transformer TP1 with the ratio 1:b. The transformers TM, TP1 are connected by an impedance inverter (represented here by a $\lambda/4$ microstrip line). By using the ideal transformers TM, TP1, the invention obtains sufficient degrees of freedom in order to define terminating impedance RL as desired and at the same time to guarantee a high bandwidth. This principle can be extended without problems to N-paths Doherty power amplifiers, where N is the number of power transistors used. The network for the two-way Doherty can be described mathematically and can be represented by the impedance matrix Z.

$$Z = U_{DS}^2 \begin{pmatrix} \dfrac{g_0^2}{\sigma^2 g_1} & \dfrac{g_0}{\sigma} e^{-\frac{\pi f_i}{2 f_d}} \\ \dfrac{g_0}{\sigma} e^{-\frac{\pi f_i}{2 f_d}} & \dfrac{g_1}{2} + \dfrac{g_1}{2} e^{-\frac{\pi f_i}{f_d}} \end{pmatrix} \quad (23)$$

With $$g_0 = 1/(2 P_m)$$

and $$g_1 = 1/(2 P_m + 2 P_P).$$

The supply voltage carries the designation UDS, while f denotes the frequency and $f_d$ stands for the design frequency. The maximum powers of the power amplifier cores are referred to as Pm (main power amplifier) and Pp (active load modulator).

The matrix according to equation (23) detects the frequency-dependent course as a function of $\sigma$. The parameter $\sigma$ is an important degree of freedom via which the performance of the power transistors DM and DP1 can be adjusted. $\sigma$ must be suitably chosen for optimum performance. The impedance matrix Z does not contain any of the two transformation ratios a and b. However, the degree of freedom a is indirectly included above sigma, since $\sigma$ and a are related via the following formula:

$$a = \sigma \frac{\sqrt{R_L g_1}}{U_{DS} g_0} \quad (24)$$

The degree of freedom b is defined by the selection of $R_L$:

$$b = \frac{1}{U_{DS}} \sqrt{\frac{R_L}{g_1}} \quad (25)$$

The load has the designation $R_L$. The architecture has a degree of freedom which is denoted by $\sigma$.

Since neither b nor $R_L$ are included in the impedance matrix Z, the choice of $R_L$ or b does not affect the frequency response of the Doherty-power amplifier, or more generally, the choice does not affect the performance of the RF-high power amplifier HPA of the present invention.

In a purely theoretical view of the amplifier, it is customary to operate the main power amplifier and the active load modulators in a broadband class-B operation (for example as described in this publication J. H. Qureshi: "A Wide-Band 20 W LMOS Doherty Power Amplifier" IMS 2010). This procedure makes it possible to characterize the amplifiers and to compare them with one another.

This is used in the following to obtain an estimate of the performance of the design according to the invention. In this case, a rudimentary two-way Doherty without transformers is compared with the invention, the family of curves of which is depicted as a function of $\varepsilon$ in FIG. 10 (see also equation (18)). It can be seen from FIG. 10 that the lower $\varepsilon$ is the higher the peak power. For example, for a chip UDS=3.3 V, this means that the curve $\varepsilon$=2 corresponds to a peak power of $P_{tot}$=5.4 W (37.36 dBm), while $\varepsilon$=100 corresponds to a peak power of $P_{tot}$=0.11 W (20.37 dBm). Furthermore, it can be seen from FIG. 10 that a decreasing $\varepsilon$ (meaning increasing peak power) leads to decreasing relative bandwidth.

Figure 28:
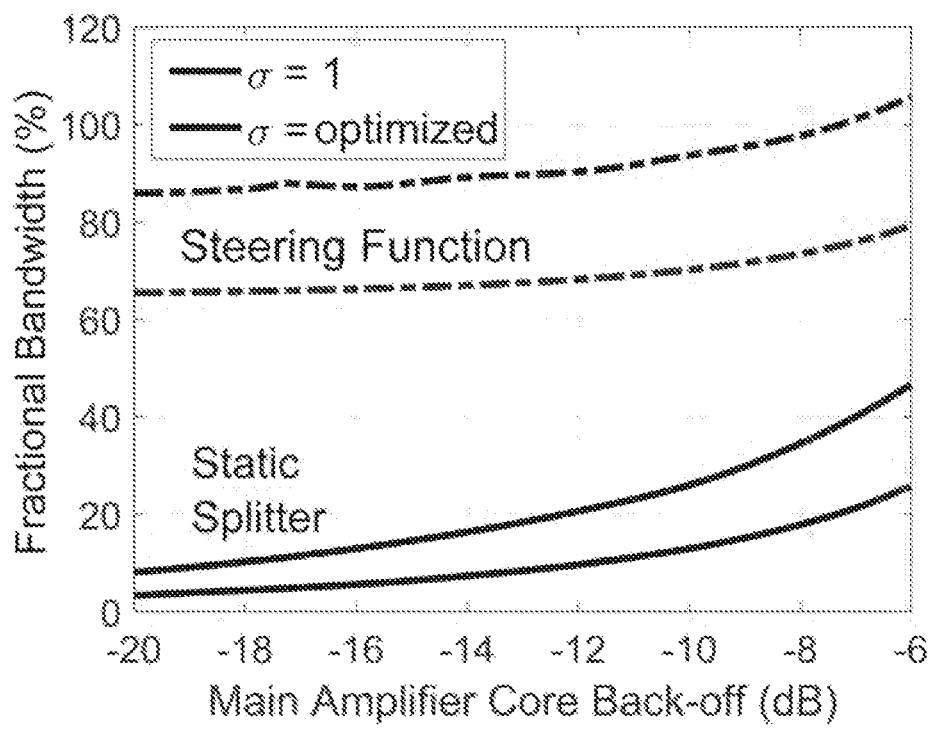
FIG. 28 shows the relative bandwidth for a static splitter and control function.

FIG. 28 shows the relative bandwidth for a static splitter and control function (Drive Function, introduced in W. C. Edmund Neo et al: "A Mixed-Signal Approach Towards Linear and Efficient N-Way Doherty Amplifiers" IEEE Transactions on Microwave Theory and Techniques, Volume: 55, Issue: 5, May 2007), in particular for a two-way Doherty power amplifier with transformers according to the invention.

It can immediately be seen that the invention is not dependent on ε. This means that the usual performance losses at high peak power (general: low ε in the on-chip based Doherty HF power amplifier HPA (RF high-power amplifier HPA) according to the invention is eliminated.

Only the choice of σ exerts a strong influence on the bandwidth, as well as the use of a control function ET, which significantly raises the bandwidth over an octave.

When using a static power divider, the bandwidth of the invention is higher than that of the rudimentary Doherty, with a suitable choice of σ.

Figure 29:
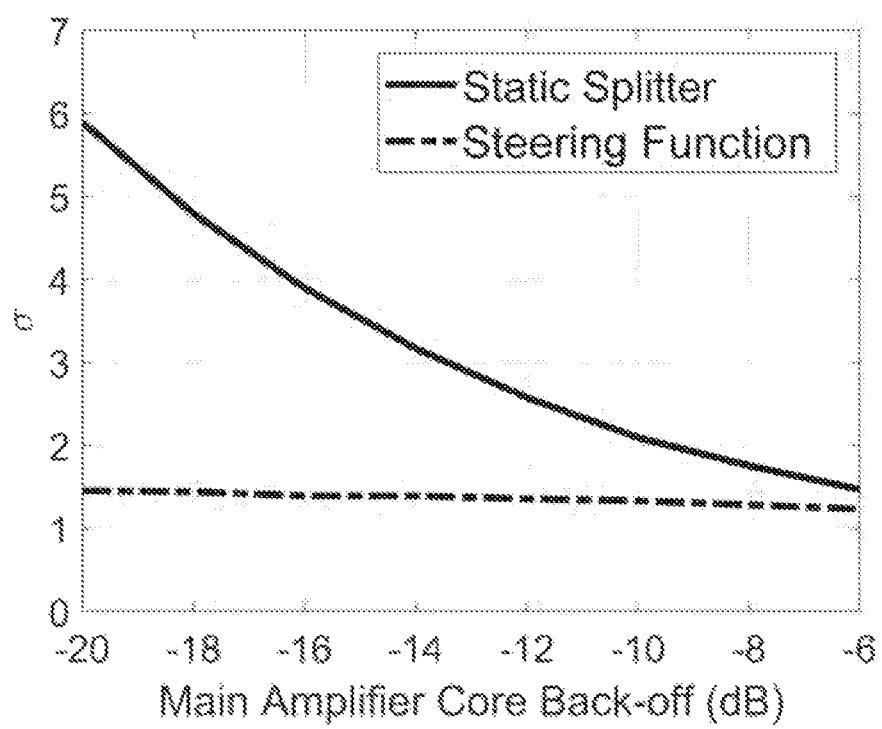
FIG. 29 shows the relative bandwidth of a two-way RF high-power amplifier according to the invention with transformers and the associated parameter σ (for setting the performance of the power transistors) of the optimized curves.

The optimized values of a two-way RF high-power amplifier (HF high-power amplifier HPA) according to the invention with transformers for a are shown in FIG. 29. It is to be noted that the microstrip line with the characteristic impedance Z0 in the literature is usually realized by a transformer. Consequently, in one implementation, the transformer TM at the main power amplifier DM is merged with the microstrip line to form a component. This means that the transformer TM at the main power amplifier DM not only performs the impedance transformation described by 1:a, but also represents the impedance inverter, so that a compact and wideband RF high-power amplifier HPA is realized.

However, since the control function ET represents a generality of the static power divider, the control function is used for the purpose of generality. The design complexity of a Doherty-power amplifier design increases with the number of active load modulators (DP1, DP2). In order for the complexity to remain in an acceptable frame, a suitable design strategy is needed.

The basic idea of most design methods is to decompose the power combining network in a suitable manner in order to design the sections individually and finally to combine them to form a total network.

Mainly two different methods are known in the literature.

The first method is referred to in the English language use "Real Frequency Technique". In this method, non-linear optimization tools are used to design matching networks in a predetermined frequency band.

The active element (mostly the power transistor DM, DP1, DP2) is replaced by real measurement data. Impedances that are subjectively selected from the measurement data are used together with an iterative mathematical process in order to generate broadband networks. The basic method was described in H. J. Carlin and J. J. Komiak: "A New Method of Broad-Band Equalization Applied to Microwave Amplifiers" IEEE Transactions on Microwave Theory and Techniques, Volume: 27, Issue: 2, February 1979, is later simplified, see B. S. Yarman and H. J. Carlin: "A Simplified "Real Frequency" Technique Applicable to Broadcast Multistage Microwave Amplifiers" IEEE MTT-S International Microwave Symposium Digest 1982 and finally adapted for the two-way Doherty power amplifier, see G. Sun: "Broadcast Doherty Power Amplifier via Real Frequency Technique" IEEE Transactions on Microwave Theory and Techniques, Volume: 60, Issue: 1, January 2012. This method makes it possible to design the main power amplifier DM and the active load modulators DP1, DP2 independently of one another.

The second method uses a plurality of sent reference planes which allows the power combining network to be dismantled. Impedances are selectively defined for each reference plane for which matching networks of the sections are designed. This was used, for example, in W C. Edmund Neo et al: "A Mixed-Signal Approach towards Linear and Efficient N-Way Doherty Amplifiers" IEEE Transactions on Microwave Theory and Techniques, Volume: 55, Issue: 5, May 2007. The impedances of the reference planes were set to 50 Ohm.

A design methodology which is improved on the reference plane method is described and explained below. In the above publications, the reference planes are only used for the design frequency. For a broadband design, the impedances of the reference planes must be frequency-dependent. Any or subjective choice of impedances over the frequency band is either not possible or leads to sub-optimal results.

Therefore, these impedances must be determined in advance to be as close as possible to the later physical curve. In the context of digital Doherty power amplifiers, the impedances need not only be frequency-dependent, but additionally a function of the control function ET (in. Drive Function DF).

When using a static power divider, the control function ET has the characteristics of the static power divider.

Control functions can be selected per se accordingly, i.e. they can be selected in such a way that they behave like a static power divider or so that they are perfectly adapted for an arbitrarily selected criterion. The type of control function ET selected is not determinable for the functionality of the design methodology. Due to their flexibility, however, they represent a general case of the conventional static power divider, for which reason they are used in the improved design methodology.

The design methodology provides that in an N-way Doherty N reference planes are used. The reference planes are located at each output of the matching networks AN of main power amplifiers DM and active load modulators DP1, DP2.

In the case of a three-way Doherty-power amplifier, the three reference planes RA, RB and RC are located at the positions as shown in FIG. 30 (according to the prior art).

The power transistors are abstracted as current sources (IM, IP1, IP2). In order to ensure a realistic representation, the drain parasites DPS are included in the model. In the case of the active load modulators DP1, DP2, the input impedance of the reference plane must be as high as possible. In contrast to the Real Frequency Technique, no impedances need to be subjectively selected here. Only the transistor-drain parasites DPS must be known, which is not an obstacle due to current transistor modeling.

The impedances ZM (f, ET), ZP1 (f, ET) and ZP2 (f, ET) are functions dependent on frequency and control function. The impedances are found by driving the network depicted in FIG. 30 with any control function ET and determining the voltages and currents at the respective reference planes A, B, C (RA, RB, RC). The impedances are calculated from the voltages and currents. This is repeated for all frequencies. In principle, it is possible to determine the impedances at the reference planes A, B, C (RA, RB, RC) for any number of frequencies f and control functions ET In practice, this should be limited to a realistic number, since the simulation speed in the design phase decreases with each frequency f and control function ET.

The improved design methodology envisages limiting the N−1 back-off points and the peak power of the respective N-way Doherty power amplifier DM, DP1, DP2 in the control function ET and to use an appropriate number of frequencies f depending on the width of the selected frequency band.

By using the reference planes A, B, C (RA, RB, RC), the matching network AN (the output combiner C) can be divided into sub-networks as illustrated in FIG. 31. These sub-networks can be designed individually. The main amplifier DM and the active load modulators DP1, DP 2 are now designed independently of one another and finally assembled to form a matching network AN (output combiner C).

Figure 16:
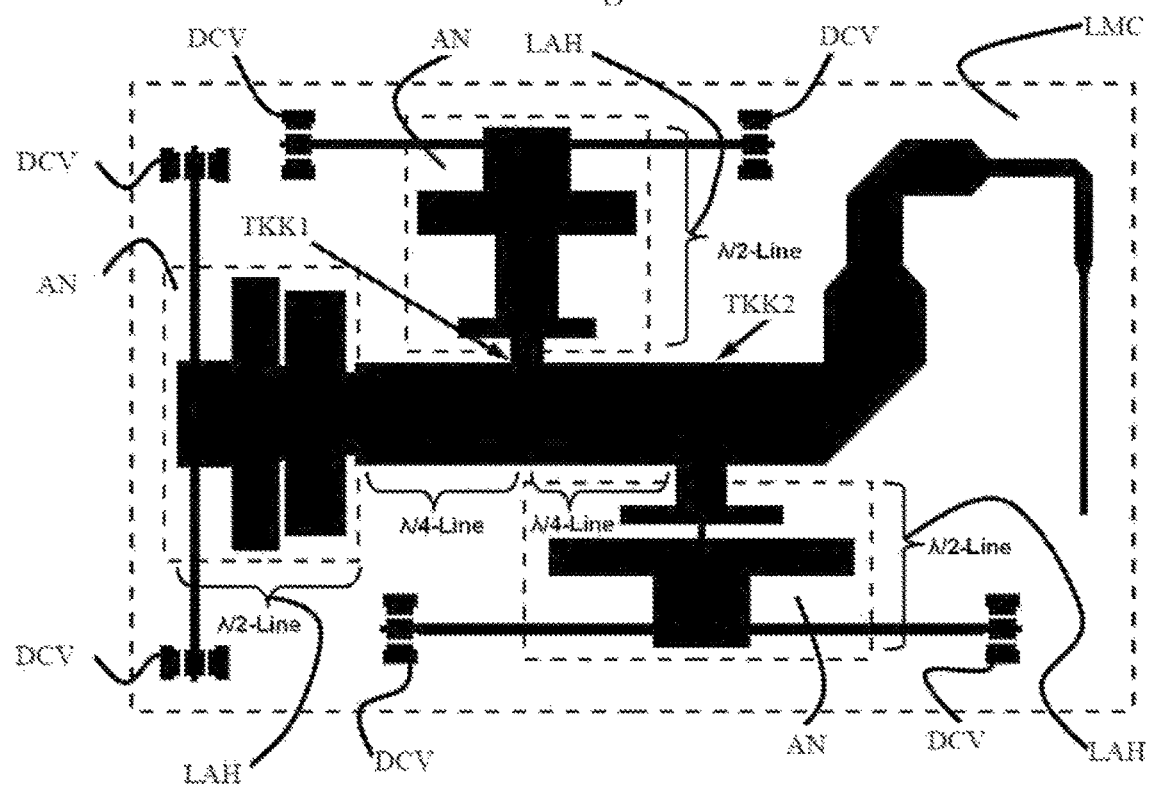
FIG. 16 is a layout of a second embodiment of an output combiner (broadband back-off combiner WBC)

In principle, the main amplifier DM and the active load modulators DP1, DP2 can be designed independently of one another and finally assembled to form a matching network AN (output combiner C). However, if increased accuracy is required, first the load modulators DP1, DP2 must be designed and assembled into a power combining network without the main amplifier. This corresponds to FIG. 30 without the current source IM, its drain parasites and the matching network AN (output combiner C). The impedances ZM (f, ET) at reference plane "A" are now determined. In the measurement, the current sources (IM, IP1, IP2) and drain parasites DP should be replaced by non-linear transistor models. As a result, the new measured impedances ZM (f, ET) are more exact than the preceding impedances, which were determined only via the linear model. As a result of the "design option", the performance in the back-off can be significantly improved. The layout of the second embodiment of an output combiner C thus produced is illustrated in FIG. 16.

Figure 15:
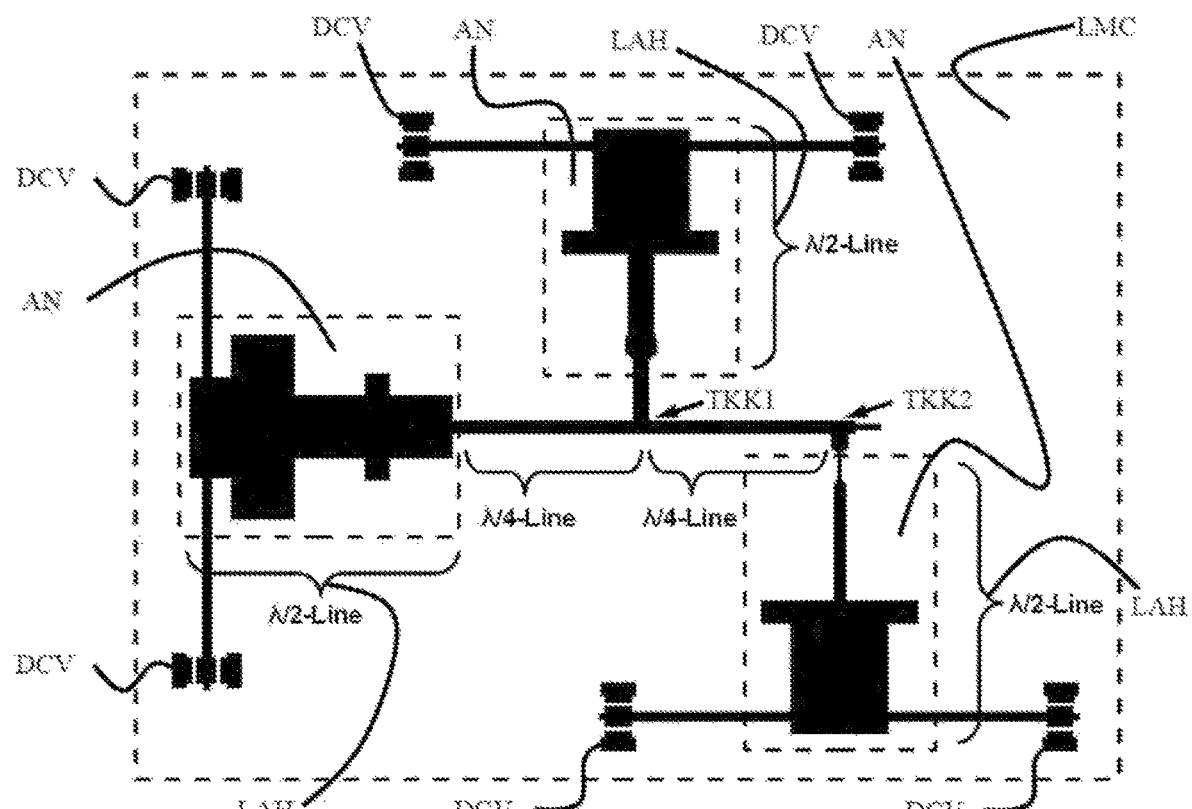
FIG. 15 is a layout of a first embodiment of an output combiner (load-matched combiner LMC)

With the aid of the CAD-based method described above, two RF high-power amplifiers HPA were designed which correspond to the limiting cases described above. The layout of the output combiner C with a length of approximately 15.1 cm and a height of approximately 9.3 cm from the first limiting case is shown in FIG. 15 (load-adjusted combiner LMC) and the layout of the output combiner C with a length of approximately 14.9 cm and the height approximately 10.4 cm from the second limiting case is depicted in FIG. 16 (broadband back-off combiner WBC). Both amplifiers were analyzed in a CAD tool using control functions ET. The high power RF amplifier HPA depicted in FIG. 15 has a relative bandwidth of 36.4% while the high power RF amplifier HPA shown in FIG. 16 has reached a relative bandwidth of 43.5%. Over the entire bandwidth, both RF high-power amplifiers HPA have less than a dB fluctuation in peak power of 61 dBm, which will be described and explained in more detail below, wherein the load-matched combiner LMC (FIG. 15) and, like the broadband back-off combiner WBC (FIG. 16), are a special form of the output combiner C.

The output combiner C depicted in FIG. 15 is intended to obtain the peak efficiency of the second back-offs (in which only the main power amplifier DM operates) over the entire frequency band. It is referred to below as load-matched combiner (LMC). Obtaining the highly efficient back-off point over the entire bandwidth increases the average efficiency for modulated high PAPR waveforms (peak to average power ratio signal ratio).

It is well known that microstrip lines with high transformation ratios reduce the bandwidth, which is known as "Bode Fano Limit". Broadband behavior was achieved by reducing the transformation ratio of the $\lambda/4$ lines. Taking into account the second back-off, the maximum bandwidth was achieved by minimizing the impedance changes, where $Z0 \approx Z1 \approx RL$ is required.

The output combiner C depicted in FIG. 15 as LMC can fulfill this requirement by taking three of six degrees of freedom. Due to the additional transforming offset lines LAH at the main power amplifier DM, three degrees of freedom remain, which can be used to maximize the bandwidth behavior. In the case of extremely high peak output power, e.g., greater than 61 dBm, the output resistance is less than 6Ω. This requires a broadband impedance inverter with a transformation ratio of more than 8.33 for 50Ω load balancing. To adjust the low output resistance with 50Ω termination, a broadband, three-stage $\lambda/4$ transmission line impedance converter is used.

Figure 17:
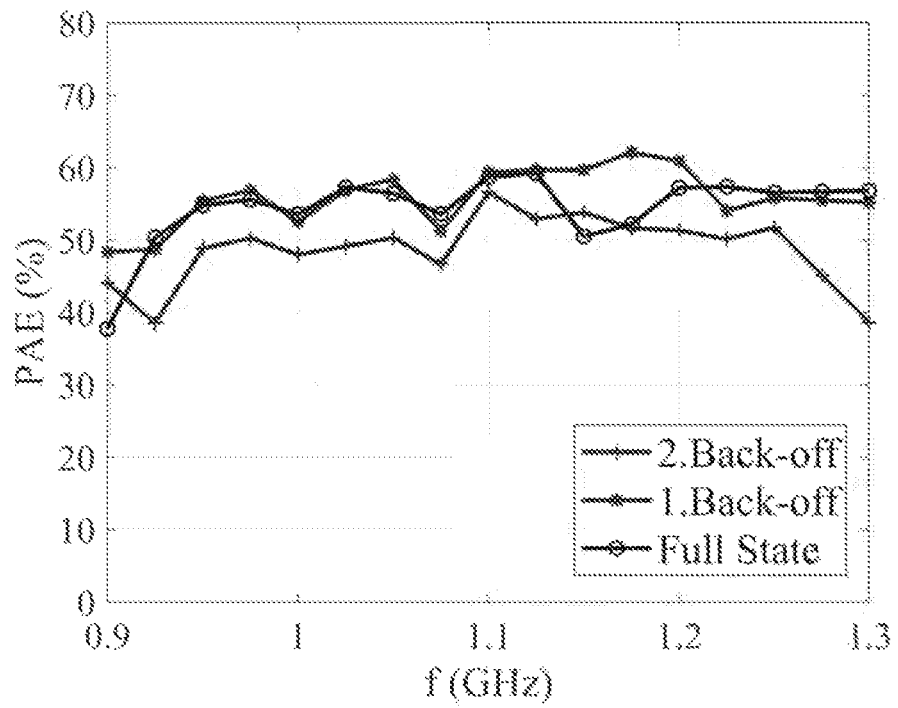
FIG. 17 shows the average power efficiency PAE at the back-off points of the output combiner of FIG. 15.

The control functions ET are identified for the output combiner C as LMC from 0.9 GHz to 1.3 GHz in stages of 25 MHz, which corresponds to a relative bandwidth of 36.4%. The peak output power for each frequency is in the range of 60.4 dBm to 61 dBm. The power added efficiency PAE at the back-off points is shown in FIG. 17.

Figure 18:
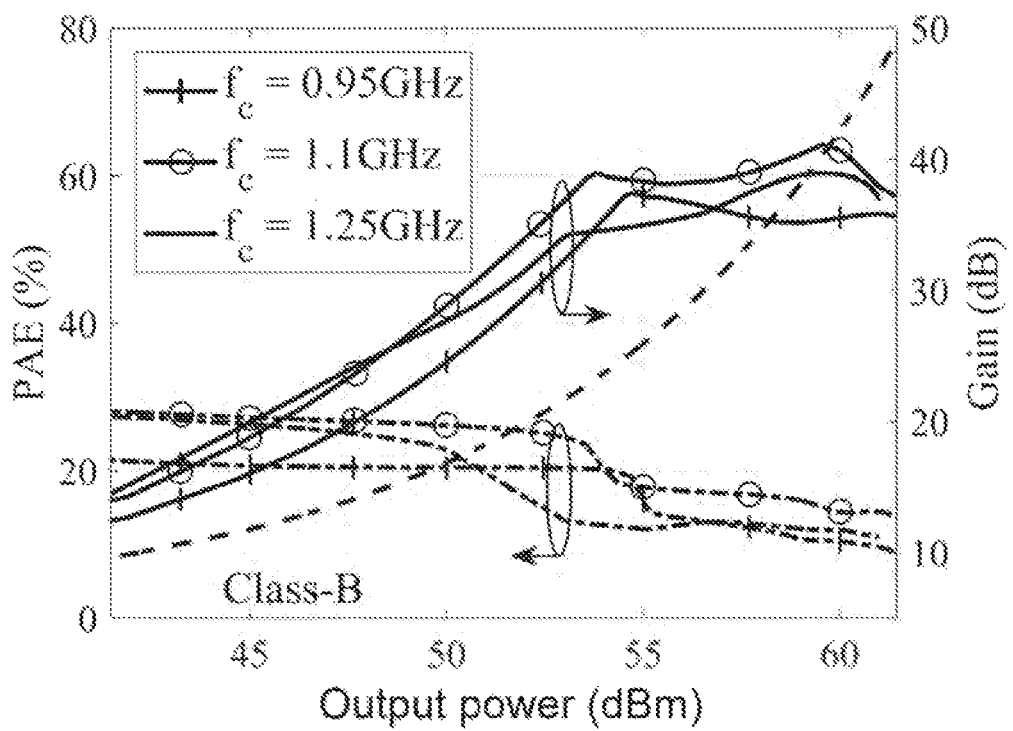
FIG. 18 shows the efficiency and gain of the RF-power amplifier HPA with an output combiner of FIG. 15 at different frequencies.

The efficiency and gain of the high power RF amplifier HPA with an output combiner C of FIG. 15 at various frequencies between 0.95 GHz to 1.25 GHz is illustrated in FIG. 18.

The power is comparable to the power of an ideal Class-B amplifier with a maximum efficiency of $\pi/4$. The RF high-power amplifier HPA shows the typical behavior of a Doherty with a pronounced efficiency plateau for output powers greater than 53 dBm or 54 dBm. The control functions ET clearly show that there is a peak efficiency point at each frequency, which is related to the second back-off. At this point it should be noted that only two maximum peaks are observed counter to the ideal theory. The maximum efficiency peak of the second peak power amplifier core DP2 is not present, not once at the center frequency. Due to the general decay of the Doherty principle, this is expected for non-center frequencies. The first back-off point, which is shifted to higher back-off values, is the reason. As the investigations have shown, the missing peak efficiency location has no great influence on the average efficiency of the modulated waveforms.

It can be determined that the amplified curves undergo a drop at the point where load modulation begins. In the case of a conventional power amplifier, such abrupt changes in output would produce strong nonlinearities which would have to be linearized. This is different in connection with the digital RF high-power amplifier HPA according to the invention. The control function ET linearizes the DPA output. The higher bandwidth requirements require only the requirements for the digital-to-analog converter DAC. In order to answer the reason for the rapid gain changes, it must be taken into account that the given gain curves are combined gains of all three amplifier cores DM, DP1 and DP2, rather than the individual gain of each individual amplifier core. The individual gains do not experience any such spontaneous changes and instead have more static inclinations. The overall gain decreases because the peak power amplifier cores DP1 and DP2 are biased as Class-C and therefore have a lower gain as compared to the main amplifier core DM. The input power of the peak power amplifier cores DP1 and DP2 rapidly overtakes the input power of the main amplifier DM, resulting in a rapid drop in overall gain.

Figure 19:
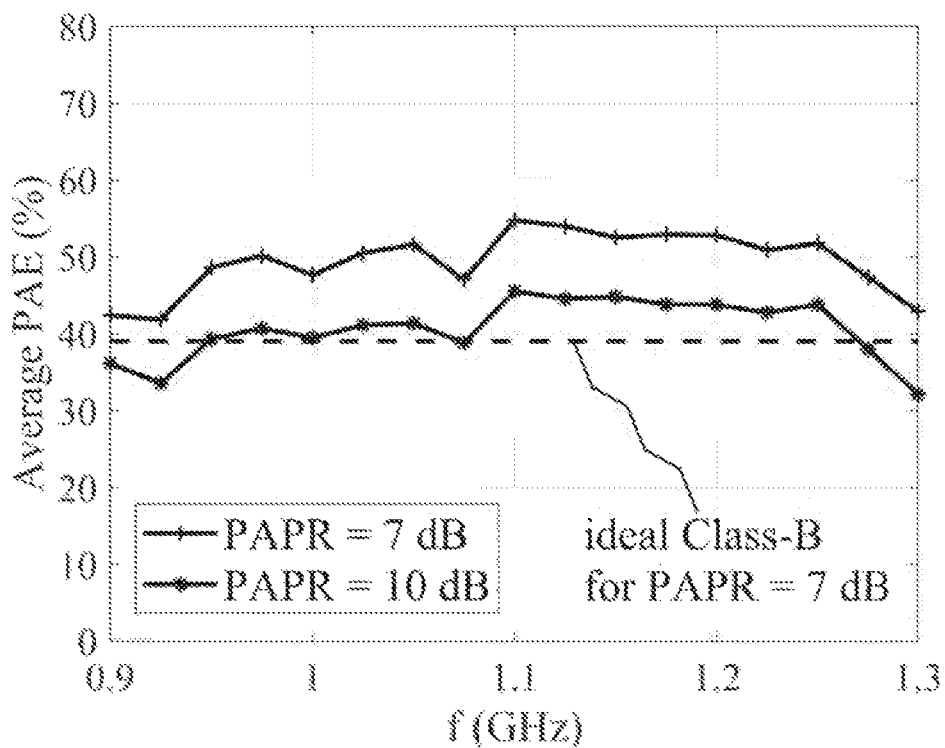
FIG. 19 shows the average power efficiency PAE for Rayleigh-distributed voltage waveforms.

FIG. 19 shows the average power efficiency PAE at the back-off points for Rayleigh distributed waveforms. It may be determined that the PAE remains above 40% for a wide range. The broadband back-off combiner LMC shown in FIG. 15 has the advantage of a clear high efficiency peak at the second back-off, which provides a high average efficiency over the entire bandwidth. The reciprocal side is that the additional broadband matching network substantially increases the area requirement. Likewise, the low impedance environment in the output combiner C presents difficulties in designing the circuit board layout since most microstrip lines have a width of 13 mm to 16 mm. This reduces reliability in the form of S-parameters of the wide ports since they are less accurate. Of course, this is the main challenge in high power amplifiers with very high power, since the microstrip lines become thinner with lower maximum output power. In summary, it can be stated that the broadband back-off combiner LMC shown in FIG. 15 has the advantage of good back-off operating behavior over the entire bandwidth, but also has a few disadvantages insofar as it is used for superstructures with very high power. In order to avoid the broadband impedance inverter and also the reduction of the microstrip line width in the load-tuned combiner (LMC according to FIG. 15), the impedance inverter power capability in the output combiner C must be utilized.

In the second limiting case illustrated in FIG. 16, the transformation property of the combiner architecture is used to tune the three-way Doherty Power Amplifier DPA directly to the desired load impedance of 50Ω. The load-tuned combiner (LMC) shown in FIG. 15 uses the same architecture as the broadband back-off combiner (WBC) shown in FIG. 16, only the values of the components being changed.

Figure 20:
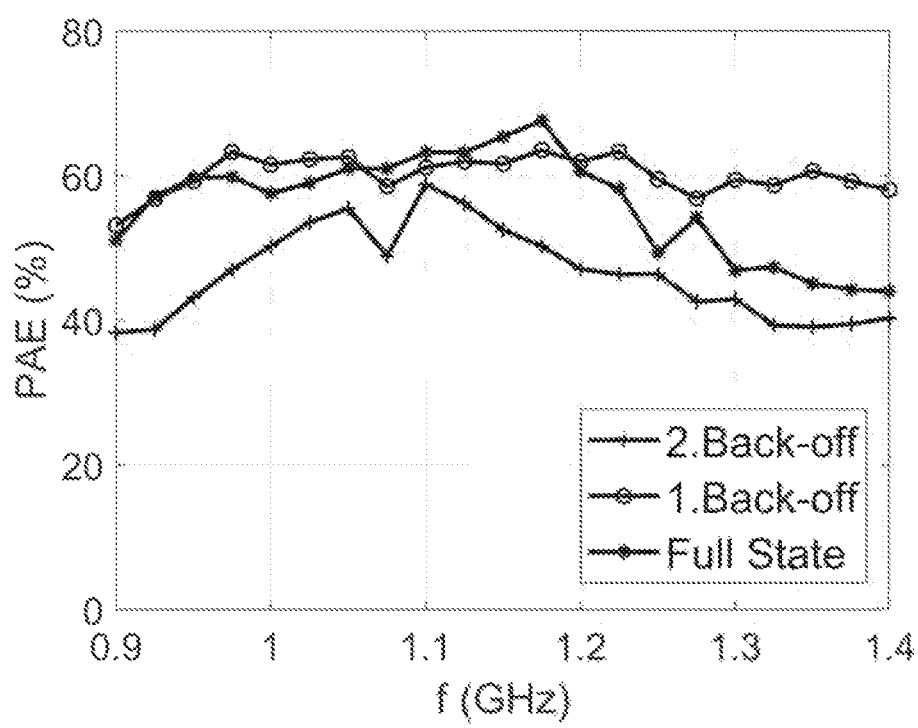
FIG. 20 shows the average power efficiency PAE at the back-off points of the output combiner of FIG. 16.
Figure 21:
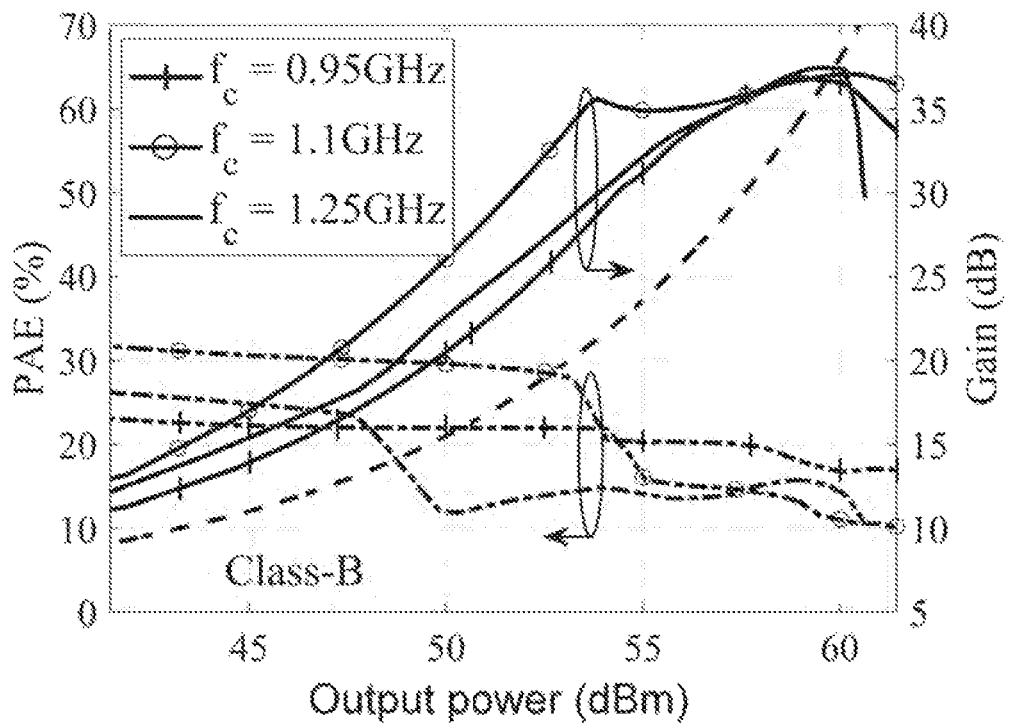
FIG. 21 shows the efficiency and gain of the RF-power amplifier HPA with an output combiner of FIG. 16 at different frequencies.
Figure 22:
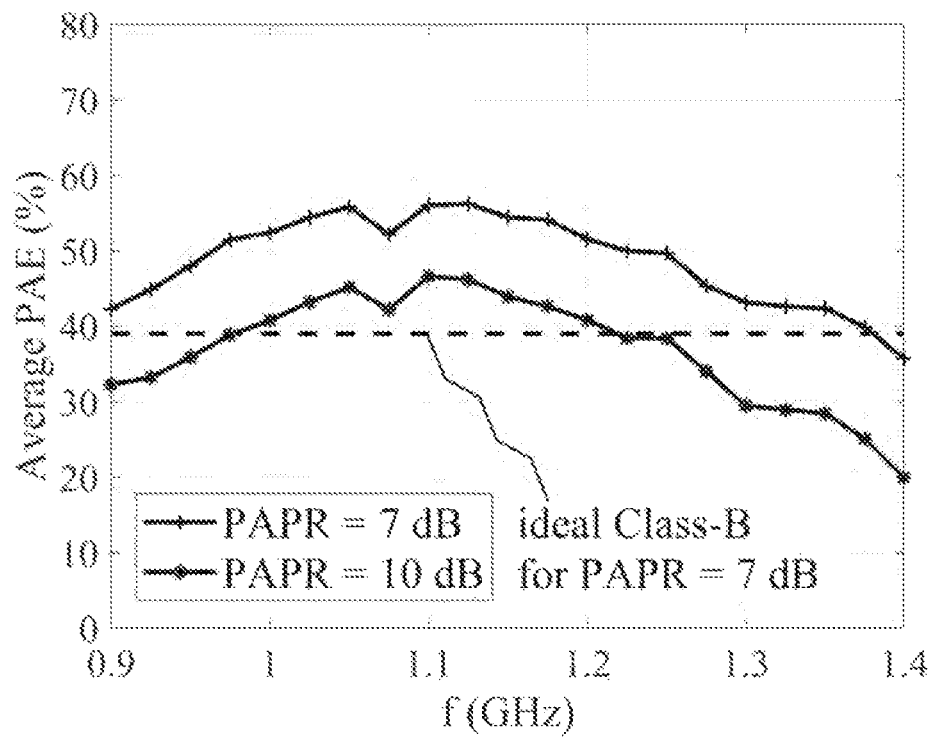
FIG. 22 shows the average power efficiency PAE for Rayleigh distributed voltage waveforms.

The control functions ET are identified from 0.9 GHz to 1.4 GHz in 25 MHz stages, which corresponds to a relative bandwidth of 43.5% and are identified for achieving the maximum efficiency at each power level. The peak output power at each frequency is in the range of 60.3 dBm to 61 dBm. FIG. 20 shows the average power efficiency PAE at the back-off points (1. back-off, 2. back-off) and in the "full state" of the output combiner C according to FIG. 16. In FIG. 21, the efficiency and the amplification of the RF high-power amplifier HPA with an output combiner C according to FIG. 16 is shown at different frequencies ($f_c$=0.95 GHz, $f_c$=1.1 GHz and fc=1.25 GHz) in the frequency range from 0.95 GHz to 1.25 GHz. Further, FIG. 22 shows the average power efficiency PAE at the back-off points for Rayleigh distributed waveforms for PAPR=7 dB and PAPR=10 dB. The ideal class B curve (horizontal dashed line) is shown for PAPR=7 dB.

The main difference to the load-tuned combiner (LMC) shown in FIG. 15 is the higher bandwidth. Another important difference is the general increase in average power efficiency PAE, specifically within the range of load modulation. The efficiency curves of both combiner LMC for $f_c$=1.1 GHz are similar. For all other frequencies, the differences in average power efficiency PAE are approximately 5% to 10%, mostly in favor of the broadband back-off combiner (WBC) shown in FIG. 16. The higher efficiency is not achieved because the load-tuned combiner (LMC) shown in FIG. 15 is superior to the broadband back-off combiner (WBC) shown in FIG. 16, but due to the higher precession during the design process. The width of the T-connection ports and the width of all other connections are significantly smaller. The widest port used is 11 mm compared to the 16 mm in the wideband back-off combiner (WBC). The load-tuned combiner (LMC) shown in FIG. 16 therefore represents the better option for high-power amplifiers with very high powers. In particular, both the main power amplifier DM and the peak power amplifiers DP1, DP2 are supplied with the same drain bias in the output combiner C according to the invention. Since only a drain bias is required, the construction and the development and maintenance costs are significantly reduced. The same HEMT transistors are also used, which on the one hand is an economic advantage and on the other hand is to be assumed that the temperature and aging fluctuations drift in the same direction. This is a significant advantage with regard to the prior art.

To measure the transmission power and the transmission signal quality, the RF-high-power amplifier HPA has a second directional coupler R2 (see FIG. The coupling between the transmission microstrip line and the second directional coupler R2 (see FIG. is approximately −40 dB. Directional couplers are electrically passive components in the field of high-frequency technology, for which purpose power splitters (power splitters), in particular in high-frequency amplifiers, or in the case of inverse operation include power combiner. The implemented measuring device for measuring the transmission signal is purely inductive and no additional losses occur in the transmission signal, which in turn does not reduce the efficiency.

Figure 4:
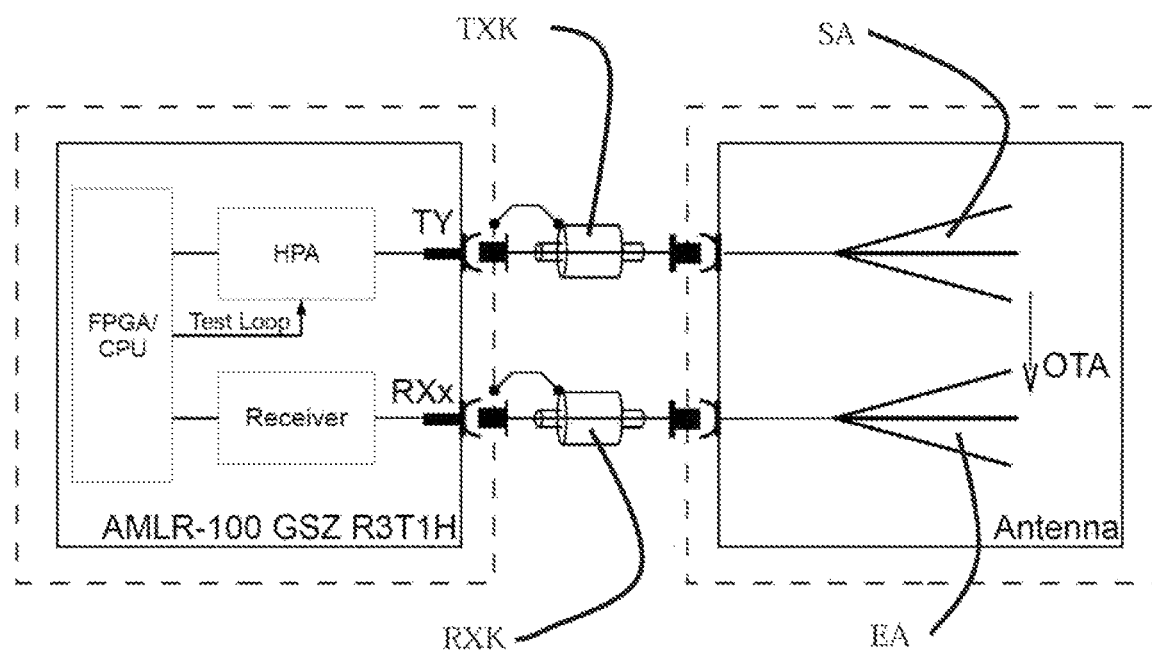
FIG. 4 shows the circuit configuration for measuring the RF-transmission power according to an OTA test (Over the air test)

The circuit for measuring RF transmission power is used for the OTA (Over the Air) test. In detail, FIG. 4 shows the structure for the OTA test implemented in the RF high-power amplifier HPA. The test signal is inductively coupled into the transmission channel via the second directional coupler R2 (see FIG. 1). This test setup allows all transmitting and receiving components, which are connected to the module GSZ in the transmitting and receiving direction, to test, namely TX cables TXK, RX cables RXK, transmitting antenna SA and receiving antenna EA. The transmission signal is received via the free space propagation (OTA) at the receiving antenna EA. The OTA-test can be carried out either cyclically at a specific point in time (for example daily) or in the transmission pauses of the useful signal.

A circulator Z1 is connected to the output of the impedance converter AN1 (see FIG. 1), which can be implemented as an HF-circulator made of ferrites in waveguide or strip conductor technology. With respect to the desired high bandwidth, the star point of the output combiner C should see reliable, constant terminating impedance. This is ensured according to the invention by the circulator Z1. In the prior art, the passive circulators are designed as flat components with an HF-tight housing and three coaxial bushings (connections, ports). Within the scope of the invention, depending on the transmission power, a broadband, ferrite-free and magnetic-field-free circulator or an active circulator (for example constructed with operational amplifiers (voltage-controlled current sources with differential input)) can also be used. According to the invention, the circulator Z1 has two functions. On the one hand, it protects the upstream Doherty-amplifier with the main power amplifier DM, the first peak power amplifier DP1 and the second peak power amplifier DP2 from overvoltages and overcurrent on the output side, in that the circulator Z1 can discharge/circulate the energy which flows from the plug into the electronics to a sump resistor W1. On the other hand, with the aid of the circulator Z1, the returning HF power is measured with a first directional coupler R1 (see FIG. 1). As in the transmission channel, the measuring device is constructed with a 40 dB directional coupler, the returning HF power being an indicator of the state of the plug S1 or the antenna cable/TX-cable TXK (see FIG. 4).

Namely, the returning HF power is directly proportional to the VSWR (standing wave ratio) at the plug. It is thus possible to detect a physical and electrical fault (e.g. cable break, short circuit, idling, etc.) on the plug and on the TX-cable TXK. This permits efficient error monitoring without changing to a test mode during which the useful signal transmission is interrupted. The error monitoring is carried out either cyclically or at any time.

The output combiner C thus has several functions.

On the one hand, it is intended to ensure the peak efficiency in the second back-off point over the entire bandwidth of the amplifier, that is to say only the main power amplifier DM operates and the peak power amplifiers DP1, DP2 are only pretensioned at the gate without an RF signal being fed in at the input (not only no load modulation). This function is achieved by implementing a broadband multi-stage transformation line multiharmonic transformation line (offset line) for load adaptation.

Furthermore, the output combiner C should also transform an impedance transformation from low-impedance environment of amplifier outputs (DM, DP1 and DP2) to the output impedance of the RF high-power amplifier HPA (50 Ohm) at the first back-off point and during full-out control. Since the signal is to be considered as forward propagating waves, it is also necessary to consider the reflections and therefrom the losses caused by the superimposition principle (superimposition principle). Accordingly, the output combiner C requires a 50 Ohm termination to avoid reflections.

The circulator Z1 has a 50 Ohm-controlled terminating impedance over the complete bandwidth of HPA. Accordingly, the circulator Z1 is not only to be regarded as a protective element and a measuring instrument, but also as a termination for the output combiner C.

Figure 1:
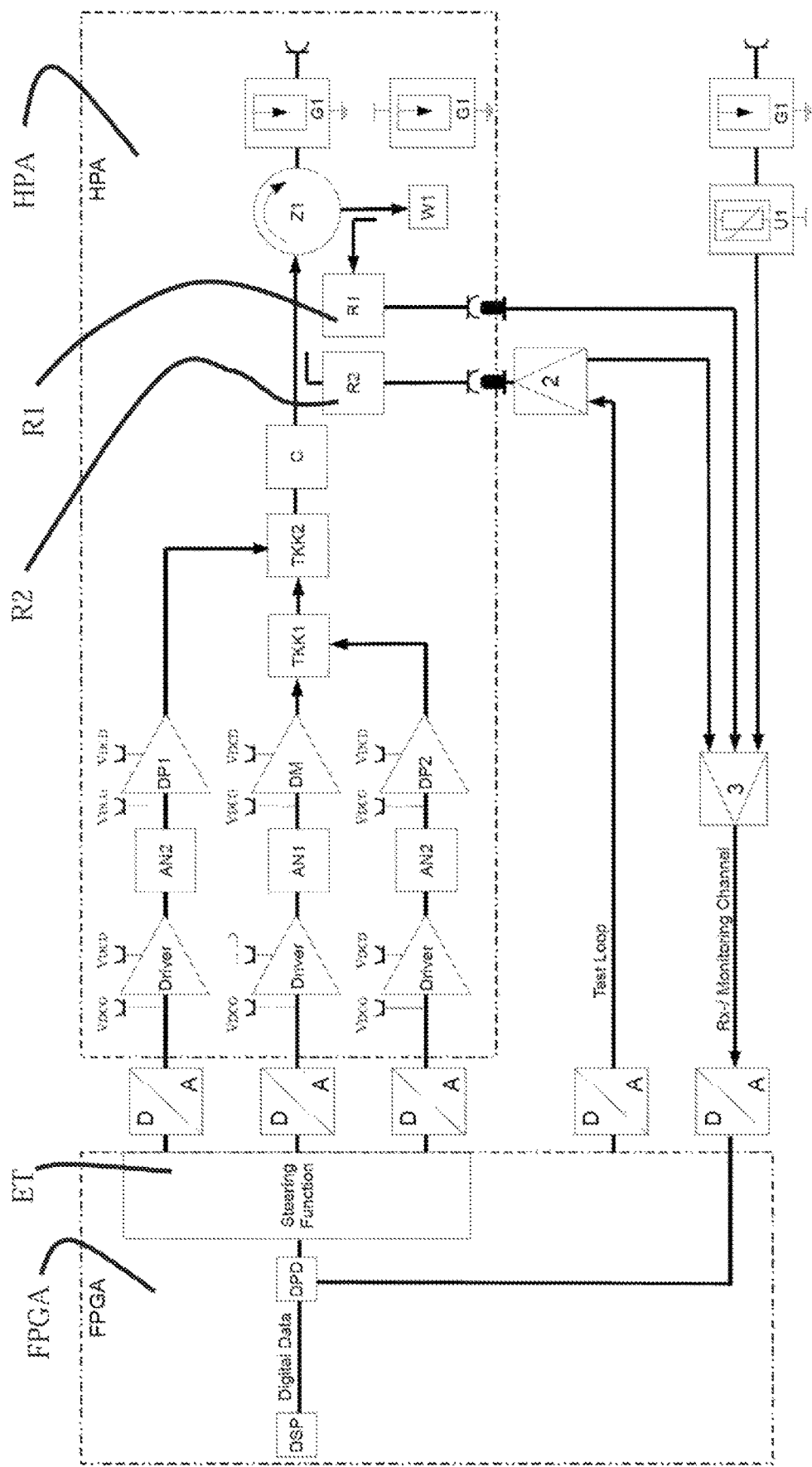
FIG. 1 shows the block diagram of an embodiment of the transmitting and receiving device according to the invention.
Figure 5:
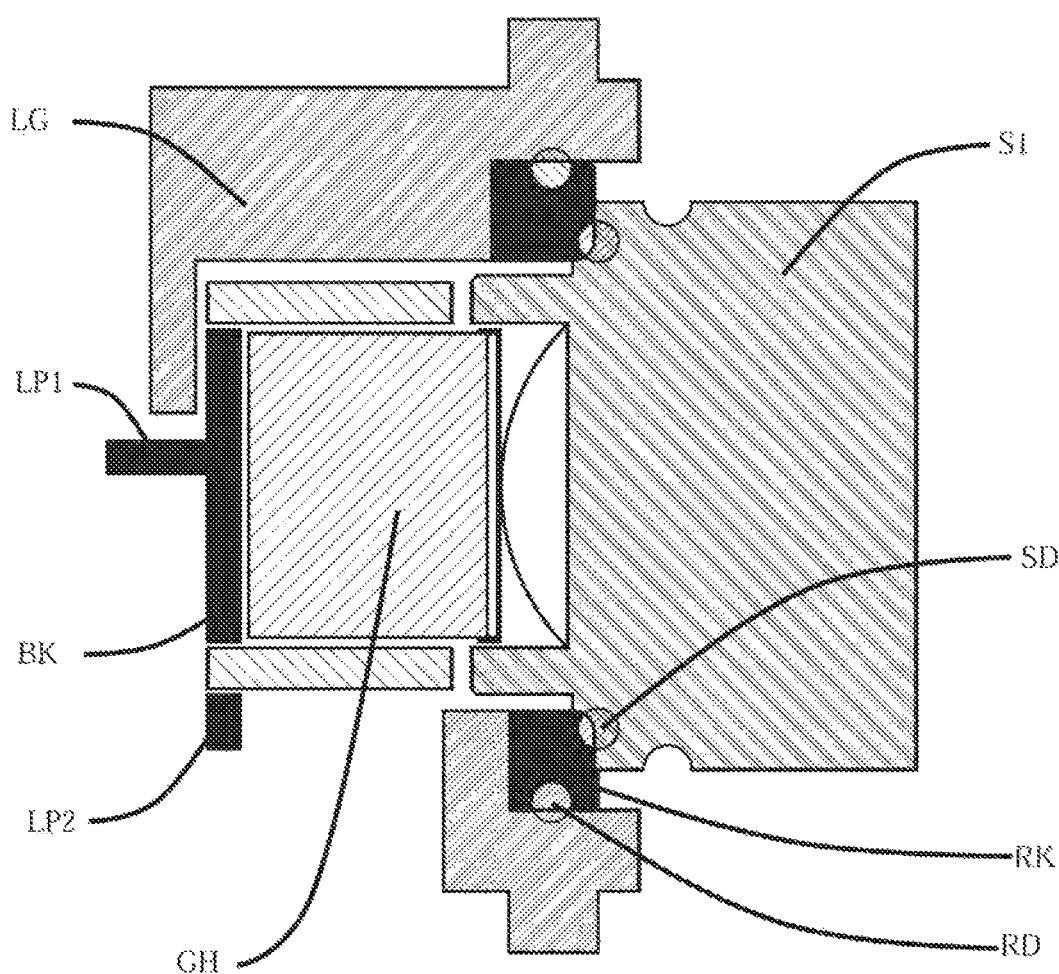
FIG. 5 shows the printed circuit board housing for the gas discharge sleeve of the module GSZ according to the invention in section.
Figure 32:
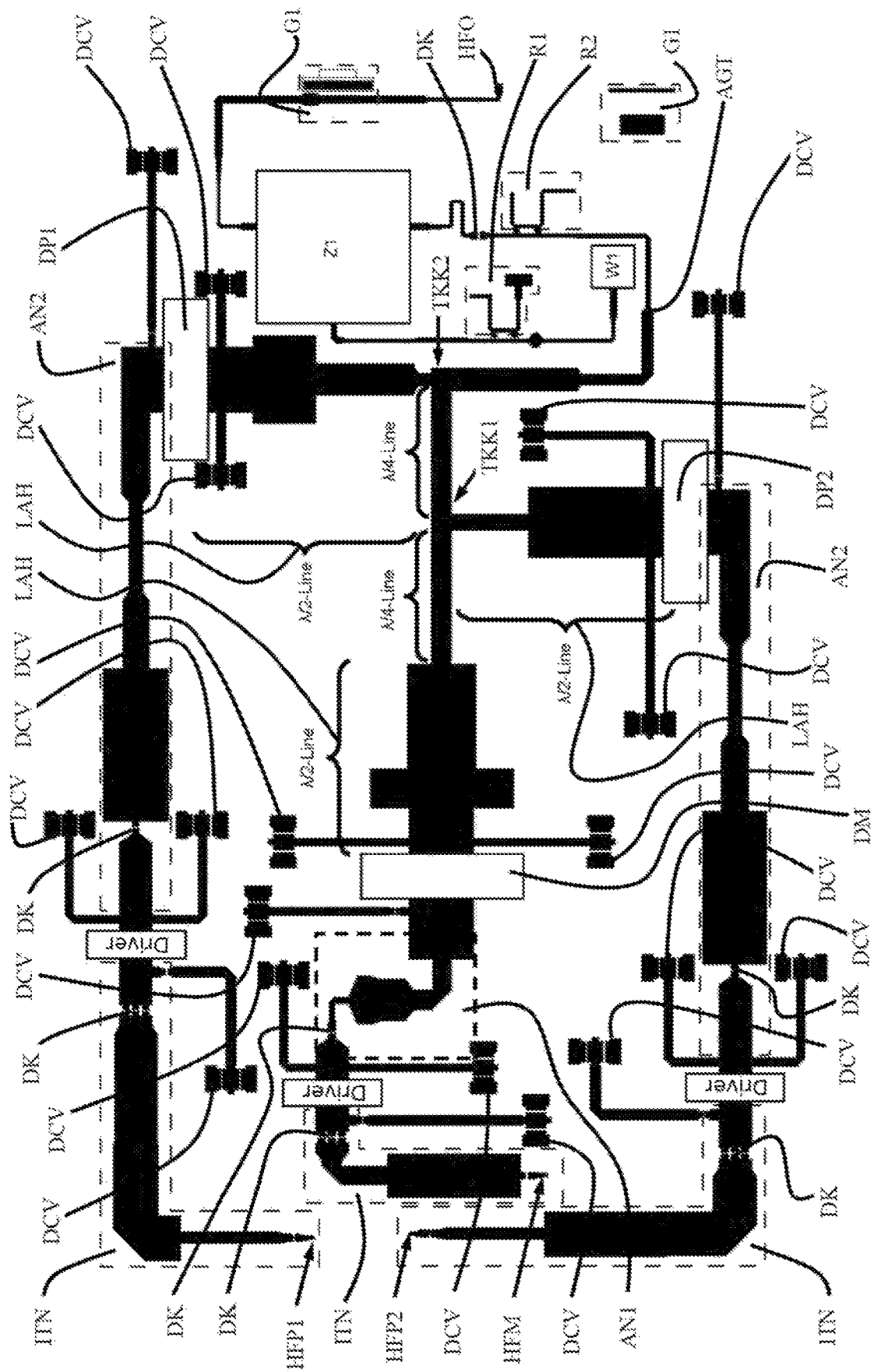
FIG. 32 is a layout of an embodiment of the module of the present invention.

The output of the high-power RF amplifier HPA is protected against lightning strikes with a gas arrester G1 (see FIG. 1). The gas arrester G1 is integrated on a printed circuit board HFL of the RF high-power amplifier HPA; the layout of the single-sided or two-sided RF printed circuit board is illustrated in FIG. 32. According to the invention, this is a printed circuit board housing LG, which is soldered directly on the printed circuit board HFL in SMD technology and corresponds to the protective class IP67, see FIG. 5. The gas discharge sleeve GH of the gas arrester G can be removed or inserted via a screw S1. The screw S1 has the ground potential and presses flat with a spring against the left connection pole of the gas discharge sleeve GH. The screw S1 is screwed into a ring contact RK, which can be soldered to the printed circuit board edge. A screw seal SD presses against the screw S1 on the one hand against the annular contact RK, on the other hand, in order to prevent moisture, dust and dirt from penetrating. On the outer surface of the annular contact RK there is a groove into which a ring seal RD (preferably a round seal) is inserted. The seal RD ensures that no moisture, dust and dirt can penetrate into the interior of the printed circuit board housing LG.

Figure 6:
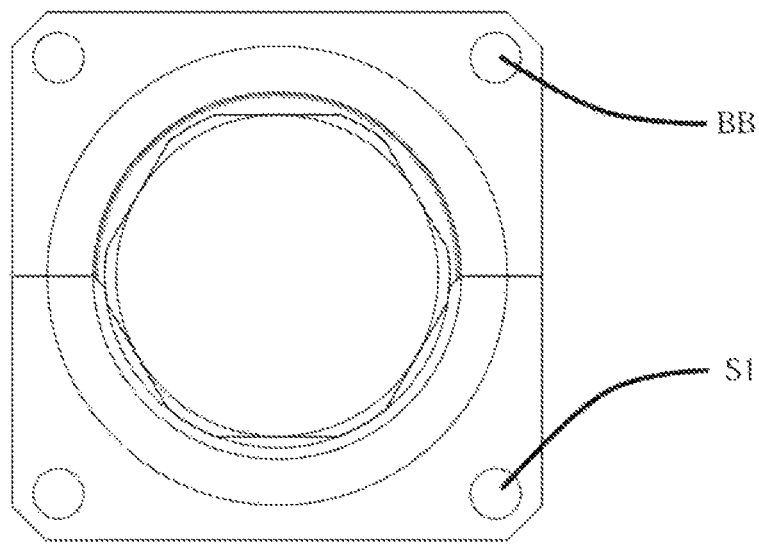
FIG. 6 shows the printed circuit board housing according to FIG. 5 in plain view.

The front of the printed circuit board housing LG is designed such that the printed circuit board housing LG can be tightly screwed together with a front plate of the device housing (screw S1 and fastening bore BB), as shown in FIG. 6. The right connection pole of the gas discharge sleeve GH is mechanically connected to an electrical contact designated as base contact BK. The base contact BK has two solder pads LP1, LP2 and is connected either to the first solder pad LP1 or to the second solder pad LP2 of the lead to be protected, but not to two simultaneously. According to the invention, a degree of freedom in the design of the device housing is available with two soldering pads, because the height of the printed circuit board housing LG with respect to the printed circuit board HFL can thus be selected.

The printed circuit board housing LG has the following advantage over conventional lightning protection cartridges. According to the invention, the base contact BK is connected directly to the conductor track which is to be protected against the lightning strike, whereas commercially available lightning protection cartridges are installed between the output connector of the HF-power amplifier and the antenna cable. Accordingly, the RF-transmit signal experiences additional attenuation at each connector of the lightning protection cartridge. With a passage damping of the plug of 0.8 dB to 1 dB, a total attenuation between 1.6 dB and 2 dB results for two connecting plugs. This corresponds to a reduction in the transmission power by 31% or 37%. The use of the circuit board housing LG according to the invention for the gas discharge sleeve GH instead of the lightning protection cartridge greatly reduces the power loss and increases the efficiency of the module GSZ/HF-high-power amplifier HPA and of the entire transmitting and receiving device. The printed circuit board housing LG is also used in the three receiving lines.

The protection circuitry of the Rx input (RF high power amplifier HPA) is implemented in two stages. (See FIG. 1 right below) The gas diverter G1 protects the device from antenna-side lightning strike coarse protection. In the event of a lightning strike event, the current (energy) is diverted to the earth potential (earth rail ES). A second stage U1 protects the Rx input against transient overvoltage fine protection U1. In this case, the energy is derived to the reference potential. The fine protection U1 cancels both in the case of transients which arise externally, for example from external LNA (Low Noise Amplifier), and also in the case of transients which come from the internal electronics.

The Tx-output has two gas arresters G1 (see FIG. 1 on the right). First gas arrester G1 is connected between TX useful signal line and ground potential, and second gas arrester G2 is connected between reference potential and ground potential. In this way, the RF-high-power amplifier HPA is protected against lightning strike in the antenna A or antenna cable inner wire and against lightning strike into the reference potential. A fine protection in the classical sense does not have the Tx-output. The protection against external transient overvoltage is realized by means of the circulator Z1. Transient voltages in the passage region of the circulator Z1 are diverted to the sump resistor W1. Transient voltages outside the pass-through region are greatly attenuated by circulator Z1.

The module GSZ/the RF high-power amplifier HPA according to the invention must be calibrated during start-up. For calibration, a receiving/monitoring channel is used together with the second directional coupler R2 (see FIG. 1). RF-power, DC-power (drain-source voltage, drain current, and gate current), signal quality, and efficiency are thereby detected.

A control function ET for the main power amplifier DM and the two peak power amplifiers DP1, DP2 are generated from the data set. During ongoing transmission operation, the fine calibration running parallel in the background is carried out in order to compensate for effects such as temperature fluctuations, ageing and transmission frequency change, so that the highest efficiency and best signal quality are always ensured. Compression control of multiple power amplifier cores is very difficult in applications based on active load modulation. The compression control is very important for the service life and even possible destruction of the power transistors.

Initial identification of the amplifier with three power amplifier cores (DM, DP1, DP2) in a five-dimensional space is possible only to a limited extent. By means of the ageing processes, a re-identification can then be indispensable, which contradicts reliable and continuous operation of the amplifier.

Figure 23:
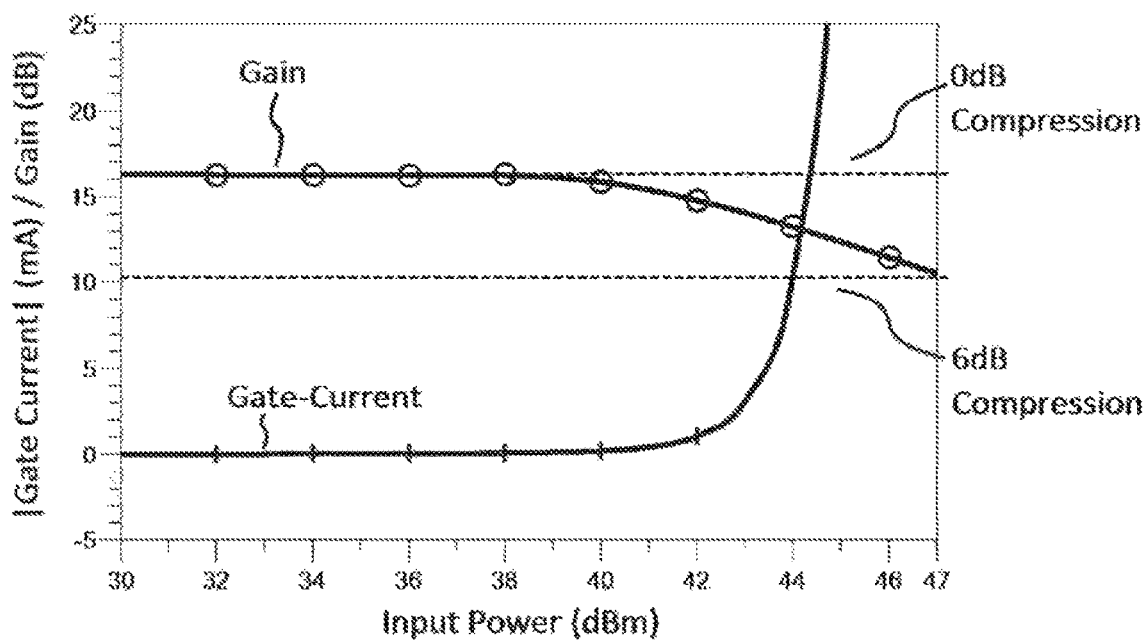
FIG. 23 shows the gate current and compression level diagram of a GaN HEMT power amplifier, FIG. 24 Transistor model with drain parasitics, FIG. 25 Transistor model with absorption network.

According to the invention, the gate currents for determining the compression level of the power amplifier core (DM, DP1, DP2) are used in each case. Power transistors based on a Schottky diode have high gate currents, eg GaN-HEMT transistors (high electron mobility transistors, ie high electron mobility transistors). The GaN-HEMT (gallium nitride) used is well suited for high frequency applications due to the high charge carrier mobility. The component is controlled, similar to the metal-semiconductor field-effect transistor, by means of a metal gate which is connected to the gallium nitride layer. The high gate currents are used to monitor the current compression level of the power amplifier cores. FIG. 23 shows the ratio between gate current and compression level using a GaN-HEMT power amplifier. In this way, in-situ compression control is realized for each power amplifier core DM, DP1, DP2 without performing initial identification and without subsequent re-identifications. This type of compression control is not disturbed by ageing processes and makes it possible to detect defective amplifier cores or amplifier cores which are short of failure. The maintenance expenditure and the investment costs are thereby reduced and the service life of the respective HF power amplifier DM, DP1, DP2 is extended. Alternatively, a material system with aluminum gallium nitride (AlGaN) or aluminum indium nitride (AlInN) can also be used which, because of its comparatively high band spacing, allows a higher operating voltage before the field breakdown occurs. This material combination proves to be advantageous particularly for the production of power transistors, since the output impedance increases at the same power and thus the output of the power is simplified (adaptation). On silicon carbide (SiC), it additionally has a lower thermal resistance than GaAs material combinations, which has a positive effect on the maximum power loss or service life and reliability.

The construction of the HF-high-power amplifier HPA increases the efficiency, the thermal power loss being reduced. The hot spots are the main power amplifier DM and the two peak power amplifiers DP1, DP2. All three power amplifiers DM, DP1, DP2 are mechanically and electrically connected to the source connection on a heat sink HSK, in particular a copper heat sink (heat sink). The heat sink HSK (see FIG. 33, FIG. 34) is connected over a large area to the device housing of the module GSZ via a solder paste/adhesive film/adhesive or heat conducting film LPA, which is electrically insulating. The heat is thus dissipated via the device housing. This thermal management design permits a fan-free construction from the module GSZ, both for interior space and for outdoor/outdoor use, which has economic advantages and reduces the maintenance outlay.

Figure 33:
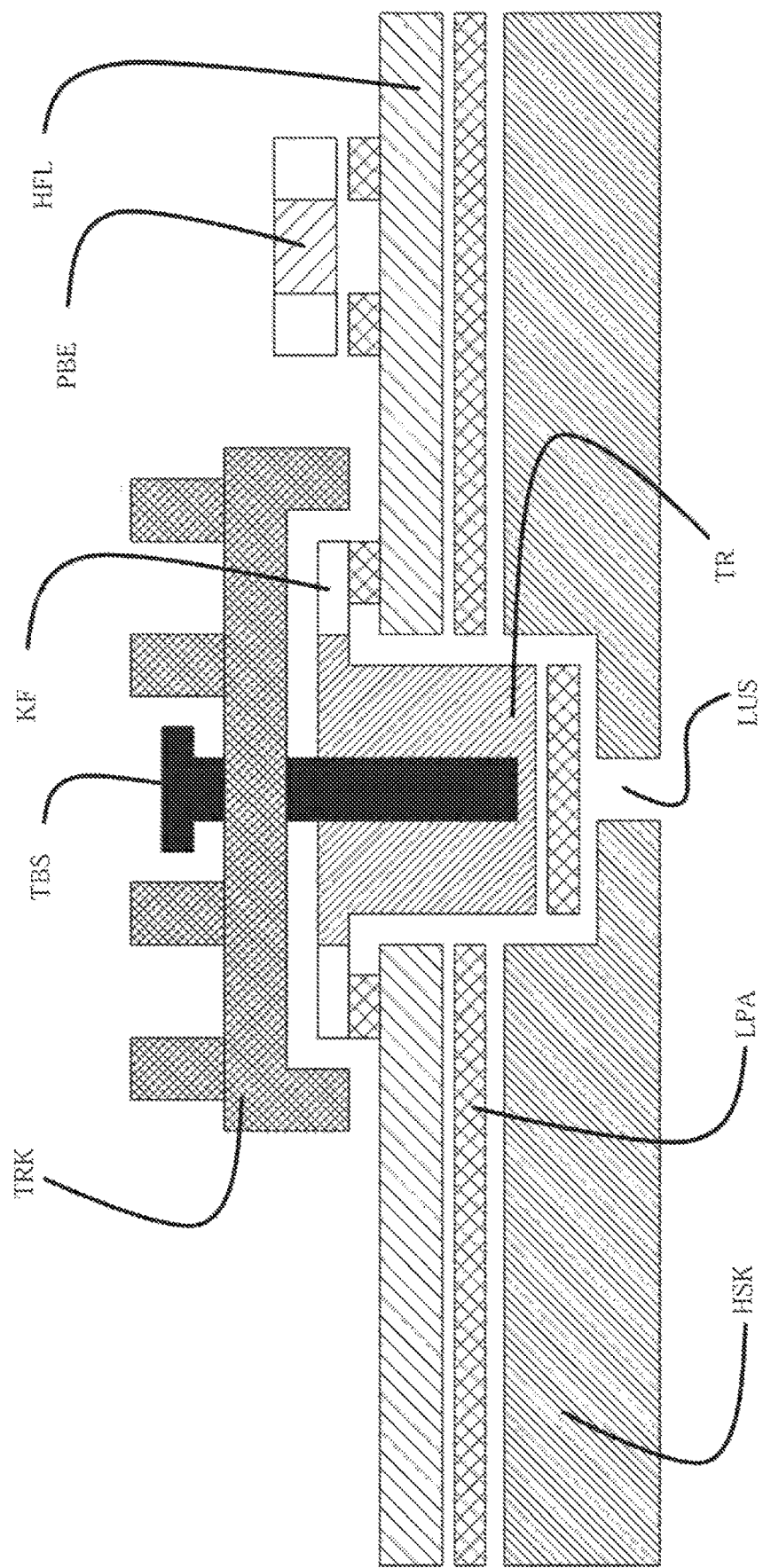
FIG. 33 is a sectional view of a detail of the structural design of the module according to the invention.

FIG. 33 shows in section a detail of the structural design of the HF-high-power amplifier HPA according to the invention to illustrate the heat management. High efficiency of the high-power HF-amplifier HPA is achieved, among other things, by the construction. The structure is to be used to dissipate the heat particularly well from the HF-high-power amplifier HPA and, in particular, of transistors TR. The module/module GSZ is constructed in such a way that all components (passive components PBE, plugs, transistors TR and conductor track structures) have a good thermal connection to the single copper cooling surface HSK. The contact surfaces for the transistors TR, the passive components PBE inter alia are designated by KF, and the printed circuit board HFL can have a 1- or 2-side construction. Each transistor TR additionally has a heat sink TRK connected to the transistors TR via transistor mounting screws TBS. Furthermore, ventilation holes/air gap(s) LUS are provided in the heat sink HSK (also for the solder paste LPA or for an overpressure and lunker building up as a result of the flux by the production). This build-up technique ensures that the heat hotspots (transistor chips) can have high heat dissipation. High heat dissipation of transistor chips has the advantage that the efficiency of the HF-high-power amplifier HPA increases.

Figure 34:
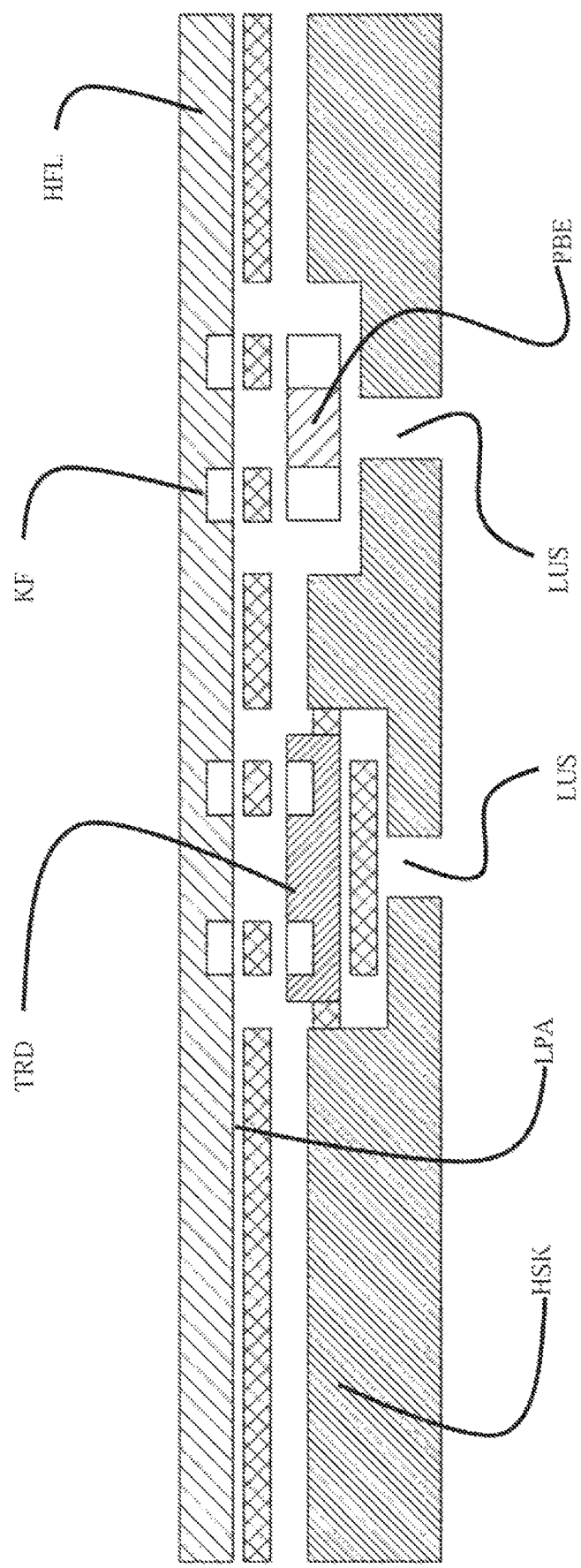
FIG. 34 is a sectional view of another embodiment of the detail.

A further build-up possibility is to mount the components on the soldering side of the printed circuit board and to work with transistor dies TRD (see FIG. 34). The transistor dies TRD are fitted with the flip-chip technique, venting holes being provided in the heat sink HSK (also for the solder paste LPA or for an overpressure and lunker building up as a result of the flux by the production). As a result, two substantial advantages over the standard construction technique are achieved. With the flip-chip technique, the parasitic inductance is reduced by the transistor chip, which increases the quality of the transmission signal and shortens the development time for the conductor track structure. The transistor die TRD is electrically and thermally connected to the copper cooling surface (of the heat sink TRK) directly or by means of the solder paste LPA. In this way, the thermal resistance of the transistor housing is eliminated. As a result, better heat dissipation of the transistor TRD is obtained and consequently more current can flow via the transistor TR, i.e. the efficiency of the transistor TR is increased and the transistor saturation point is displaced further upwards.

The device housing of the module GSZ is of insulating construction, ie it can have both the earth potential and also be floating (Faraday cage principle). All power supply terminals, antenna plugs and communication plugs are isolated from device housings, which improves the SNR, since there is no interference signal coupling among each other and from the PE line (see FIG. 2).

The integrated DLC-3 AD (ASIC) of the applicant takes over the powerline communication, measurement and diagnostic tasks of the transmitting and receiving device according to the invention. DLC-3 AD is a redundant communication interface (configurable by software) and thus additional time synchronization. The use of DLC-3 AD reduces the number of cables and consequently the plug connections. The quality and the service life of the entire system are thus increased.

Figure 7:
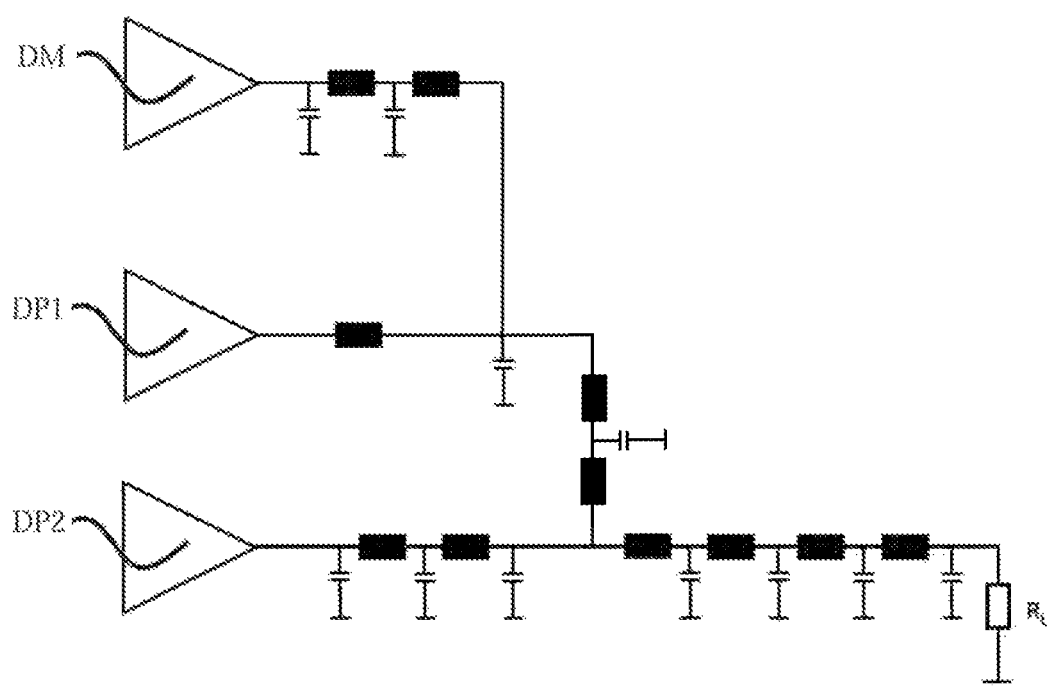
FIG. 7 shows the electrical equivalent circuit diagram of an embodiment of an active load modulated RF-power amplifier.

As already explained, the HF-high-power amplifier (HPA) is an electronic device which represents an active load-modulated RF power amplifier (according to the Doherty principle). Said HF-high power amplifier (HPA) has three drive inputs each connected to a power transistor, one for the main power amplifier DM and two for the two peak power amplifiers DP1, DP2 as active load modulators. The outputs of power transistors DM, DP1, DP2 are connected to a multi-harmonic power combining network/output combiner C having an output to which load/plug/antenna A is connected as set forth in the equivalent circuit diagram of FIG. 7. The manner in which the power transistors output their power to the network is determined via the amplitude and phase at the control inputs.

The high-power HF-amplifier (HPA) has three inputs which are individually controlled in magnitude and phase (see FIG. 14). The control unit forms the functionality of the control function ab/digital input signal divider ET. Since each power amplifier is individually driven, the control function has six degrees of freedom (a five-dimensional space). In contrast to classical Doherty amplifiers in which the control function is implemented with an analog power divider, the control function ET of the HF-high-power amplifier (HPA) according to the invention was mounted in the digital range DD (digital domain). In this way, any desired amount and any phase of the drive signal can be set at each individual input.

The control function ET in the digital domain has almost infinitely many solutions in the five-dimensional space in which at least one static function can be found which meets the optimization criteria with regard to efficiency, linearity and bandwidth. Moreover, the control function has the task of minimizing the complexity of the DPD (Digital Pre-Distortion) and dynamic memory-effects of the GaN-HEMT transistors used. The addition of the control function ET into the digital region has the additional advantage that the through-attenuation of the analog power divider is not present.

FIG. 8 shows four antenna installation variants, namely in the first row the variant 1 as a round rod for the L-band (the rod antenna sits centrally on the mast tip), in the second line the variant 1b as a round rod for the L-band and GPS (in this case the rod antenna is seated centrally on the mast tip and the GPS rod antenna is seated on the L-band rod antenna), in the third row the variant 1c in the arrangement of the L-band rod antenna laterally on the mast tip and the GPS rod antenna laterally on the mast tip next to the L-band rod antenna), in the fourth row the variant 2 in the arrangement that the rod antennas for the L-band and GPS are seated laterally from the mast and not on the mast tip and in the fifth row in plain view a 3×Planar antenna A, wherein each planar antenna consists of up to six L-band antenna elements Ant. 1 to Ant. n. The respective installation variant of the antenna A determines the propagation or partition from the electromagnetic field which is emitted or received by the antenna A. The advantage of the transceiver system according to the invention is that all variants depicted in FIG. 8 can be covered with a system.

In summary, the output combiner C according to the invention, which has impedance inverter to be connected to all amplifier cores DM, DP1, DP2, . . . , enables the elimination of parasitic harmonics and the optimization for broad-band performance. A first output combiner C, which is to obtain the peak efficiency of the second back-offs (in which only the main power amplifier DM operates) is to be obtained over the entire frequency band and is also referred to as a load-tuned combiner (LMC) (shown in FIG. 15), requires broadband multi-stage transformation lines for load adaptation and offers high back-off efficiency over the target bandwidth. This embodiment of the HF-high power amplifier HPA according to the invention achieves a relative bandwidth of 36.4% and a peak output power of 61 dBm with a ripple of less than 1 dB. The second output combiner C shown in FIG. 16 and referred to as a broadband back-off combiner (WBC) transforms the low impedance environment to the desired load termination. It is suitable for this purpose to achieve the design objectives over the entire frequency band and even covers a wide region outside the band. It has a relative bandwidth of 43.5% and a peak output power of 61 dBm with a ripple of less than 1 dB.

Based on this, according to the invention, a digital, energy-efficient, fan-free, high-power transmitting and receiving device, which is protected against lightning strikes, is provided for the current aeronautical L-band. The layout of a single-sided or two-sided HF printed circuit board HFL of the module GSZ according to the invention is shown in FIG. 32. HFP1 is the RF signal input of the first peak power amplifier DP1, HFP1 is the HF-signal input of the 2. peak power amplifier DP2, HFM is the HF-signal input of the main power amplifier DM, HFO is the HF-high power amplifier output of the high power amplifier HPA (high power amplifier), DCV is the impedance-adapted DC supply terminals, DK are discrete capacitances, ITN is an impedance transformation network for the input adaptation, TKK1 is a T-cross combiner 1 having microstrip lines of length lambda/4, TKK2 is a further T-cross combiner 2, W1 is a resistor 1 (also called sump resistor), AGT is an output transformer and an interstage network (Gate & Drain Matching with impedance transformation).

According to the invention, special networks are provided for providing a specific termination profile at the second harmonic, in particular for realizing extended broadband amplifier classes, wherein the imaginary part at the second harmonic is opposite to the imaginary part of the fundamental and additionally in a certain ratio along the frequency axis. With the architecture according to the invention, the amplifier cores of the main power amplifier DM, the first peak power amplifier DP1 and the second peak power amplifier DP2 are subjected to these broadband termination conditions at fundamental and harmonic. In this architecture, the impedance inverter is constructed from short line elements which are as short as to the wavelength A that they can be considered as a substitute for concentrated components such as capacitors and coils and cannot be considered as lines. The problem of local harmonic termination at the outputs of the amplifier cores is also solved, since the line segments are line-transformatable and non-concentrated on account of their lengths.

The multistage networks of higher order according to the invention are to be seen in the layout of FIGS. 15, 16 and 32 from the multiple directly successive expansions of the conductor tracks. In the combiner of the main power amplifier DM, the first peak power amplifier DP1 and the second peak power amplifier DP2, the transformations of the harmonics are also taken into account and deliberately influenced, for which purpose the width of the lines is varied. Due to the higher order of the networks locally on the amplifier cores in the architecture described, the termination conditions can be operated at a plurality of harmonics and a correct phase position. In this way, the exchange of power (in the case of harmonics by capacitances and inductances) can be greatly reduced or suppressed not only at one harmonic but at a plurality of harmonics, which further increases the efficiency. The control of even more harmonics is carried out according to the invention in the case of high output powers of more than 500 W in order to reduce the waste heat.

Compared to the Doherty amplifier described in WO 2013006941 A1, which does not have a directional coupler/circulator Z1 in the combiner (output combiner C), the 2nd harmonic is guided transparently via the combiner, so that main and peak amplifiers exchange power at the 2nd harmonic, which is prevented in the architecture according to the invention, since this reduces the efficiency. According to the invention, all amplifier cores of the main power amplifier DM, 1. peak power amplifier DP1 and 2. peak power amplifier DP2 are terminated locally with respect to their harmonics with a correct phase position, so that only a small to no exchange of power at harmonics can take place.

In comparison with the composite amplifier described in DE 601 24 728 T2, a digital pre-distortion DPD or the digital control function ET is used according to the invention. The input of the digital pre-distortion DPD is connected to the output of the digital signal processor block DSP and the output of the digital pre-distortion DPD is connected to the control function/digital input signal divider ET (see FIG. 1). DSP is a digital signal processor block which is responsible for the preparation of the digital transmission signal, i.e. the transmission signal is encoded for the respective communication standard.

The digital pre-distortion DPD is not a constituent part of the control function ET. DPD is a digital pre-distortion of the transmit signal, with the digital pre-distortion DPD upstream of the control function/digital input signal divider ET (see FIG. 1). The digital pre-distortion DPD is intended to counteract/counteract the memory-effects which occur in the amplifier cores. The memory-effects are not static but dynamic. These are dependent on the temperature, modulation method, ageing, drain voltage, inter alia.

The transmit signal is monitored via the directional coupler R2 (see FIG. 1), allowing real-time pre-distortion of the digital data stream. The use of the digital pre-distortion DPD increases the linearity of the Doherty-amplifier. The combination of the digital pre-distortion DPD and control function/digital input signal divider ET allows efficient, broadband and linear operation of the high-power HF-amplifier HPA as well as a significant improvement in SNR. Operation is thus not possible with an analog pre-distortion technique and with a static control function (only a phase position between the main power amplifier DM and the peak power amplifier DP1 or DP2).

With the digital pre-distortion DPD, memory-affected effects can also be corrected, which is achieved by a skillful combination of static control function and memory DPD (memory-affected digital pre-distortion) and is possible with analog pre-distortion networks only with extremely high expenditure or not at all. Consequently, the architecture according to the invention with its digital control function ET has more degrees of freedom than the composite amplifier described in DE 601 24 728 T2 with analog control function.

In order to convert the control function from the analog domain into the digital domain, the control function ET is implemented in the FPGA. The digital transmission signal from the control function ET is converted with the digital-to-analog converter DAC into the analog transmission signal (see FIG. 1).

The typical impedance of the analog transmit train at the output of digital-to-analog converter DAC is 50 Ohm. The impedance at the input of the driver stage (FIG. 32) is low impedance because the main power amplifier HPA is biased as a class B amplifier and the peak power amplifiers DP1 and DP2 are biased as Class C amplifiers. An impedance transformation network ITN with impedance converters AN1 and AN2 is arranged between the signal input of the main power amplifier DM, the peak power amplifier DP1 and the peak power amplifier DP2 and the amplifier cores of the respective driver stage. Specifically, AN2 is a (second) matching network respectively the same (second) matching network for the peak power amplifier DP1 and the peak power amplifier DP2. The (first) matching network/impedance converter AN1 of the main power amplifier HPA differs from the (second) matching network AN2 of DP1 and DP2 and has another physical line guiding structure like the impedance converter AN1, since the structures for the best efficiency and maximum bandwidth of the HF high-power amplifier HPA are developed at the design frequency. This also applies in general to a two-way Doherty Power Amplifier.

In addition, main power amplifiers DM and peak power amplifiers DP1/DP2 are differently biased at the gate (DP1 and DP2 are equal). This result in different input impedances at the main power amplifier DM and the peak power amplifiers DP1/DP2.

The impedance transformation network ITN converts the 50 Ohm impedance into the impedance of the inputs of driver stage amplifier cores. As a result, reflections at the design frequency at the input from the HF high-power amplifier HPA are avoided.

As described above, the outputs of the power transistors DM, DP1, DP2 (in the context of the invention n-paths Doherty-amplifiers) are connected to a multi-harmonic power combining network/output combiner C/impedance converter AN1 having an output to which the circulator Z1 is connected and which is connected to the load/antenna A via the gas diverter G1 (integrated on the printed circuit board HFL arranged in the printed circuit board housing LG), the switchable low-noise amplifier circuit LNA. The digital amplifier defined by software enables the configuration of a low-loss 3-way Doherty amplifier, the calibration online (control function, digital pre-distortion DPD), the digital adaptation of phase position and amplitude (online). In addition, a flexible configuration for different antenna variants is possible. The switching operation between transmitting and receiving can be controlled by the controlled voltage supply (on/off), and the test of the infrastructure can be carried out online. The printed circuit board housing LG or the module GSZ acts as an additional cooling element (so that both housing types can be designed without a fan) and the integrated gas arrester G1 is capable of exchanging service. The power supply lines VCC and GND are insulated from ground and the overvoltage dissipation occurs against ground potential, so that potential is tied or separate installation, and thus improved SNR, since no (on) coupling is enabled by ground, and potential separate installation is enabled. Furthermore, the high-power transmitting/receiving device according to the invention has a reduction of the cables and thus a reduction of the plug-in connections, it being possible to use identical assemblies and plug assignments for the configuration of indoor and outdoor variants.

According to the invention, the directional coupler R2 (see FIG. 1) can be used twice, namely also for the test signal. Further advantages result from the use of a special powerline transmission (DLC) with the advantages of redundancy (namely an additional optional time synchronization) and a reduction of the cables and thus of the plug-in connections. As a result of the reduced energy consumption of the high-power transmitting and receiving device according to the invention, the operating costs can be reduced and a fan-less operation (passive cooling) can be made possible both indoor and outdoor. The reduction of the losses also means more range of the transmitter (with GaN-HEMT transistors for all three amplifier cores DM, DP1 and DP2 of the HF high-power amplifier (HPA) with 500 W) and better SNR on the receiving side.

In comparison to the concept described in the technical literature, see in particular Neo, W. C. Edmund [inter alia]: A mixed signal approach towards linear and efficient N-way Doherty amplifiers (see page 4 of the present description), the high bandwidth HF high-power amplifier (HPA) is an essential distinguishing feature In the aforementioned technical literature of Neo et al., a digital input divider has been used to achieve improved properties on the design frequency. In particular, the reduction of the high compression of the main power amplifier (DM) is to be mentioned here. In order to construct a Doherty with a high bandwidth, the technical literature of Neo et al is not to be taken, but the concept of the digital input divider is introduced there and its advantages are demonstrated; everything at design frequency. It can be determined that there are almost no publications which are concerned with control functions, because wide-band Doherty is concerned which have digital input dividers.

The offset lines having the length λ/2 and the digital input divider ET are different approaches to solve the same problem, namely enabling high bandwidth Doherty at very high power.

Digital input dividers increase the bandwidth by adapting input power and phase depending on the carrier frequency and target output power. The additional multiharmonic transformation lines/offset lines (LAH) according to the invention make it possible to construct an output combiner C with transformative properties, which allows considerable bandwidth gains even when using a static splitter. As a result, these are different approaches which have the same goal and both are the goal of a broad-band high-power Doherty.

The protection of the amplifier from the above-mentioned technical literature of Neo et al is based on the avoidance of a strong compression of the main power amplifier, while the circulator protects the Doherty-output from returning power in the event of strong antenna mismatch. The technical literature of Neo et al has not concerned with incorrect adaptations at the output, but is based on an ideal 50 Ohm load. Incorrect adaptations and returning powers are not the subject of the technical literature of Neo et al and the circulator ensures that the Doherty always sees a well-adapted load, which is advantageous for practical application.

In the prior art disclosed on page 9, last paragraph to page 12, paragraph of this application, namely DE102012105260 A1, a broadband Doherty amplifier circuit with a constant impedance combiner is described in the classical operating modes such as Class AB and Class C. In the case of the transmitting and receiving device/HF high-power amplifier HPA according to the invention, the harmonics are also included with regard to the broadband, which is also referred to herein as multiharmonic matching (see discussion for describing the transformation lines, pages 26, third and fourth paragraph).

Thus, Class-J represents a further development of Class-B, Class-J could also be referred to as "Class-B Continuous" based on the extension of Class-F to Class-F Continuous. It is to be assumed that it is impossible to keep impedance constant above the frequency. All attempts in the prior art have been compromised to keep the impedance constant as a function of f. In the case of the solution of the continuous mode according to the invention, it is instead established how the reactive components of the impedances in the fundamental wave and at the harmonics are to behave in relation to one another.

In Class-J=Class-B Continuous, it is required that the reactive fraction at the fundamental wave and at the second harmonic should have opposite behavior (inductive<->capacitive) and that the value of the reactive fraction at the second harmonic should change twice as strongly as the frequency than in the case of the fundamental wave. The advantage of this is that an increase in the bandwidth is achieved, but a greater voltage at the drain is disadvantageous here. However, in GaN, this is assumed, however, that is to say peak voltage 3× supply in Class-J versus 2× supply in Class B.

By constant impedance, however, it is also meant in DE102012105260 A1 that impedance at the three nodes of circuit 132/134/136 is the same. In particular, a high bandwidth is achieved for a specific back-off power point, i.e. only for a point of the output power/design frequency. In contrast, in the solution according to the invention, a high bandwidth and a high efficiency over the entire range of the output power are achieved.

Finally, according to DE102012105260 A1, the combiner has no low-pass behavior. In the transmitting and receiving device/RF high-power amplifier HPA according to the invention, the exchange of power at harmonics between the amplifier cores DM, DP1, DP2, . . . (which applies to N-paths Doherty-amplifiers in the context of the invention) is prevented. As a result, the harmonic termination is prevented from being dependent on the visibility of each core, as the other amplifier cores are controlled. However, correct harmonic termination is essential to maximize the efficiency of each core. According to the invention, this is made in the continuous mode in order to obtain the high efficiency over the greatest possible bandwidth.

Furthermore, the invention has hitherto not been restricted to the combinations of features defined in the independent claims, but can also be defined by any other combination of certain features of all the individual features disclosed altogether. This means that basically virtually every individual feature of the independent claims can be omitted or replaced by at least one individual feature disclosed elsewhere in the application.

LIST OF REFERENCE CHARACTERS

A antenna
ABN absorption network (drain parasites)
AGT output transformer
AMLR "Adaptive Multi-Channel L-Band Radio"
AN adaptation network
AN1 first matching network/impedance converter
AN2 second matching network/impedance converter
BB attachment bore
BK base contact
C output combiner
C0 drain capacitance
C1 capacity
DAC digital-to-analog converter
DCV DC-power supply
DD digital domain
DK Discrete capacity
DM main power amplifier (Doherty)
DPA Three-Way Doherty Power Amplifier
DPD Control Function (Digital Pre-Distortion)
DP1 first peak power amplifier (Doherty)
DP2 second peak power amplifier (Doherty)
DPS drain parasites
DSM Drain Current Measurement
EA receiving antenna
ET digital input signal divider
ES earth rail
FPGA Field Programmable Gate Array
G1 gas arrester
GF housing FET
GH gas discharge sleeve
GSM gate current measurement
GSZ module
HFL One-sided or two-sided HF printed circuit board
HFP1 HF signal Input 1. peak power amplifier
HFP2 HF-signal input 2. peak power amplifier
HFM HF-signal Input Main Power Amplifier
HFO HF-high power amplifier output
HPA HF-High Power Amplifier (High Power Amplifier)
HSK copper heat sink (heat sink)

IM (IM) (ideal) current source (to main power amplifier DM)
IP1 (ideal) current source (to the first peak power amplifier DP1)
IP2 (ideal) current source (to the second peak power amplifier DP2)
IT Intrinsic Transistor (Model)
ITG Transistor housing (of IT)
ITN impedance transformation network for input matching
KF contact surfaces
L inductor
LAH Multi-Harmonic Transformation Line/Offset Line/Offset Line
LMC Load Matched Combiner)
LNA switchable low-noise amplifier circuit
LG printed circuit board housing
LP1 solder pad 1
LP2 solder pad 2
LPA solder paste/adhesive film/adhesive
LUS air gap
OTA Wireless/Radio Coupling (Over the Air)
PAE Power Added Efficiency
PAPR Ratio of peak power to average power of a signal
PBE Passive devices
R1 first directional coupler
R2 second directional coupler
RA Reference plane A
RB Reference plane B
RC reference plane C
RD ring seal
RK ring contact
RL terminating impedance
Rx receiver
RX single or multiple receivers
RXK RX cable
S1 Screw 1
SD screw seal
SA transmitting antenna
TBS Transistor fastening screw
TKK1 T-Cross Combiner 1
TKK2 T-Cross combiner 2
TM transformer (main power amplifier DM)
TP1 transformer (first peak power amplifier DP1)
TR transistor
TRD transistor die
TRK transistor heat sink
Tx transmitter
TY single or multiple transmitters
TXK TX-cable
U1 Fine protection
UPS interruption-free power supply unit
VDCGDC-power supply gate
VDCD DC-power supply drain
WBC broadband back-off combiner
W1 resistor 1
W2 resistor 2
W3 resistor 3
Z1 circulator

The invention claimed is:

1. A transceiver comprising a transmitting and receiving device having a module (GSZ) provided with a configurable high frequency (HF) high-power amplifier (HPA), the configurable high frequency (HF) high-power amplifier (HPA) comprising a main power amplifier (DM) with a main amplifier core and at least one peak power amplifier (DP1) with an auxiliary amplifier core, wherein:

a switching element is connected to an input of the main power amplifier (DM);
an input of the at least one peak power amplifier (DP1) is connected to a digital input signal divider (ET) having a plurality of outputs;
an output combiner (C) is connected to an output of the main amplifier core for the main power amplifier (DM);
the output combiner (C) is also connected to an output of the auxiliary amplifier core of the at least one peak power amplifier (DP1);
additional multi-harmonic transformation lines (LAH) are connected to a circulator (Z1) at (i) the output of the main amplifier core for the main power amplifier (DM), (ii) the output of the auxiliary amplifier core of the at least one peak power amplifier (DP1), (iii) an output element arranged at an output of the output combiner (C), and (iv) an impedance converter (AN1);
by means of the circulator (Z1) the main power amplifier (DM) and the at least one peak power amplifier (DP1) are protected from overvoltages and overcurrent on an output side;
the circulator (Z1) diverts energy to a sump resistor (W1) connected to the circulator (Z1) in a manner that the circulator (Z1) represents a 50 Ohm terminating impedance for the output combiner (C);
the module (GSZ) has both a high relative bandwidth and a high efficiency at a pulse transmission power of about 2,000 watts;
the module (GSZ) is capable of fan-free operation; and
the module (GSZ) is protected against lightning strikes.

2. The transceiver according to claim 1, wherein, for the purpose of compression control, gate currents are measured by means of an electrical circuit and are used as a measure of compression levels of the main power amplifier (DM) and of the at least one peak power amplifier (DP1).

3. The transceiver according to claim 1, wherein, in order to compensate for drain parasites, an absorption network (ABN) connected to the amplifier cores and a voltage supply of the amplifier cores are provided with the aid of a quarter-wave ($\lambda/4$) microstrip line.

4. The transceiver according to claim 1, wherein a transformer (TM) is arranged on the main power amplifier (DM), and wherein the transformer functions both as an impedance transformation and as an impedance inverter.

5. The transceiver according to claim 1, wherein, in order to carry out an over-the-air test, the HF high-power amplifier (HPA) has a second directional coupler (R2), which is arranged at the output of the output combiner (C) or of the impedance converter (AN1) and is configured to inductively couple a test signal into the transmission channel.

6. The transceiver according to claim 5, wherein, during start-up, the module (GSZ) is calibratable by means of the second directional coupler (R2), wherein a control function (ET) for the main power amplifier (DM) and the at least one peak power amplifier (DP1) are generated by means of the digital input signal divider (ET) and wherein a fine calibration running in parallel in the background is carried out during ongoing transmission operation.

7. The transceiver according to claim 1, wherein, in order to measure returning HF power, the circulator (Z1) is connected to a first directional coupler (R1).

8. The transceiver according to claim 1, wherein an output of the HF high-power amplifier (HPA) is protected against the lightning strikes with a gas arrester (G) connected to the circulator (Z1), and wherein the gas arrester (G) is arranged on a printed circuit board of the HF high-power amplifier (HPA) and is integrated in a printed circuit board housing (LG) of the module (GSZ) by being soldered directly using surface mounted device (SMD) technology.

9. The transceiver according to claim 8, wherein the printed circuit board is provided with a heat sink (HSK) that is thermally conductively connected to the main power amplifier (DM) and wherein the at least one peak power amplifier (DP1) are mechanically and electrically connected to a source connection on the heat sink (HSK), which acts as an additional cooling element in a manner that, in conjunction with the HF high-power amplifier (HPA) with its reduced energy consumption, the fan-free operation of the module (GSZ) is enabled even at a maximum transmission power of about 2000 W and an average power efficiency (PAE) of about 56% is achievable.

10. The transceiver according to claim 8, wherein the gas arrester (G) has a gas discharge sleeve (GH), which is removable or insertable via a screw (S1) which has earth potential.

11. The transceiver according to claim 1, wherein a multiplexer is connected upstream of the digital input signal divider (ET), and wherein the multiplexer has inputs that are each configured to be supplied with a differently modulated signal.

12. The transceiver according to claim 1, wherein a digital pre-distortion (DPD) is connected upstream of the digital input signal divider (ET), and wherein an input of the digital pre-distortion (DPD) is connected to an output of a digital signal processor block (DSP), to which a modulated transmission signal is supplied.

13. The transceiver according to claim 1, wherein the transceiver further comprises an impedance transformation network (ITN) comprising the impedance converter (AN1), which is connected to a signal input from the main power amplifier (DM), and a second impedance converter (AN2), which is connected to the at least one peak power amplifier (DP1).

14. The transceiver according to claim 13, wherein the impedance transformation network (ITN) includes a physical line guiding structure connected to the impedance converter (AN1) of the main power amplifier (DM) and another physical line guiding structure connected to the impedance converter (AN2) of the at least one peak power amplifier (DP1).

15. The transceiver according to claim 13, wherein the main power amplifier (DM) and the peak power amplifier (DP1) are operated with the same drain supply voltage.

* * * * *